Figure 1:
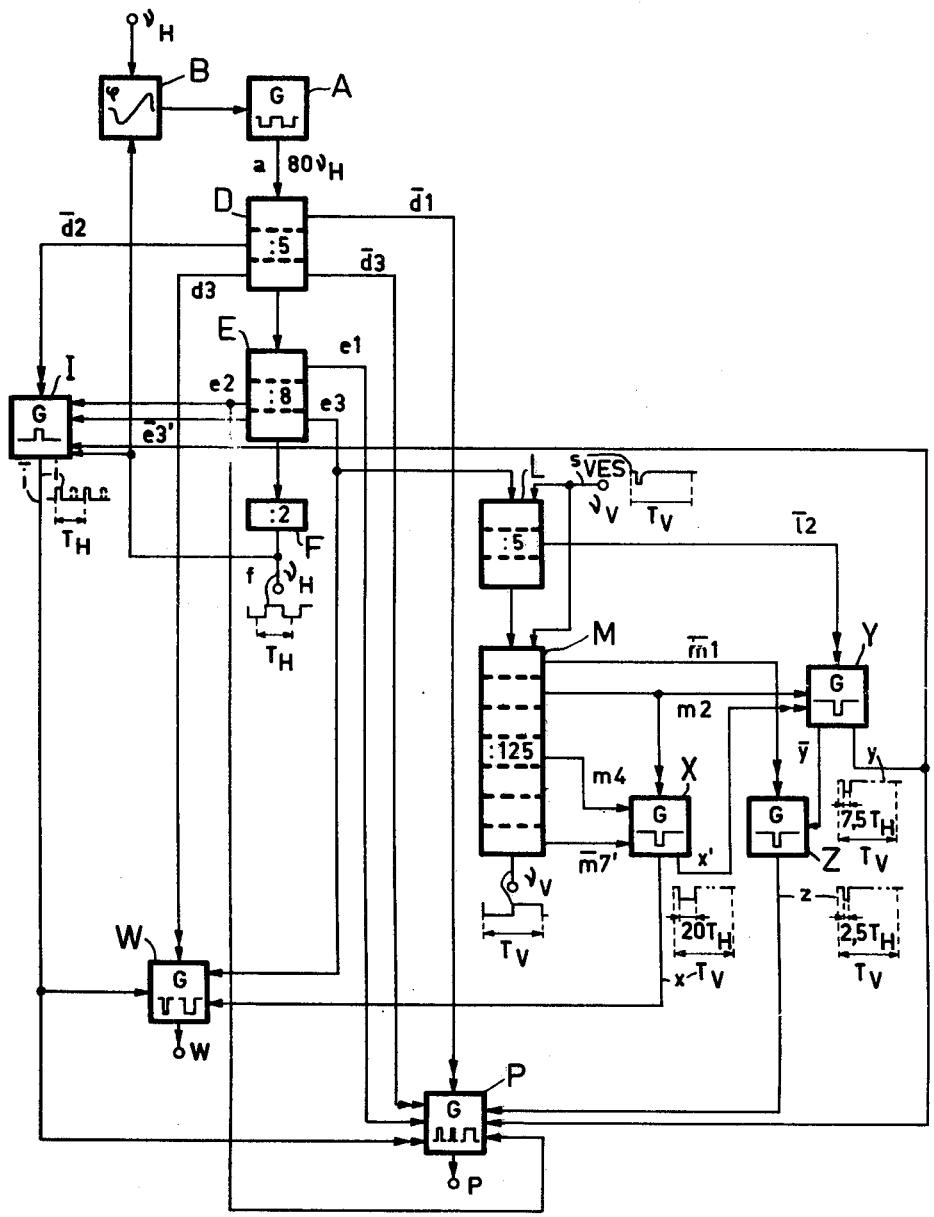

United States Patent [19]
Kaptein

[11] 3,935,387

[45] Jan. 27, 1976

[54] PULSE GENERATOR FOR TELEVISION FOR GENERATING AT LEAST ONE PULSE SERIES HAVING PULSES OF DIFFERENT DURATION AND REPETITION PERIOD

[75] Inventor: Eugenius Martinus Kaptein, Eindhoven, Netherlands

[73] Assignee: U.S. Philips Corporation, New York, N.Y.

[22] Filed: Jan. 2, 1973

[21] Appl. No.: 319,984

Related U.S. Application Data

[63] Continuation of Ser. No. 122,973, March 10, 1971, abandoned.

[30] Foreign Application Priority Data

| Mar. 14, 1970 | Netherlands | 7003669 |
| May 16, 1970 | Netherlands | 7007169 |
| Oct. 10, 1970 | Netherlands | 7014894 |

[52] U.S. Cl. ............................................ 178/69.5 G
[51] Int. Cl.² .......................................... H04L 5/06
[58] Field of Search ................................ 178/69.5 G

[56] References Cited
UNITED STATES PATENTS

| 2,720,555 | 10/1955 | Krause | 178/69.5 G |
| 2,748,188 | 5/1956 | Stahl et al. | 178/69.5 G |
| 3,487,166 | 12/1969 | Ryan | 178/69.5 G |
| 3,564,141 | 2/1971 | Hurst | 178/69.5 TV |
| 3,581,011 | 5/1971 | Ward et al. | 178/69.5 G |

Primary Examiner—Robert L. Griffin
Assistant Examiner—George G. Stellar
Attorney, Agent, or Firm—Frank R. Trifari; Henry I. Steckler

[57] ABSTRACT

A TV pulse generator for generating television synchronizing and blanking signals and a chrominance subcarrier gating signal. The switchable generator is formed with a clock pulse generator having a frequency which, for the CCIR and the RTMA standards, is 80 times the line frequency. In addition to auxiliary pulses of field frequency, circuits of frequency dividers formed with JK flip-flops and pulse generators also generate auxiliary pulses of line frequency and of double the line frequency. The edges in the synchronizing and blanking signals and in the PAL or NTSC chrominance subcarrier gating signal generated by signal generators are accurately determined by trigger signals derived from the clock pulses.

21 Claims, 27 Drawing Figures

*INVENTOR.*
EUGENIUS M. KAPTEIN

PULSE GENERATOR FOR TELEVISION FOR GENERATING AT LEAST ONE PULSE SERIES HAVING PULSES OF DIFFERENT DURATION AND REPETITION PERIOD

The invention relates to a pulse generator for television for generating at least one pulse series having pulses of different duration and repetition period, comprising a clock pulse generator having a period which is shorter than the shortest of said repetition periods, a circuit of frequency dividers connected to the clock pulse generator, pulse generators controlled by dividers, and a signal generator connected to the dividers and the pulse generators, which signal generator is provided with an output terminal conveying the said pulse series.

This is a continuation, of application Ser. No. 122,973, filed Mar. 10, 1971 now abandoned.

Such a pulse generator is described in German published patent application no. 1,807,612. The pulse generator in this application is used for generating a series of synchronizing pulses and a series of blanking pulses for television purposes. The series of television synchronizing pulses is built up from line synchronizing pulses occurring at the line frequency and equalizing pulses and field synchronizing pulses occurring at the double line frequency. The series of blanking pulses consists of line and field blanking pulses. For constituting inter alia a so-called front porch and a back porch between the comparatively long line blanking pulses and the comparatively short line synchronizing pulses, the two pulse series are closely coupled together. This coupling between the pulse series and the duration of the various pulses in a series lie between limits which have been laid down in various television standards such as, for example, the CCIR, the OIRT and the RTMA standards.

In the pulse generator according to the said patent application the edges of the pulses in the series are derived from the clock pulse edges directly as possible or through the frequency dividers. Thereby it is attempted to achieve that the instants of occurrence of the pulse edges are laid down in a uniform and stable manner within the standard imposed by the television standard for which some values have been mentioned in the CCIR and the OIRT standards in an otherwise not quite correct manner. A clock pulse generator has been mentioned whose frequency is four times the line frequency, that is to say, its period is one fourth of a line period of 64 $\mu$s. The circuit of frequency dividers is built up after a 2-to-1 divider from a parallel circuit of a further 2-to-1 divider and a 5-to-1 divider in series with a 125-to-1 divider.

The 125-to-1 divider drives three pulse generators each of which generates a pulse of field frequency having the duration of the field synchronizing period, the equalizing and field synchronizing period and the field blanking period, respectively.

The second 2-to-1 divider is followed by a delay circuit having a delay period of 4 $\mu$s connected in series with a pulse generator which thereby provides a leading edge of a pulse of line frequency after the delay period. A reset input of the said pulse generator is also connected directly to the clock pulse generator, so that after one clock pulse period of 16 $\mu$s the pulse generator provides the trailing edge of the generated pulse. In this manner a blanking pulse of approximately 12 $\mu$s of line frequency is generated which is combined with the field blanking pulses in the blanking signal generator so that this generator provides the composite blanking signal.

The first 2-to-1 divider is connected to a second delay circuit having a delay period of approximately 5 $\mu$s which is connected to the synchronizing signal generator. This second delay circuit determines inter alia the leading edge of the line synchronizing and equalizing pulses. The synchronizing signal generator may be a monostable multivibrator having a variable time constant for determining the trailing edges of the various pulses to be generated with different duration. The two delay circuitsmmay be formed as monostable multivibrators having an adjustable delay period.

It is found that the so-called front porch which is given by the time difference between the leading edges of the line blanking and the line synchronizing pulses is determined by the time difference between the delay times of two monostable multivibrators. Apart from the fact that the time of 1 $\mu$s mentioned in the patent application does not meet the given standards, i.e. a period of 1.55 ± 0.25 $\mu$s, the front porch is determined in an inaccurate and unstable manner. In fact, both delay circuits formed as multivibrators each have a delay period which may be influenced by variations in supply voltage and temperature. The resultant arbitrary variation of the delay periods results in an inaccurate determination of time. In that case the multivibrators should be provided with adjusting points for the purpose of re-adjustment. The above-mentioned drawback is obviated by delay circuits embodying a delay line, but this has the drawback of large dimensions and comparatively high costs.

Apart from the previous possibility of selection it may be noted that when using the 5 $\mu$s pulse for generating the field synchronizing pulses the standard, which is 4.7 ± 0.2 $\mu$s for the CCIR and OIRT standards, is certainly not satisfied. When adapting the said pulse to the standard, the result is that either the line blanking pulse or the front porch falls beyond the standard.

An object of the present invention is to provide a very simple and cheap pulse generator with which without a delay line one or more pulse series are generated in which the edges occur at very accurate and stable fixed instants, while entirely satisfying requirements laid down in, for example, television standards. To this end, a pulse generator according to the invention is characterized in that the clock pulse generator is a generator having a clock pulse period which is equal to or an integral part of the highest Common Factor of the required different pulse periods in the pulse series of the signal generator, the shortest repetition period of the pulses in the series being an integral multiple of the clock pulse period.

One embodiment for generating the two pulse series which are coupled together such as the synchronizing and blanking pulses is characterized in that the clock pulse generator is a generator having a clock pulse period which is equal to or an integral part of the highest Common Factor of the required different pulse periods in and the time differences between the said pulse series of the signal generators, the shortest repetition period of the pulses in a series being an integral multiple of the clock pulse period.

The invention is based on the recognition of the fact that the pulse edges may be determined substantially directly by the clock pulses with the aid of a clock pulse generator having a clock pulse frequency which is high relative to the line frequency in television, while it is possible to use digital circuit elements such as JK flip-flops for use in computers, etc. and manufactured in practice with great accuracy and in large quantities.

One embodiment relates to a pulse generator suitable for use in a colour television system in accordance with the PAL standard.

The synchronizing information for the colour display is given by an unmodulated chrominance subcarrier. Of this subcarrier, a series of ten periods (burst) with a phase alternation per series is transmitted during part of a line period. To this end a PAL gate pulse of ten subcarrier periods is to be generated with the aid of the pulse generator. The transmission must be prevented for approximately nine line periods substantially about the equalizing and field synchronizing period. To this end, a pulse lasting nine line periods must be generated for blocking purposes in a pulse generator suitable for the PAL standard, the instants of commencement and termination of said pulse exhibiting a shift per field in a cycle of four field periods.

To generate the said gate and blocking pulses the pulse generator is characterized in that it is provided with a PAL chrominance subcarrier gating signal generator to which for the purpose of pulse edge determination of pulses occurring at the line frequency in the gating signal the clock pulse generator and a circuit of frequency dividers dividing to the line frequency are connected, said gating signal generator including a blocking signal generator for providing a blocking pulse lasting nine line periods and occurring at the field frequency, at a phase shift in a cycle of four fields, said blocking signal generator being connected for the purpose of its frequency determination to a circuit of frequency dividers dividing to the field frequency and a pulse generator coupled thereto, and being formed for the purpose of determining its pulse edges with an auxiliary pulse generator providing auxiliary pulses of half the line frequency.

An object of one embodiment is to provide a pulse generator suitable for a plurality of television standards and being switchable therebetween, particularly a switchable pulse generator suitable for the CCIR and the RTMA standards for monochrome and colour television.

To obtain a simple switching possibility in the pulse generator, the pulse generator is characterized in that the frequency of the clock pulse generator for each standard amounts to the same number of times multiplied by the different line frequencies, while a circuit of frequency dividers dividing to the different field frequencies is switchable in dividend, a circuit of frequency dividers dividing to the line frequency and having the same dividend for each standard being formed in a switchable manner so as to obtain a displacement of pulse edges.

Figure 2:
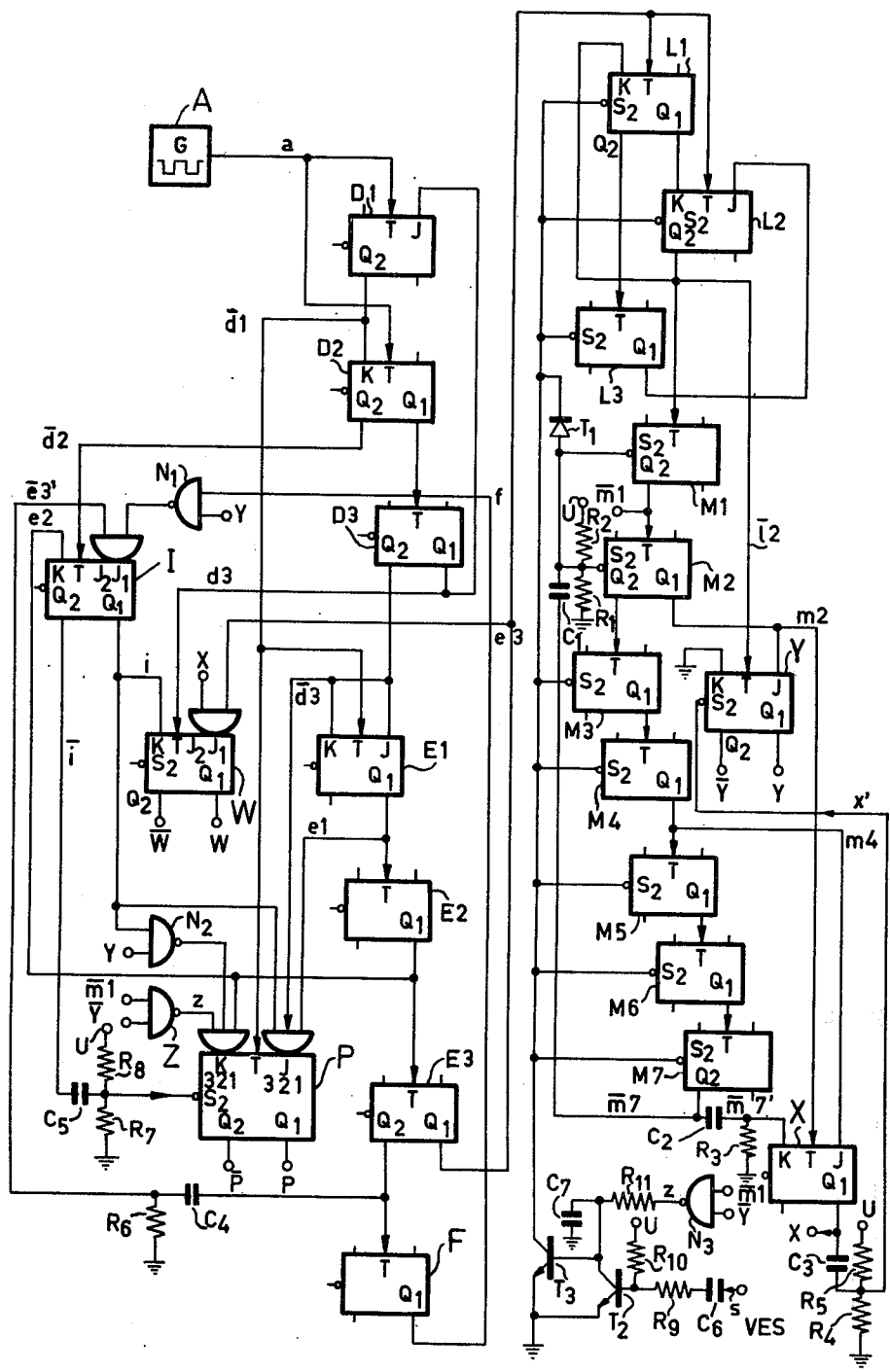
Figure 3:
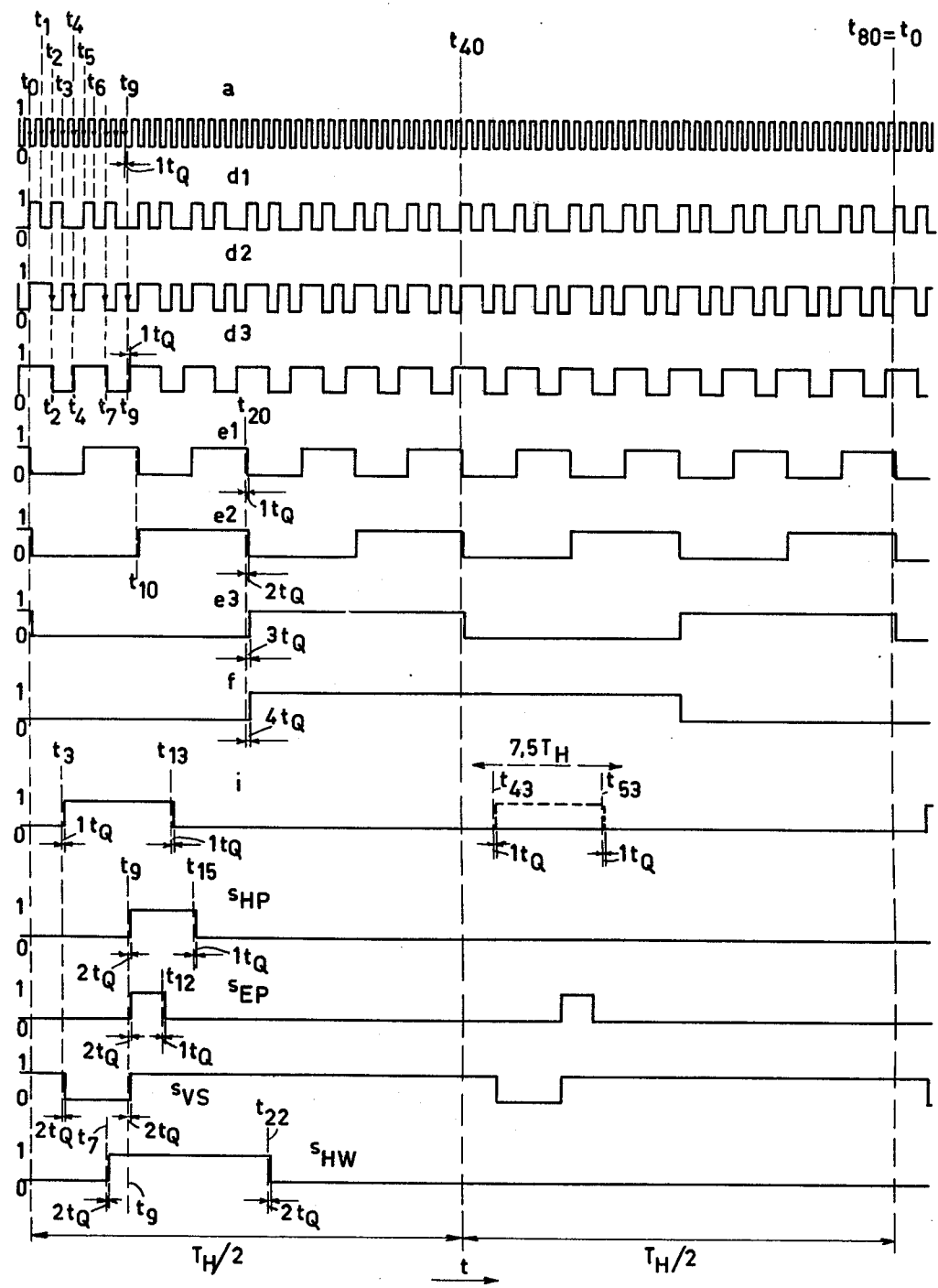
Figure 4:
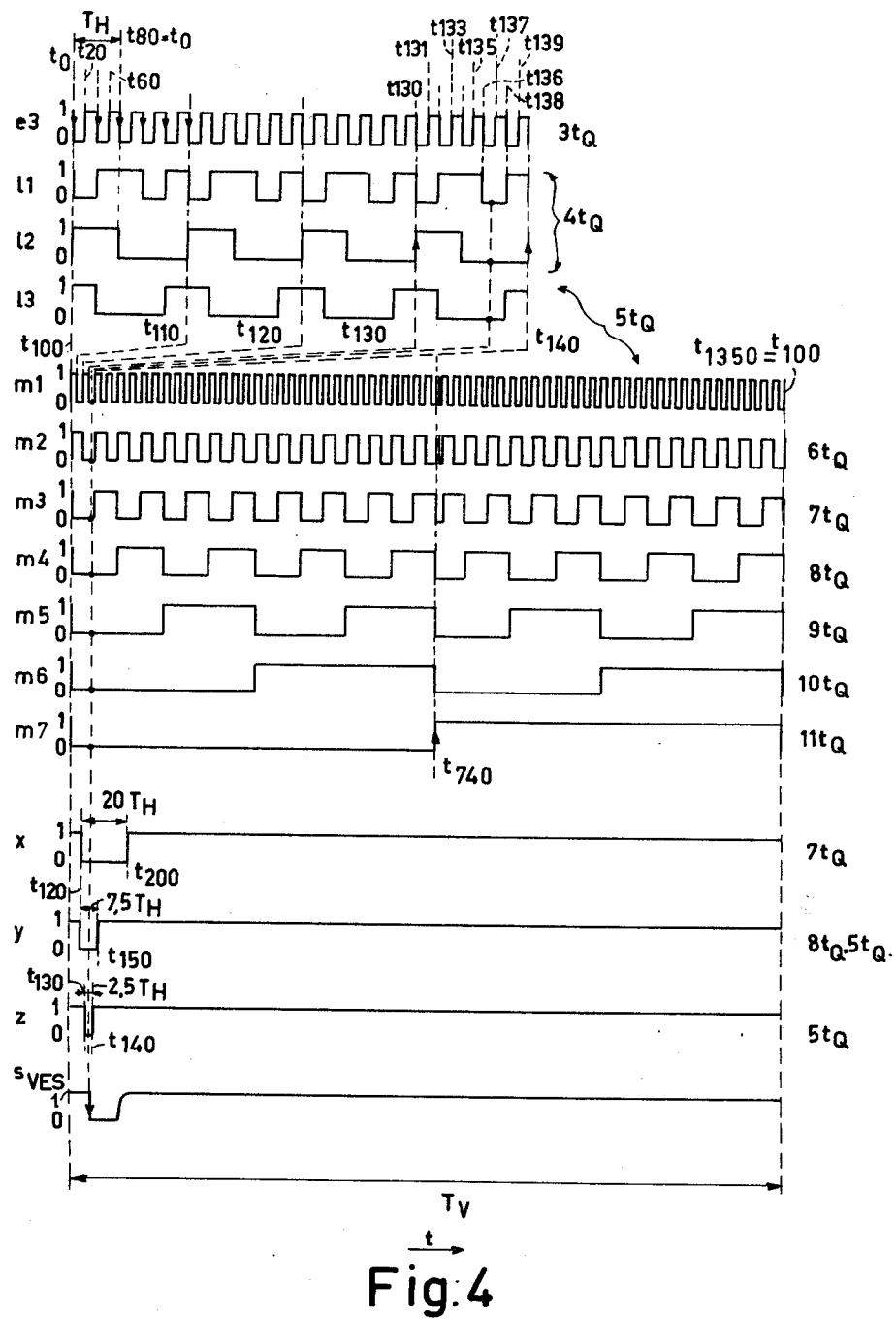
Figure 5:
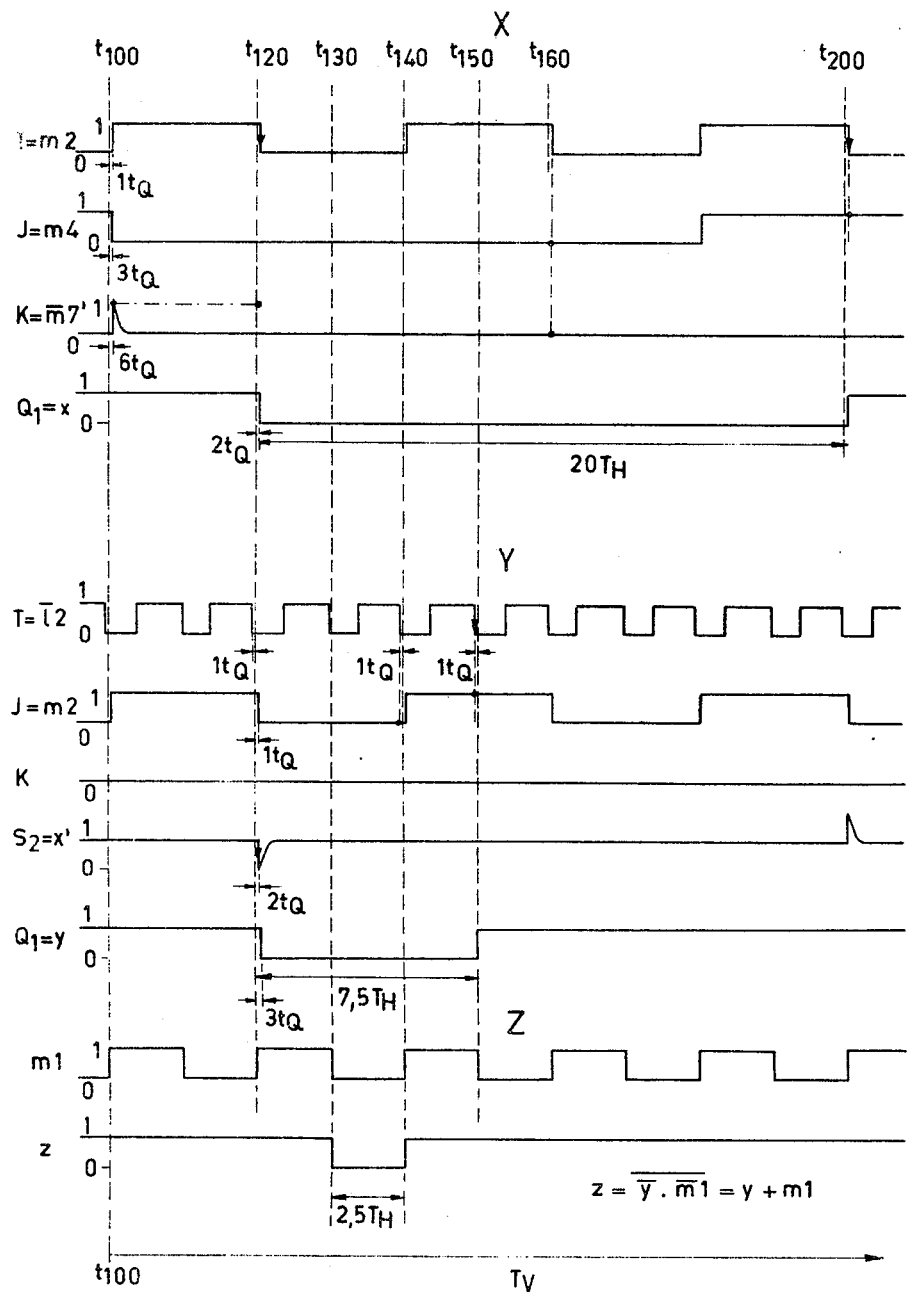
Figure 6:
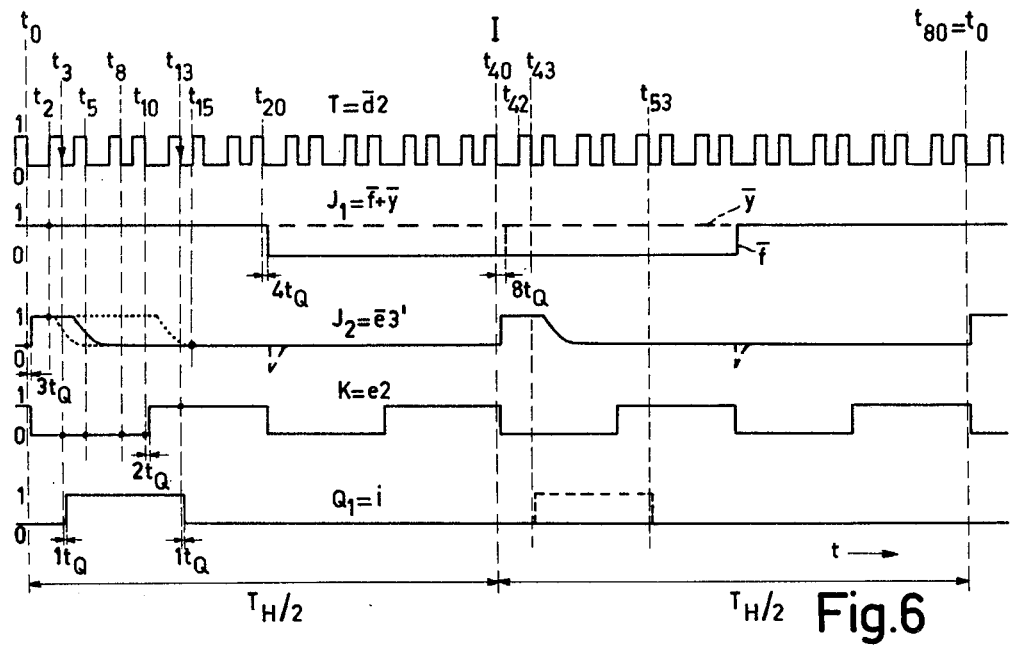
Figure 7:
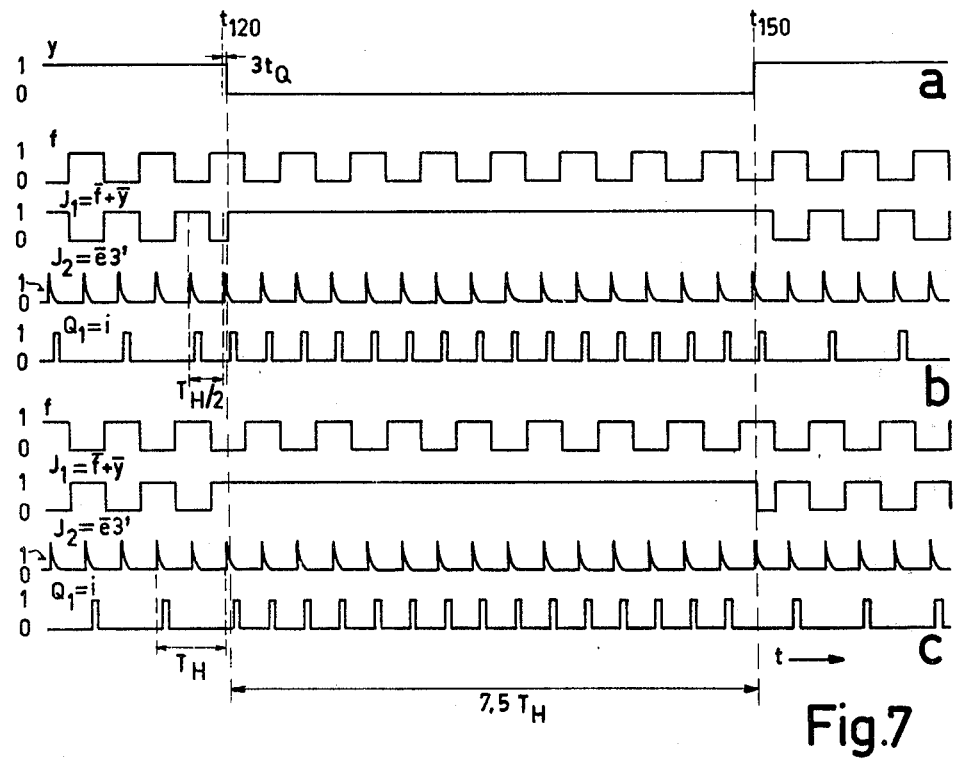
Figure 8:
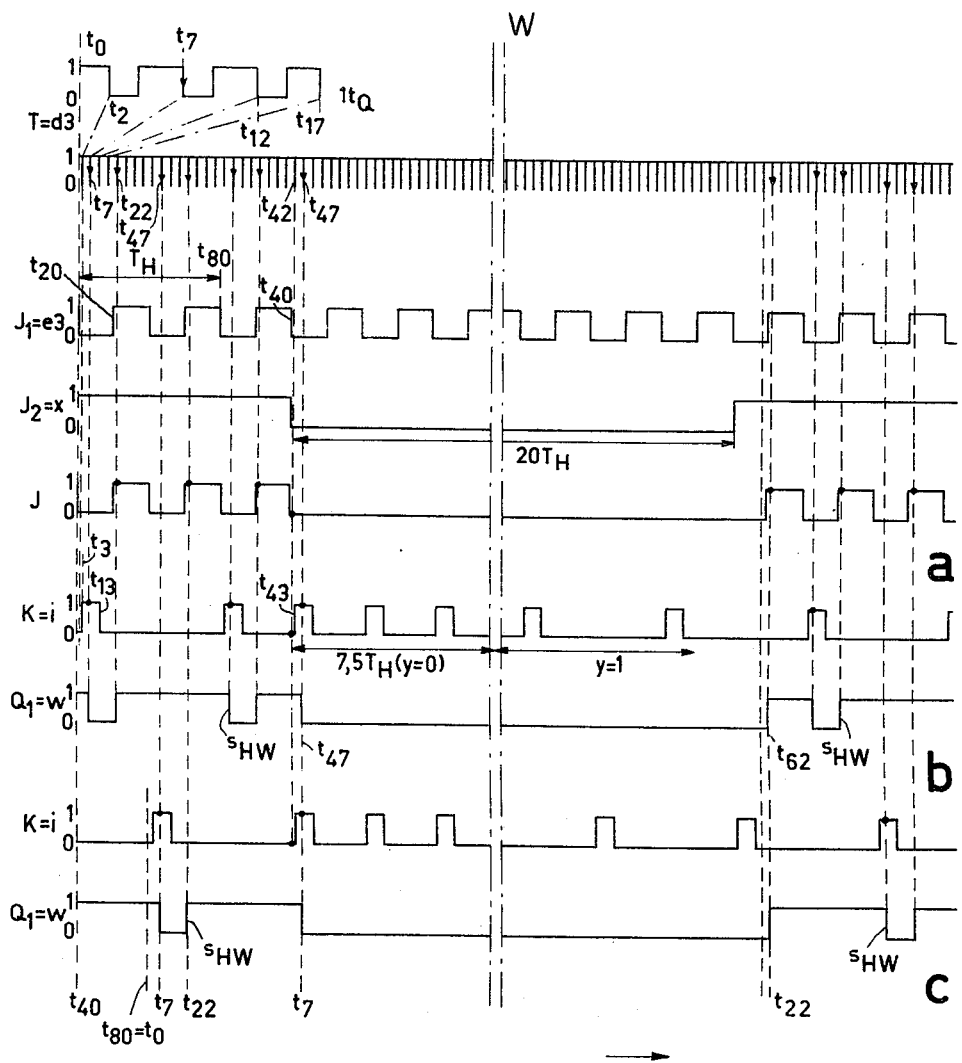
Figure 9:
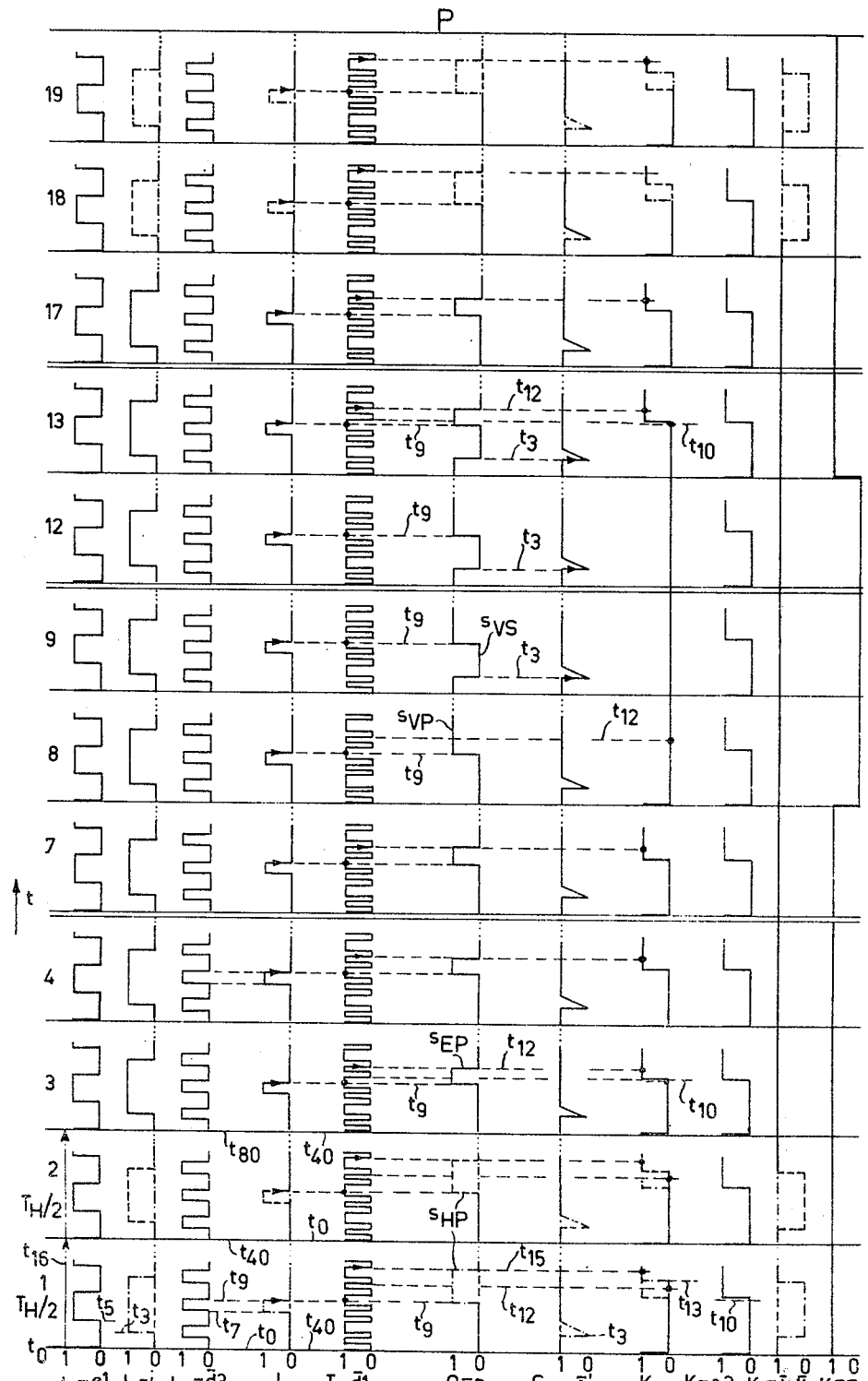
Figure 10:
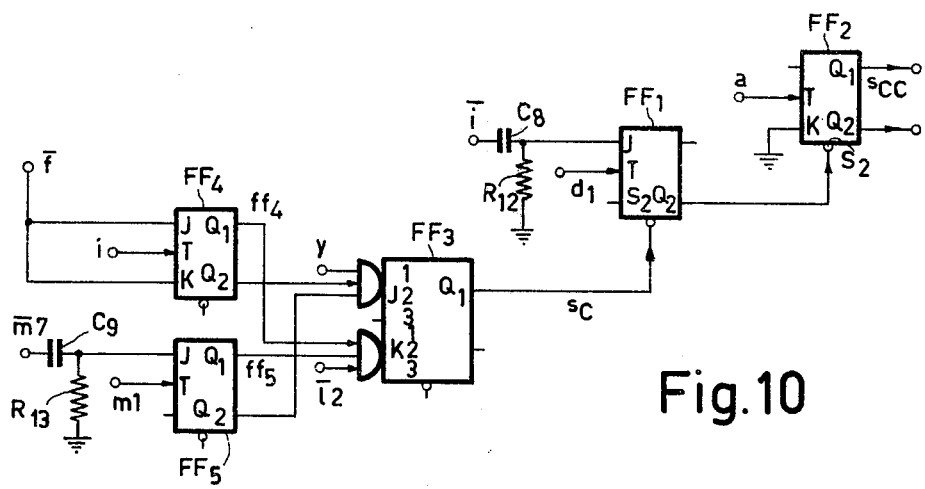
Figure 11:
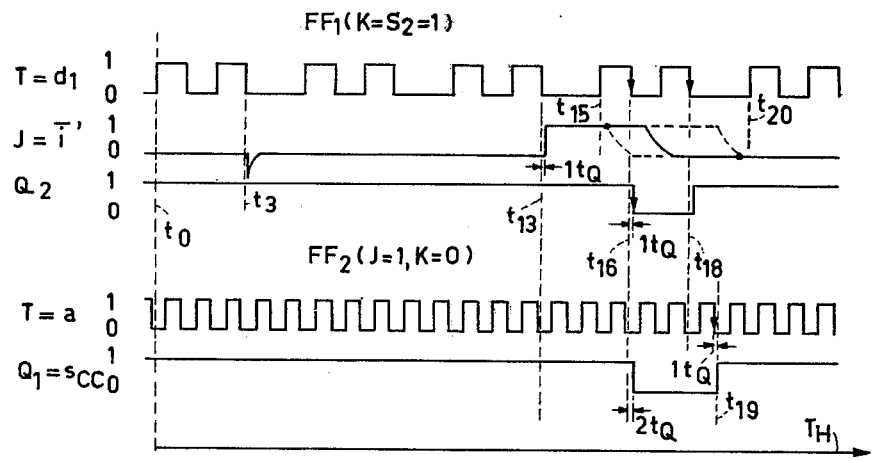
Figure 12:
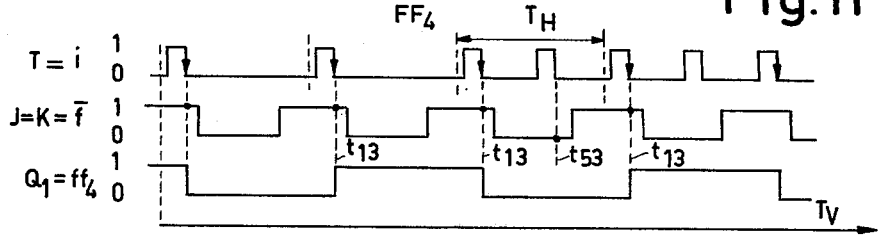
Figure 12:
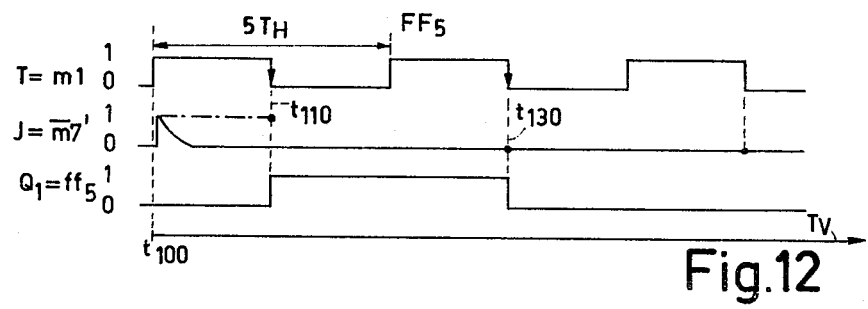
Figure 13:
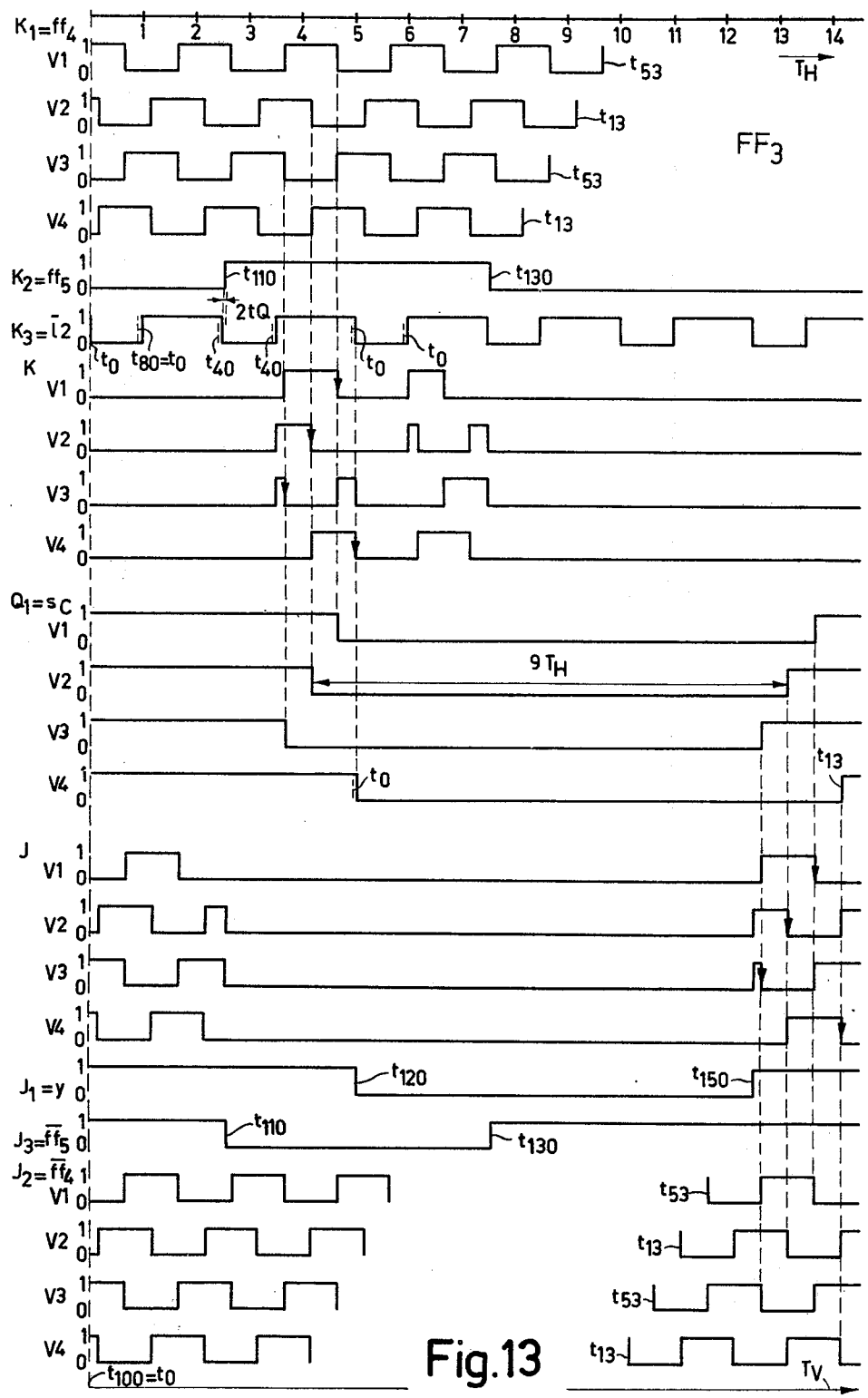
Figure 14:
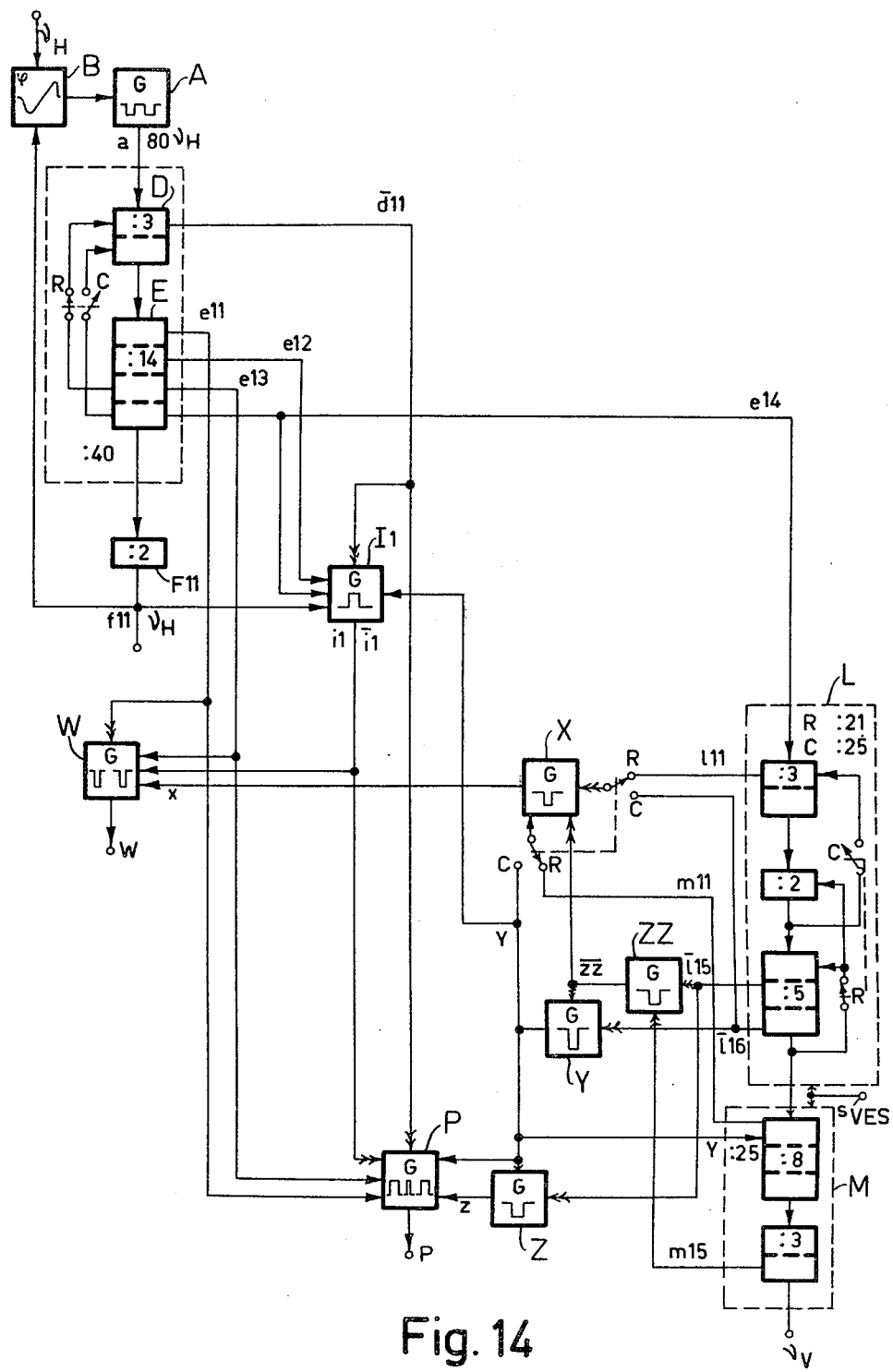
Figure 15:
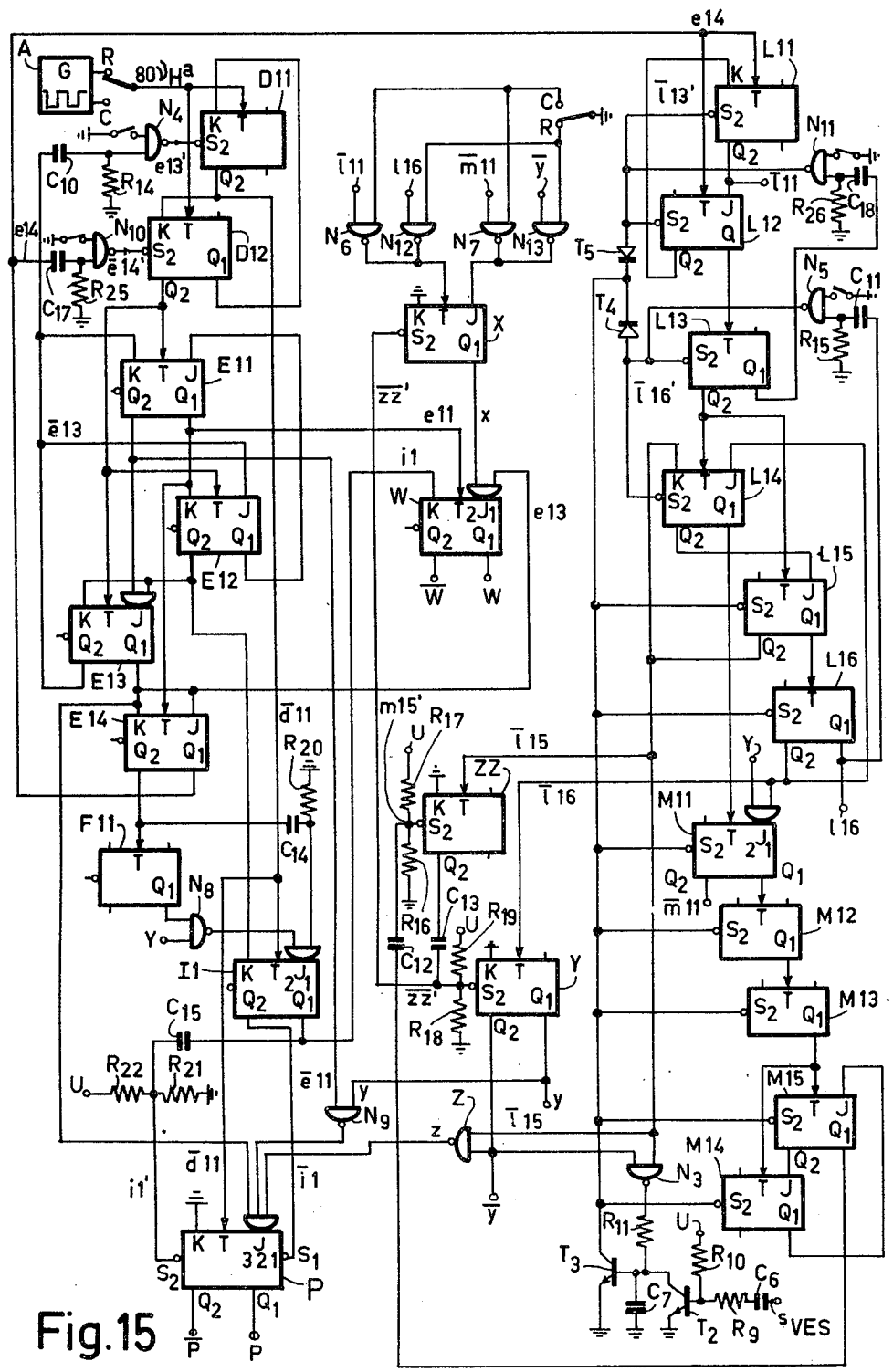
Figure 16:
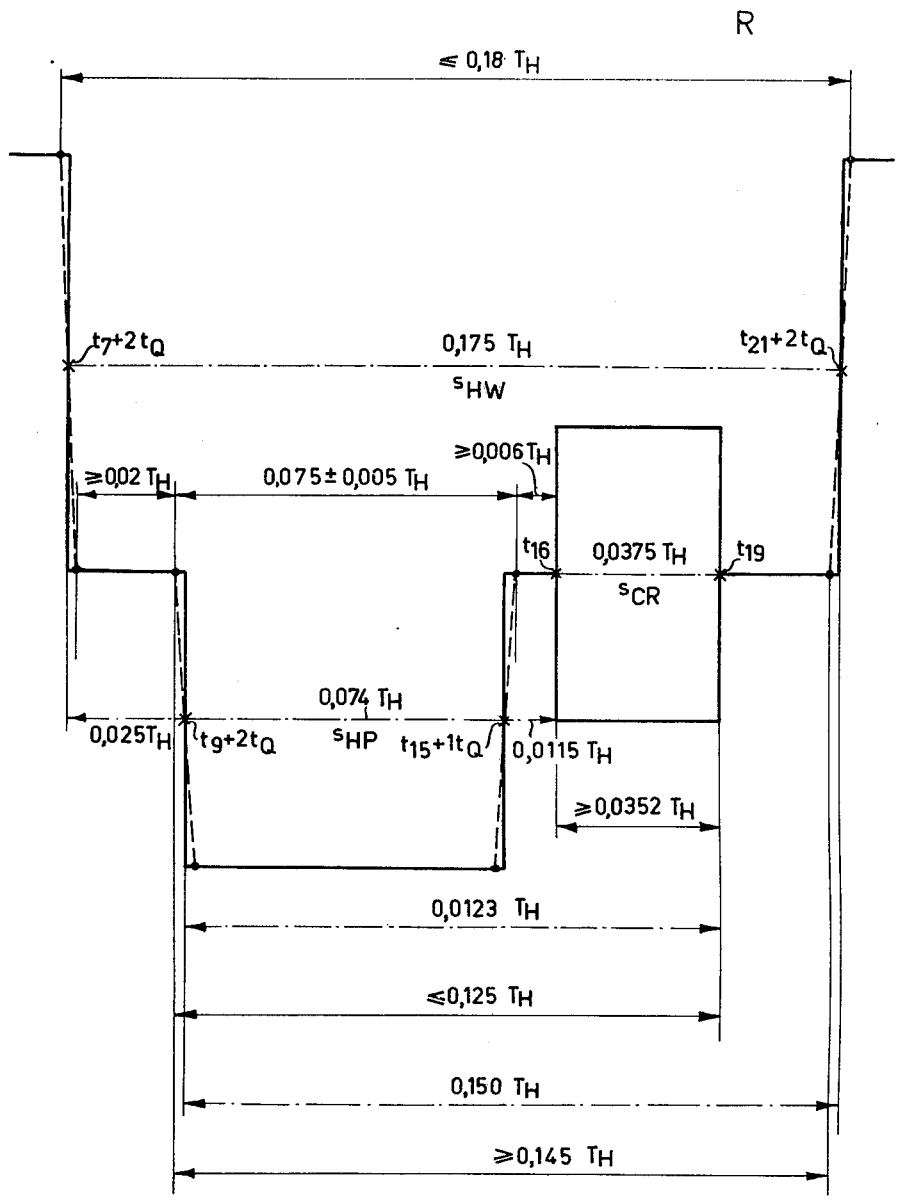
Figure 17:
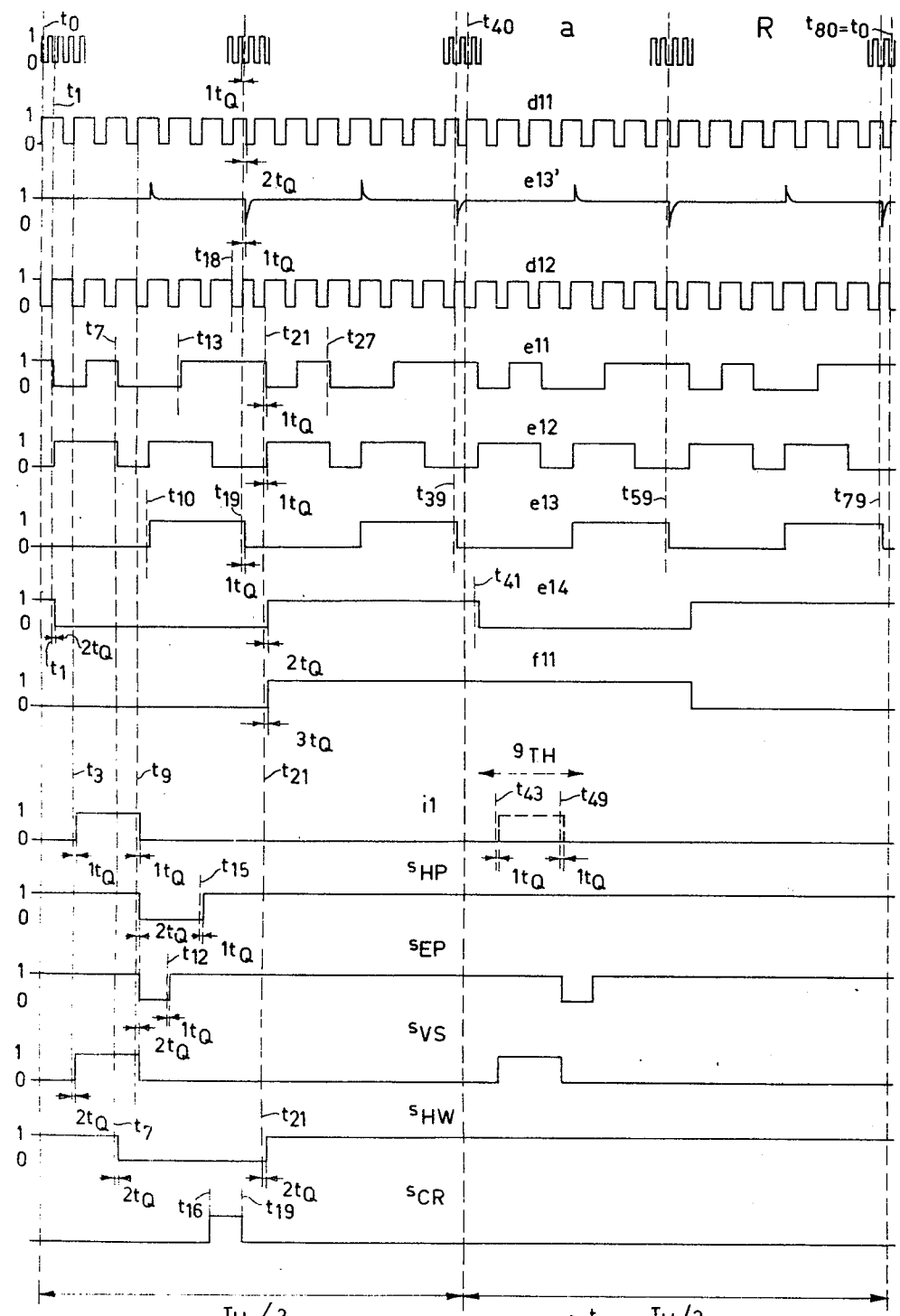
Figure 18:
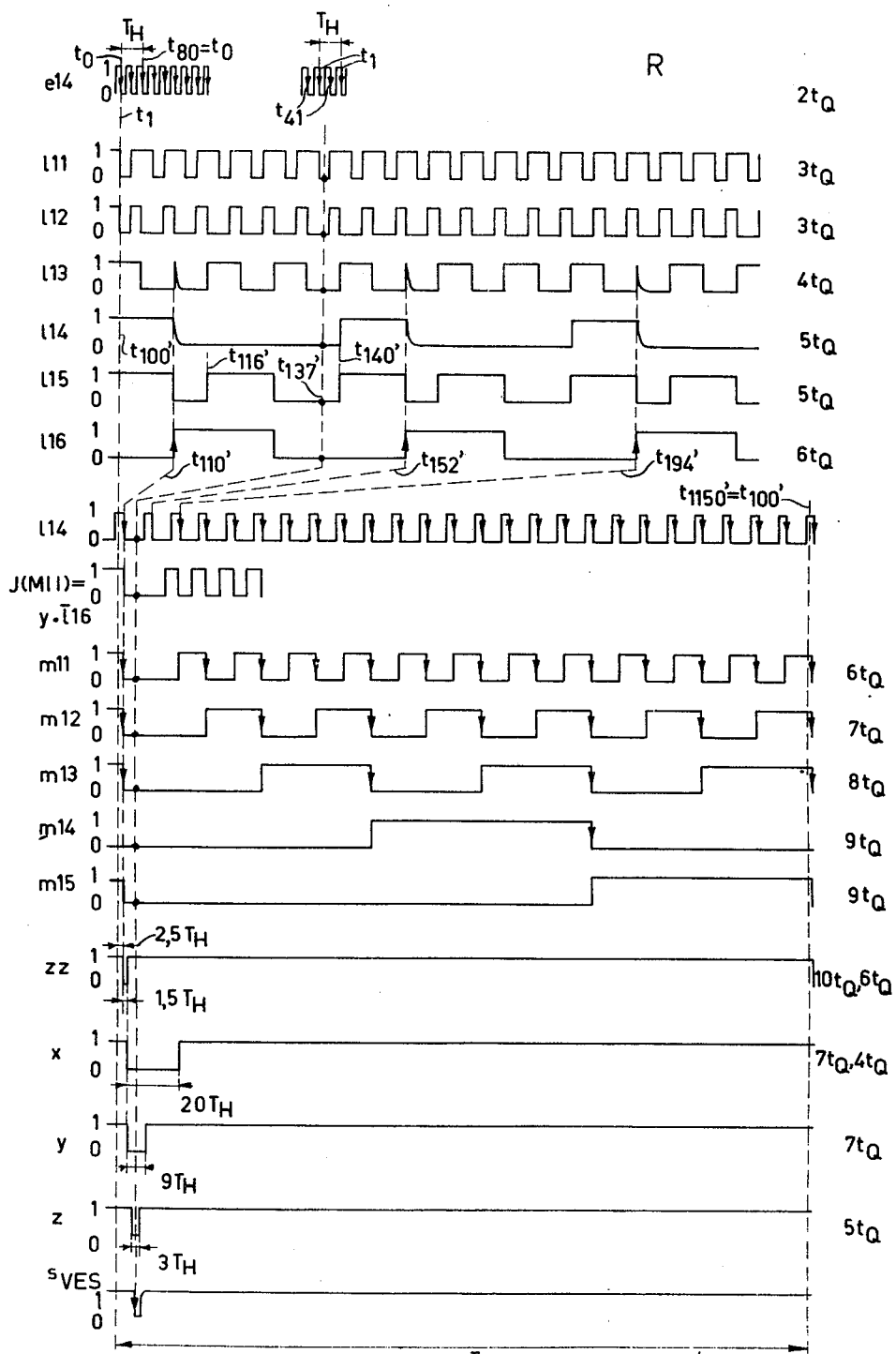
Figure 19:
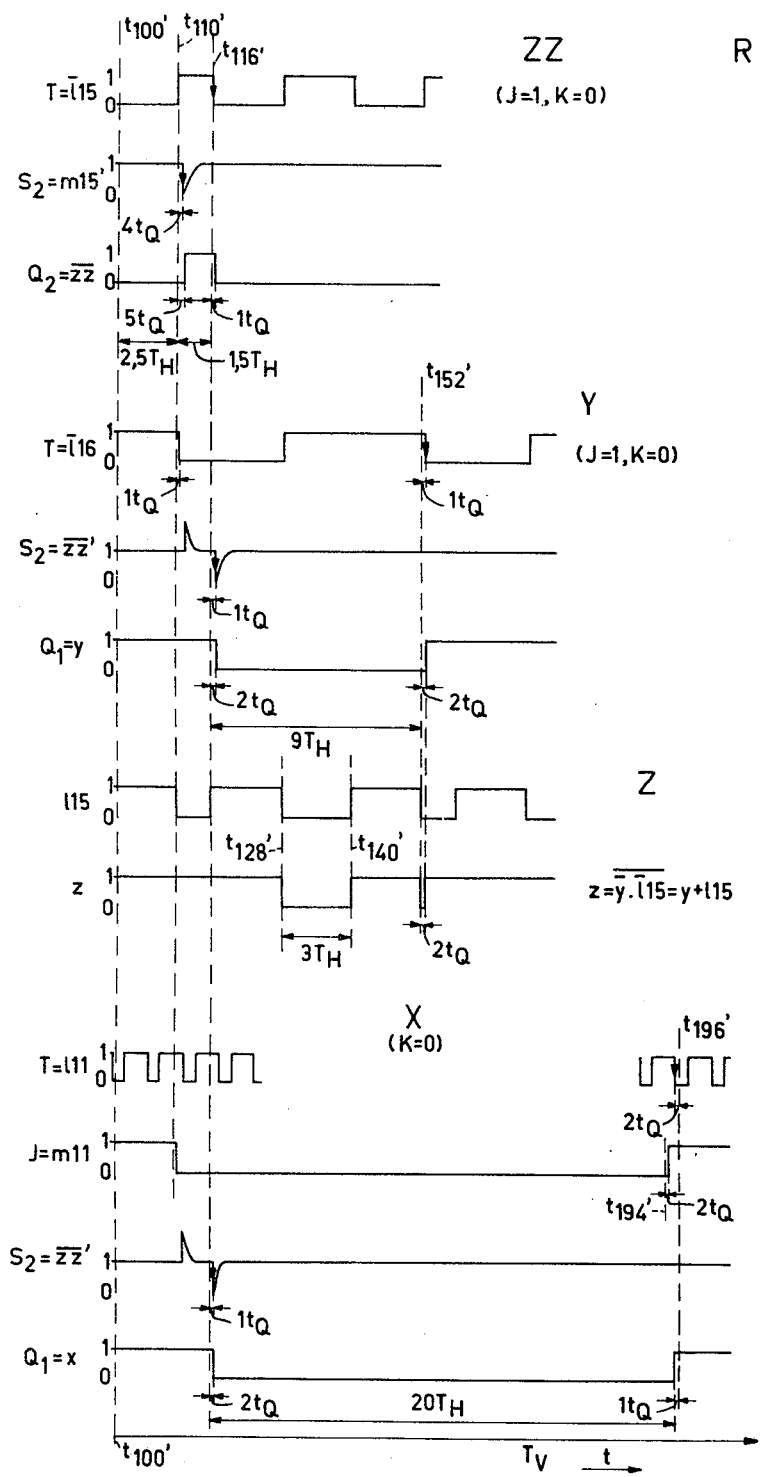
Figures 20, 21:
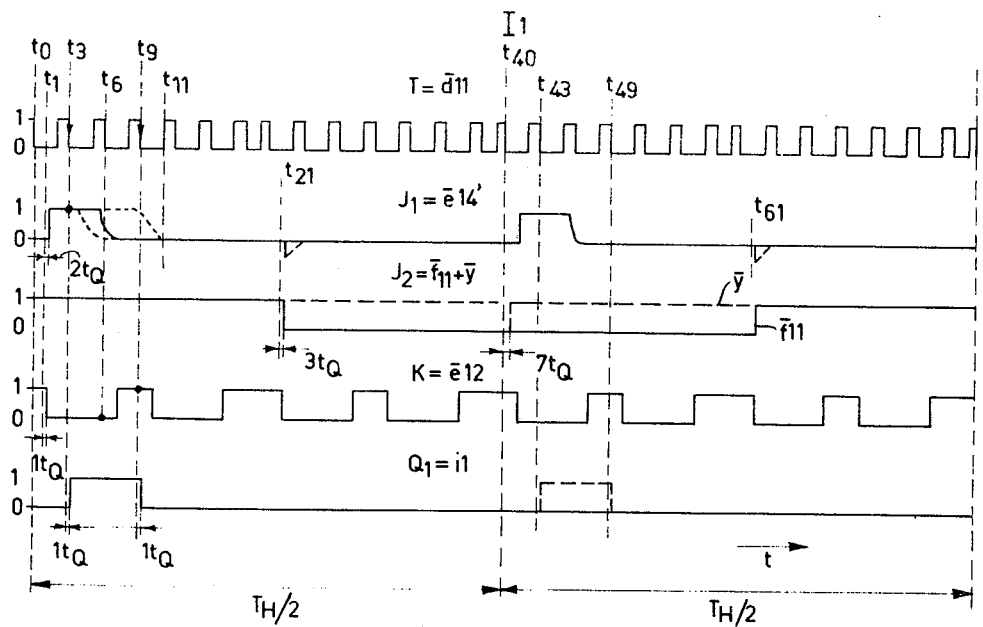
Figure 22:
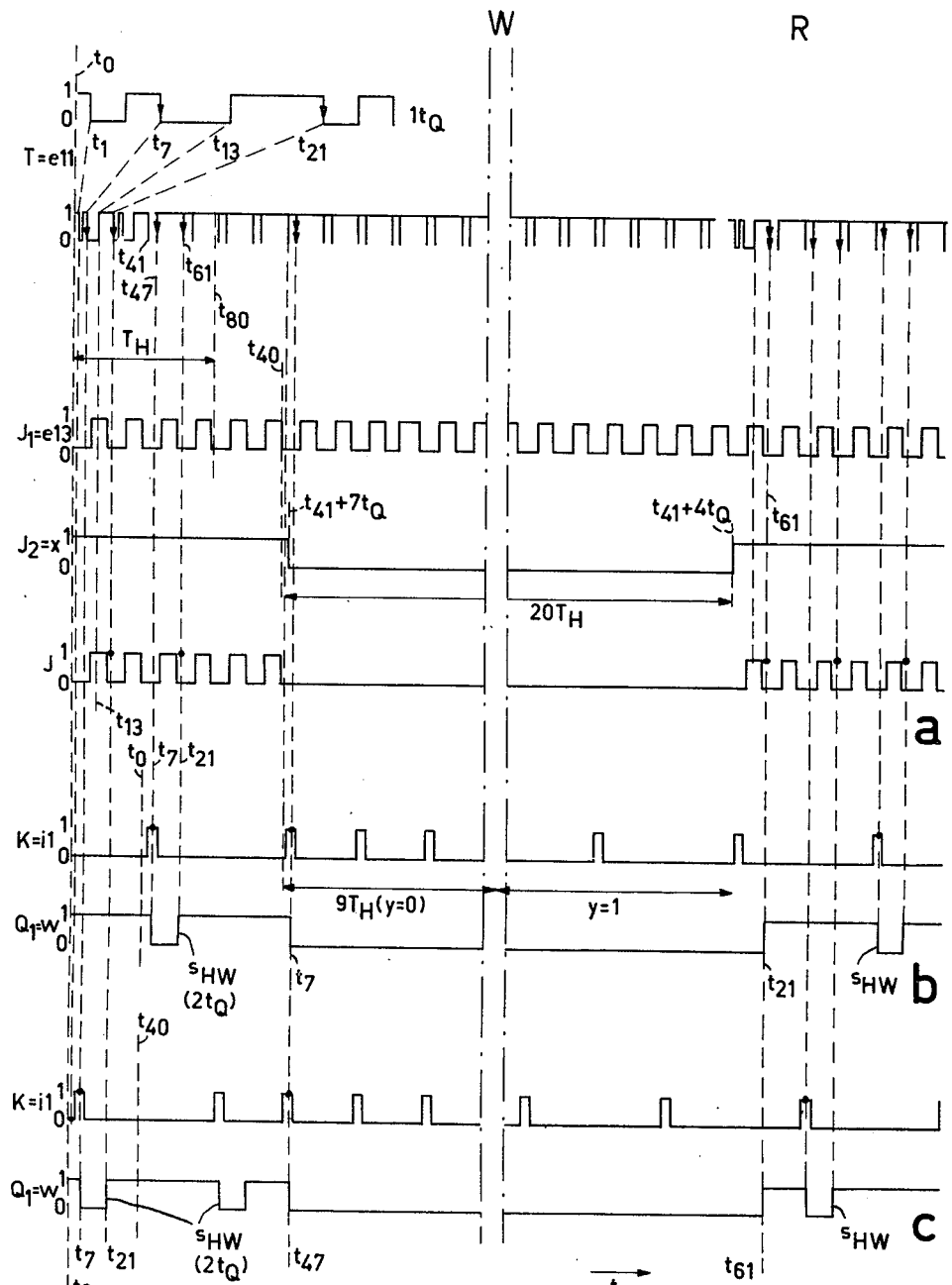
Figure 23:
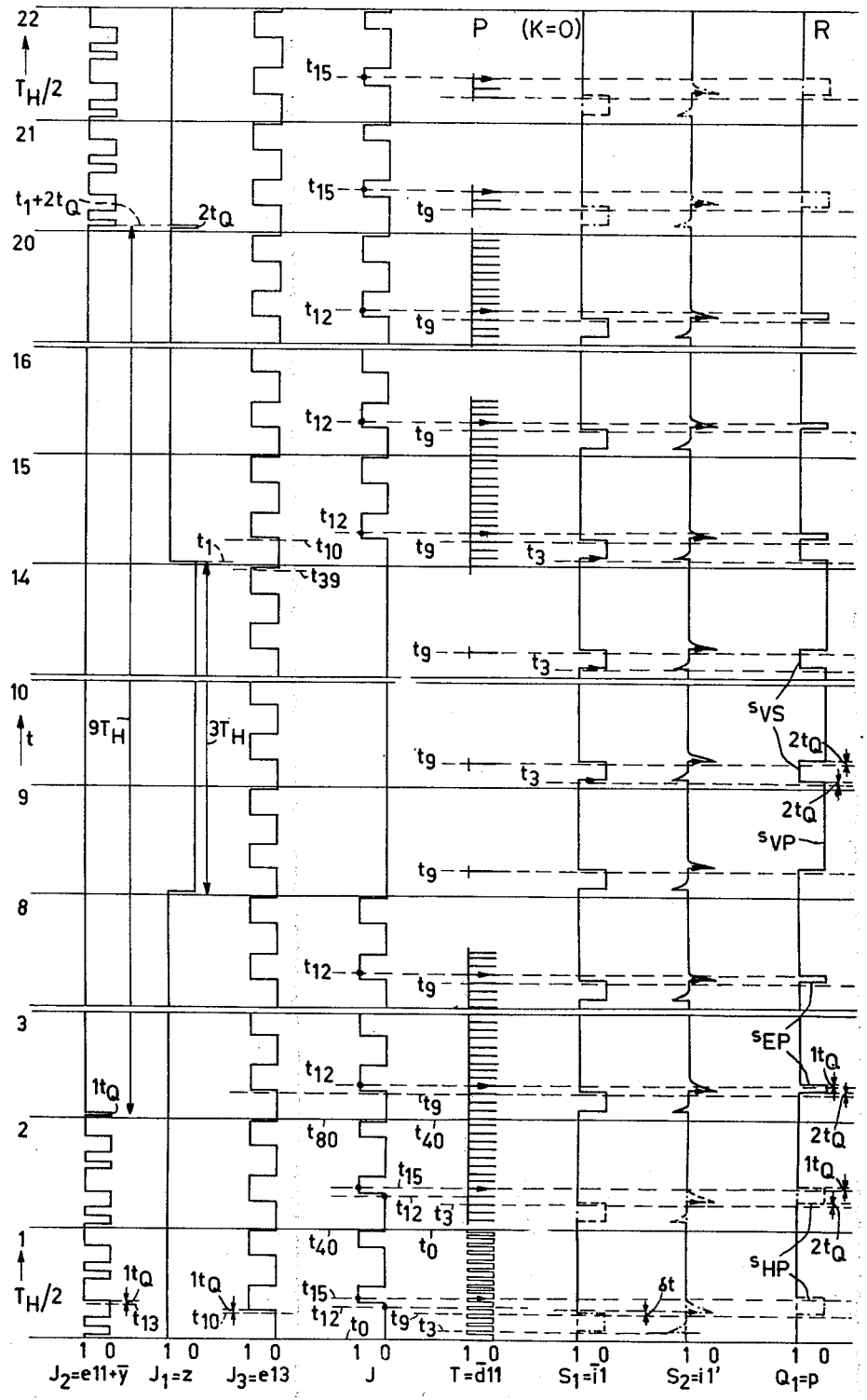
Figure 24:
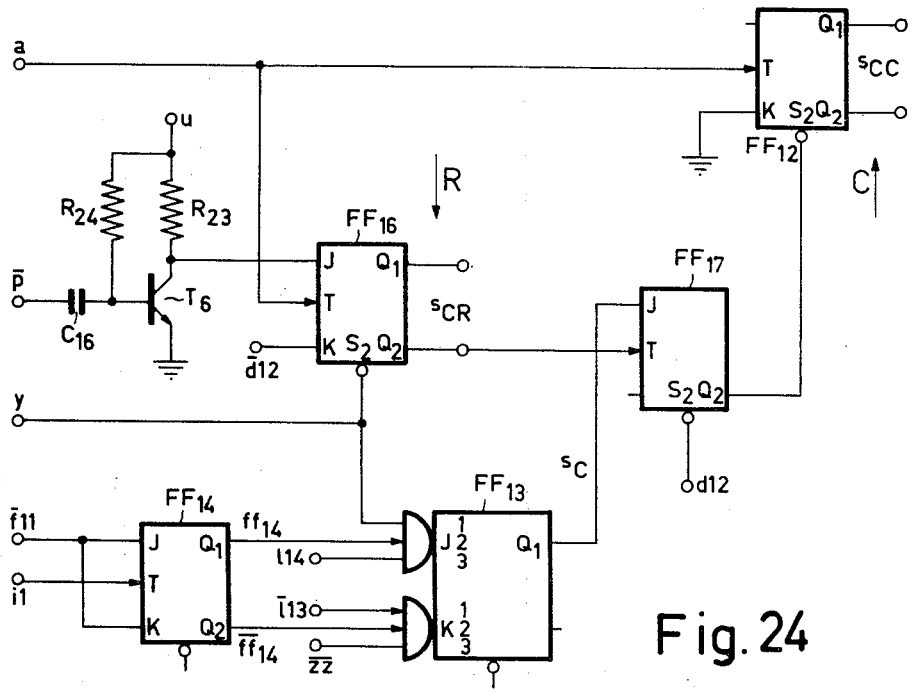
Figure 25:
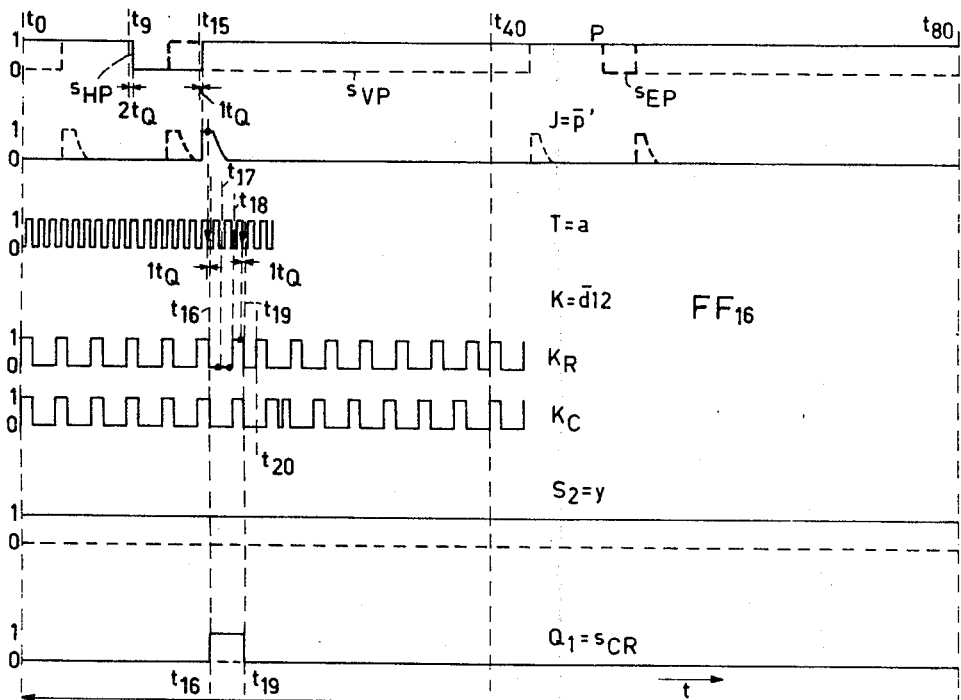
Figure 26:
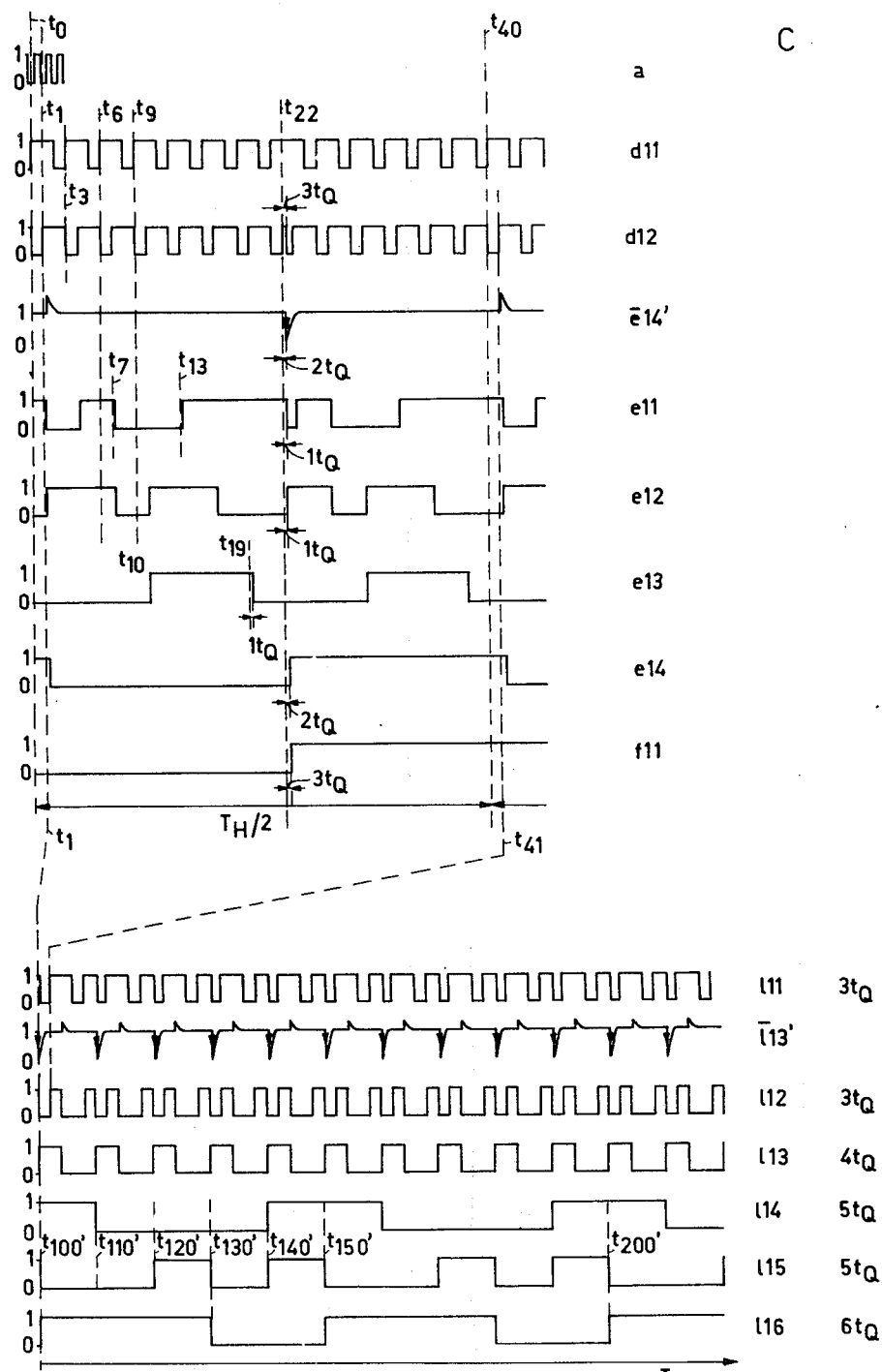
Figure 27:
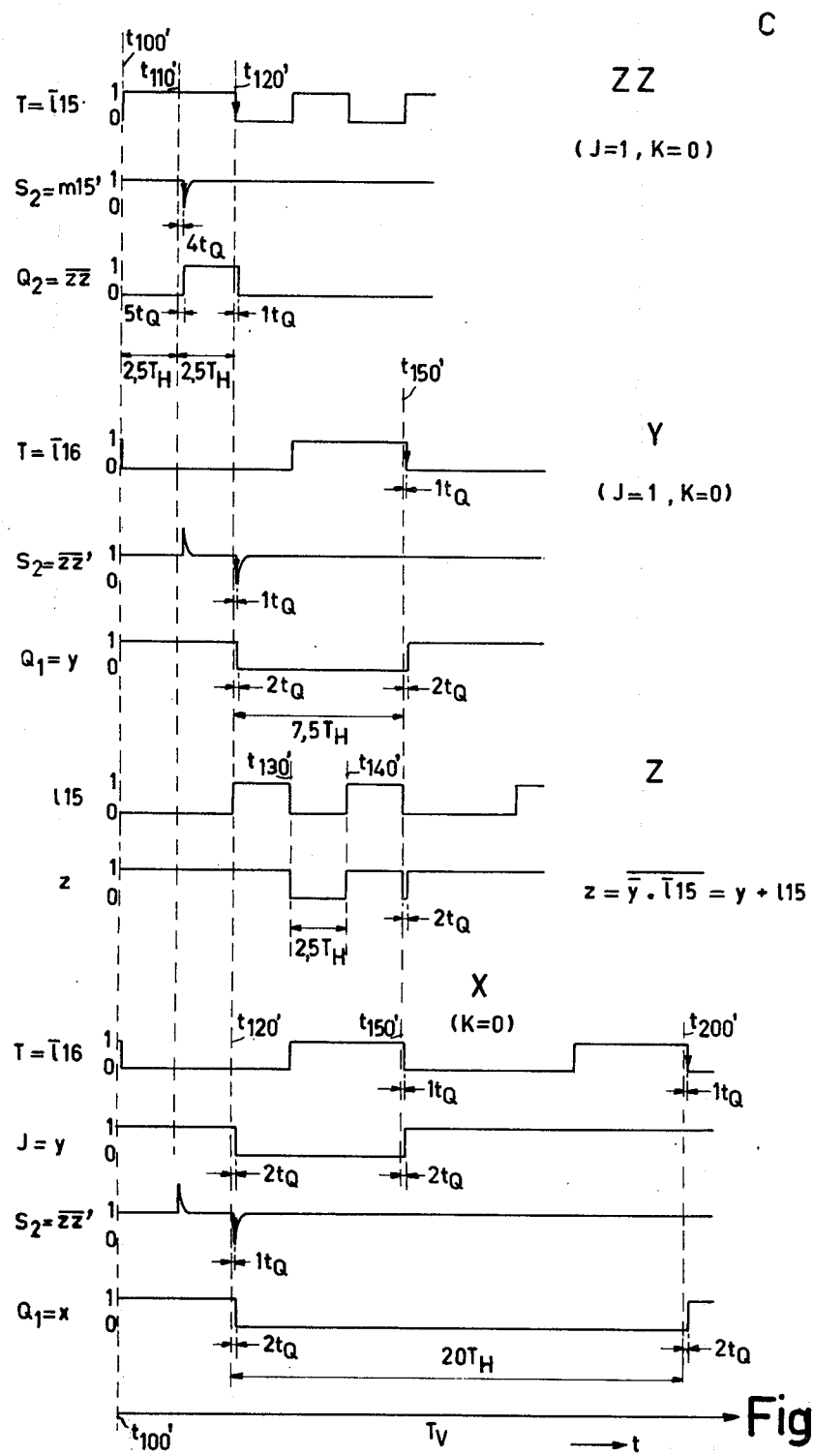

In order that the invention may be readily carried into effect, some embodiments thereof will now be described in detail, by way of example, with reference to the accompanying diagrammatic drawings, in which:

FIG. 1 is a block diagram of a television pulse generator according to the invention, FIG. 2 shows the pulse generator of FIG. 1 in greater detail, FIGS. 3 and 4 show the relation of time between signals occurring in the pulse generator, FIG. 5 serves to explain the generation of signals with pulses of field frequency, FIGS. 6 and 7 serve to explain the generation and the influence of a signal with auxiliary pulses occurring at the line frequency and at the double line frequency, FIG. 8 shows the pulses occurring in a blanking signal generator of the pulse generator of FIGS. 1 and 2, FIG. 9 relates, similarly as FIG. 8, to a synchronizing signal generator in the pulse generator, FIG. 10 shows a detail of a pulse generator according to the invention suitable for generating a PAL chrominance subcarrier gating signal, FIG. 11 serves to explain the generation of the PAL gating signal occurring at the line frequency, FIG. 12 shows a few auxiliary pulses, FIG. 13 serves to explain the generation of a field-shifted PAL blocking signal of nine line periods, FIG. 14 shows a block diagram of a pulse generator switchable between a plurality of television standards according to the invention, shown in the position for the RTMA standard (R), FIG. 15 shows the pulse generator according to FIG. 14 in greater detail, FIG. 16 serves to determine the relationship between a few signals laid down in accordance with the RTMA standard for colour television and generated with the aid of the pulse generator according to FIGS. 14 and 15, FIGS. 17 and 18 show the time relation between signals occurring in the pulse generator according to FIGS. 14 and 15, FIG. 19 serves to explain the generation of signals with pulses of field frequency, FIGS. 20 and 21 serve to explain the generation and the influence of a signal with pulses occurring at the line frequency and at the double line frequency, FIG. 22 shows the pulses for the RTMA standard occurring in a blanking signal generator of the pulse generator according to FIGS. 14 and 15, FIG. 23 shows, similarly as FIG. 22, a synchronizing signal generator in the pulse generator, FIG. 24 shows in greater detail a generator which can be connected to the pulse generator according to FIGS. 14 and 15, and which is suitable for generating an NTSC or PAL chrominance subcarrier gating signal for the RTMA or CCIR standard, FIG. 25 serves to explain the generation of the NTSC gating signal occurring at the line frequency and of an auxiliary pulse to be used for generating the PAL gating signal, FIG. 26 shows the time relation between signals in the pulse generator according to FIGS. 14 and 15, used in the position for the CCIR standard (C), and FIG. 27 serves to explain the generation of signals with pulses of field frequency for the CCIR standard.

In FIG. 1 the reference A denotes a clock pulse generator an input of which is connected to a phase discriminator B for the purpose of synchronisation. A generator is denoted by the general reference G. An output of the clock pulse generator A is connected to a circuit of frequency dividers D, E and F. The frequency divider F which provides a signal $f$ at a frequency of $v_H$ which represents the line frequency in a television system is connected to an input of the phase discriminator B to another input of which an external synchronizing signal of the frequency $v_H$ (not shown) is applied. For a choice of the clock pulse frequency of 80 $v_H$, which choice has been made in accordance with an aspect of the invention, the signal a provided by the generator A undergoes a division by 5, 8 and 2, respectively, by the frequency dividers D, E and F, respectively.

An output of the divider E conveying a signal at double the line frequency is connected to a circuit of frequency dividers L and M having a dividend of 5 and 125, respectively. For a 625-line system employing interlacing the frequency divider M provides a signal of a frequency $v_V$ which represents the field frequency. The dividers L and M are provided with an input to which an external synchronizing signal $s_{VES}$ may be applied for purposes of synchronisation. In the signals shown in FIG. 1 a line period $T_H$ and a field period $T_V$ are shown in the signals occurring at the line and field frequencies, respectively.

Outputs of the frequency dividers L and M consisting of divider stages are connected to pulse generators denoted by the references, X, Y and Z, which are also mutually coupled. Under the influence of output signals from the dividers L and M, which signals will be further referred to hereinafter, the pulse generators X, Y and Z provide signals x, y and z including pulses occurring at the field frequency and having a pulse duration of $20T_H$, $7.5\ T_H$ and $2.5\ T_H$, respectively. These pulse periods in the signals x, y and z laid down in the so-called CCIR standard provide approximately the field blanking period, the equalizing and field synchronizing period and exclusively the field synchronizing period, respectively.

The signals y and z and the signal x are applied to a synchronizing signal generator P and to a blanking signal generator W, respectively, other inputs of which are coupled to divider stages of the frequency dividers in the circuit D, E, F. The outputs of the generators P and W convey signals p and w which correspond to a different pulse series including pulses of different duration and repetition period.

In addition to a certain choice of coupling the circuits D, E, F and L, M with the pulse generators X, Y, Z and the signal generators P and W, the pulse generator according to FIG. 1 is provided, in accordance with an aspect of the invention, with a pulse generator I forming part of the said coupling. The pulse generator I provides a signal i shown in FIG. 1, (and the inverse thereof ī) which beyond the equalising and field synchronizing period of $7.5\ T_H$ laid down by signal y has auxiliary pulses occurring at the line frequency, which auxiliary pulses occur within this period at double the line frequency.

To explain the importance of the choice of the frequency of $80\ v_H$ of the clock pulse generator A and of the choice of coupling comprising the pulse generator I, FIG. 1 will be further described in combination with the detailed embodiment according to FIG. 2, and the signals shown in the following Figures. In FIG. 2 some components of FIG. 1 are not shown, whereas other components, such as for example the divider stages of the frequency dividers of the circuits D, E, F and L, M are shown separately. In FIG. 1 the direction of signal transmission in a general sense is denoted by a single arrow head, whereas, as will be apparent, signal paths giving an important trigger action on the generators X, Y, X, I, P and W are provided with double arrow heads. On the other hand the corresponding signal paths giving a trigger action are shown in FIG. 2 with single arrow heads for the sake of simplicity.

Generator Z shown in FIG. 1 is formed in FIG. 2 as a NAND gate and the frequency dividers D, E, F, L and M, and the generators X, Y, I, P and W are formed with JK flip-flops in FIG. 2. These digital circuit elements are bulk-manufactured and have a great accuracy and a long lifetime as is required for use in computers. In the description of FIG. 2 the flip-flop indication will be used instead of the divider and generator indication. For the chosen type all single-fold inputs and outputs of the flip-flop Y are used, so that this will be described in general in order to explain the operation of a JK flip-flop. As used in an embodiment of the pulse generator of FIG. 2, two JK flip-flops may be constitute one component such as, for example, in the type FCJ 121 one flip-flop of which is denoted by ½ FCJ 121. The JK flip-flop Y has a command input denoted by the reference T and an arrow head and two preparatory inputs denoted by the references J and K and determining whether the flip-flop changes over or does not change over. A reset input is denoted by the reference $S_2$. Two outputs $Q_1$ and $Q_2$ convey inverse sig noted by y and $\bar{y}$, respectively, for the flip-flop Y. Two combined flip-flops in one FCJ 121 have only the reset input $S_2$ in common. The inputs J and K may alternatively be formed in a multifold manner through an AND gate such as is shown for the J inputs $J_1$ and $J_2$ of the flip-flops I and W and in which there applies that $J = J_1 \cdot J_2$.

Generally the following applies for a JK flip-flop while starting from the so-called positive logic having a high potential corresponding to a logic 1 and a low potential corresponding to a logic O, while an unconnected input conveys a logic 1 through internal couplings.

If a logic 1 is impressed on the $S_2$ input of the flip-flop Y or if it is not connected ($S_2$ (Y) = 1), then it does not exert influence. If a variation from a logic 1 to 0 ($S_2$ (Y) $1 \rightarrow o$) at the $S_2$ input or if there is a logic 0 ($S_2$ (Y) = 0), the $Q_1$ output must pass from the logic 1 to 0 ($Q_1$(Y) $1 \rightarrow 0$) or the $Q_1$ output remains 0 ($Q_1$ (Y) = 0). For the inverse $Q_2$ output it follows that $Q_2$ (Y) $0 \rightarrow 1$ or $Q_2$ (Y) = 1.

The JK flip-flop Y changes over under the influence of the signals at the J and K inputs only when a logic 1 becomes a 0 at the T input (T (Y) = $1 \rightarrow 0$). For a logic 0 at the T input (T (Y) = 0) the signals at the J and K inputs do not exert influence and may vary arbitrarily.

For a logic 1 at the T input (T (Y) = 1) the signal at the J and K inputs constitute the basis for causing the flip-flop to either change over or not when T (Y) $1 \rightarrow 0$, in which a logic 1 is predominant relative to a 0, that is to say, a logic 1 occurring for a short instant at the J or K input during T (Y) = 1 determines if the flip-flop either changes over or not rather than does a logic 0 which is present for a long period.

Taking the foregoing into account and using the introduced notation, the following applies generally for a JK flip-flop.

TABLE 1.

| For T $1 \rightarrow 0$ | | | |
| J | K | $Q_1$ | $Q_2$ |
| 0 | 0 | $Q_1$ remains $Q_1$ | $Q_2$ remains $Q_2$ |
| 0 | 1 | 0 | 1 |
| 1 | 0 | 1 | 0 |
| 1 | 1 | $Q_1$ changes over | $Q_2$ changes over |

In the description of FIG. 9 and Table 5 reference will be made to the flip-flop P having 3 J and K inputs (type FCJ 201) which may alternatively serve as command or trigger inputs when T = 1.

The inputs and outputs which are connected to other outputs and inputs are shown for the JK flip-flops of FIG. 2. For connections which are important for the invention, FIGS. 1 and 2 show the output signals which are partly plotted as a function of time in FIGS. 3 - 9. Since the inverse signals of the $Q_2$ outputs only differ in polarity from the signals of the $Q_1$ outputs, only the latter are plotted in FIGS. 3 and 4.

Starting from the clock pulse signal a, FIG. 3 shows the signals d1, d2 and d3 of the 5-to divider D consisting of 3 flip-flops D1, D2 and D3, the signals e1, e2 and e3 of the 8-to-1 divider E consisting of 3 flip-flops E1, E2 and E3 and the signal f of the flip-flop F acting as a 2-to-1 divider. Furthermore FIG. 3 shows a few signals including pulses occurring at the line frequency and at the double line frequency which are in a close relation with the clock pulses in the signal a such as: in the signal i the auxiliary pulses occurring at the line frequency and during the 7.5 $T_H$ period at the double line frequency; a line synchronizing pulse shown in signal $s_{HP}$, two equalizing pulses occurring at the double line frequency shown in signal $s_{EP}$; two raster serrations occurring in signal $s_{VS}$ at the double line frequency and a line blanking pulse occurring in signal $s_{HW}$.

FIG. 2 shows by way of the instant $t_o$ a commencing instant of one line period and $t_{80}$ shows the end which corresponds to the instant $t_0$ of a subsequent line period. 80 Clock pulses occur in the signal a between $t_0$ and $t_{80}$ so that the difference between two successive instants $(t_0, t_1, t_2... t_{80})$ corresponds to one clock pulse period. FIG. 2 shows that the clock pulses of signal a are applied to the T input of the flip-flops D1 and D2, that is to say, to both inputs T(D1) and T(D2). $B_V$ Negatively directed edges in the signal a and other signals which are active as trigger edges and cause a flip-flop to change over the partially provided with arrow heads. To explain the operation of the 5-to-1 divider D including the 3 flip-flops D1, D2 and D3 and to give the mutual connections a Table 2 follows in which the variations shown in the signals $d_1$, $d_2$ and $d_3$ of FIG. 3 are derived with the aid of Table 1.

that at the instant $t_0$ when there applies that T (D1) = T(D2) 1 → 0, the flip-flop D1 and D2 change over so that $t_0 - \Delta t$ J(D1) = 1 and K(D2) = 1. It follows therefrom that at $t_0 - \Delta t$ $Q_2$ (D1) = K(D2) = 1 and $Q_1$ (D3) = J(D1) = 1. To ensure that D3 certainly does not change over at the instant $t_0$, T (D3) = 0 = $Q_1$ (D2) at $t_0 - \Delta t$. The rows and columns shown in Table 2 can subsequently be derived in a simple manner by considering for a certain instant the value of J (D1) = $d_3$ of a previous instant.

Table 2 shows that the rows at the instants $t_0$, $t_5$, $t_{10}$ .....; $t_1$, $t_6$ ......etc. are the same. In FIG. 3 it can be seen from signal $d_3$ that the divider D thus dividing by five is active as an asymmetrical divider, while the edges are indicated over one arbitary period at the instants, $t_2$, $t_4$ to $t_7$.

In Table 2 it has been stipulated that delays in the JK flip-flops D1, D2 and D3 have not been taken into account. It is found from data in the Handbooks that a JK flip-flop FCJ 121 has an average propagation delay time $t_{pd}$ of 105 ns at a maximum between a T input and a Q output. Measurements yielded at $t_{pd}$ of 70 ns at an average. For the sake of simplicity FIG. 3 mentions the propagation delay time $t_{pd}$ as $t_Q$. As a reference value, relative to which the successive propagation delay times of the JK flip-flops will be considered, the edges in the signals $d_1$ and $d_2$ are taken which coincide with the instants $t_0$, $t_1$, $t_2$, $t_3$, etc. As a result the trigger edges, which are sometimes denoted by arrow heads, occur in the signal a in FIG. 3 at a time $t_Q$ before the instants $t_0$, $t_1$, $t_2$, etc. As is indicated at the instant $t_9$ in signal $d_3$, the pulse edges in this signal have a delay time $t_Q$.

After the detailed description of the frequency divider D including the flip-flops D1, D2 and D3 only the following connections are given for the following asymmetrical or symmetrical frequency dividers E, F. L and M:

T (E1) = $Q_2(D_1)$ J (E1) = K (E1) = $Q_2$(D3)
T (E2) = $Q_1$ (E1) T (E3) = $Q_1$ (E2)
T(F) = Q2(E3)
T(L1) = T (L2) = $Q_1$(E3) K (L1) = Q2 (L2) d1 Q.

TABLE 2

| Frequency divider D | | | | | | | | | |
|---|---|---|---|---|---|---|---|---|---|
| | | D1 K = 1 | | | D2 J = 1 | | | D3 J = K = 1 | |
| Table 1 → | (J = 0 → $Q_1$ = 0) (J = 1 → change-over) | | | K = 0 → $Q_1$ = 1 K = 1 → change-over | | | change-over | | |
| signal t ↓ | T a | J d3 | $Q_1$ d1 | $Q_2$ $\overline{d1}$ | K $\overline{d1}$ | $Q_1$ d2 | $Q_2$ $\overline{d2}$ | T d2 | $Q_1$ d3 | $Q_2$ $\overline{d3}$ |
| $t_0-\Delta t$ | 1 | 1 | 0 | 1 | 1 | 0 | 1 | 0 | 1 | 0 |
| $t_0$ | 1 → 0 | 1 | 1 | 0 | 0 | 1 | 0 | 1 | 1 | 0 |
| $t_1$ | 1 → 0 | 1 | 0 | 1 | 1 | 1 | 0 | 1 | 1 | 0 |
| $t_2$ | 1 → 0 | 0 | 1 | 0 | 0 | 0 | 1 | 0 | 0 | 1 |
| $t_3$ | 1 → 0 | 0 | 0 | 1 | 1 | 1 | 0 | 1 | 0 | 1 |
| $t_4$ | 1 → 0 | 1 | 0 | 1 | 1 | 0 | 1 | 0 | 1 | 0 |
| $t_5$ | 1 → 0 | 1 | 1 | 0 | 0 | 1 | 0 | 1 | 1 | 0 |
| $t_6$ | 1 → 0 | 1 | 0 | 1 | 1 | 1 | 0 | 1 | 1 | 0 |
| $t_7$ | 1 → 0 | 0 | 1 | 0 | 0 | 0 | 1 | 0 | 0 | 1 |
| $t_8$ | 1 → 0 | 0 | 0 | 1 | 1 | 1 | 0 | 1 | 0 | 1 |
| $t_9$ | 1 → 0 | 1 | 0 | 1 | 1 | 0 | 1 | 0 | 1 | 0 |
| $t_{10}$ | 1 → 0 | 1 | 1 | 0 | 0 | 1 | 0 | 1 | 1 | 0 |

In Table 2 delays occurring in the flip-flop D1, D2 and D3 are not taken into account. For the purpose of further explanation of Table 2 the following applies: The reference $t_0 - \Delta t$ denotes an instant which lies just before the instant $t_0$. At the instant $t_0 - \Delta t$ the signal a has the value 1. It is desirable for the 5-to-1 divider D J(L2) = Q1 (L3) K (L2) = $Q_1$ (L1)
T(L3) = $Q_2$(L1) T (M1) = $Q_2$ (L2)
T(M2) = $Q_2$(M1) T (M3) = $Q_2$ (M2)
T(M4) = $Q_1$ (M3)....T(M7) = $Q_1$ (M6)
S$_2$(M1) = S$_2$(M2) = $Q_2$(M7) via differentiation.

Some important points are the following: As there applies for the JK flip-flop E1 that $T(E1) = \bar{d}1$ the signal $e1$ only has a delay time of $1t_Q$ while the subsequent successively connected flip-flops E2, E3 and F have a delay time of $2t_Q$, $3t_Q$ and $4t_Q$.

FIG. 4 shows the result of the connection of the divider E3 with a trigger signal $e3$ to the 5-to-1 divider L (FIG. 1) consisting of 3 JK flip-flops L1, L2 and L3. The signals $m1$ to $m7$ inclusive are also shown, which signals are associated with 7 JK flip-flops M7 to M7 inclusive which constitute the 125-to-1 divider M.

The propagation delay times then range from $3t_Q$ to $11t_Q$ inclusive. The propagation delay time corresponds to a sequential number of the JK flip-flop calculated on the flip-flops D1 and D2 which determine the time scale $t_0$ ..... $t_{80}$ and are therefore also calculated on the clock pulse generator A.

In the signal $e3$ of FIG. 4 a line period $T_H$ has been shown from an instant $t_0$ occurring periodically at the line frequency (the delay time $3t_Q$ is left out of consideration). For obtaining in a similar manner a time scale of field frequency an instant $t_{100}$ is shown at the signal $m1$ which gives the periodical instant of commencement of a field time scale calculated on the signal $m1$. The edges occurring in the signal $e3$ determine approximately the successive instants $t_{101}$, $t_{102}$...... $t_{110}$... $t_{120}$......$t_{130}$, $t_{131}$.......$t_{1350} = t_{100}$ which apply to two different time scales for the signals $e3$, $l1$, $l2$, $l3$ and $m1$..... $m7$.

Since the divider M consisting of 7 divider stages of FIG. 2 would divide further steps by $2^7 = 128$ instead of to 125, the output $Q_2(M7)$ with the signal $\overline{m}7$ is coupled for an internal resetting at the instant $t_{740}$ to the reset inputs $S_2(M1)$ and $S_2(M2)$. This coupling is effected through a differentiating circuit which includes a capacitor $C_1$ and two resistors $R_1$ and $R_2$ arranged in series between ground and a potential U. The junction of the resistors $R_1$ and $R_2$ is coupled through a diode $T_1$ blocking the internal reset pulse to the reset inputs of the flip-flops L1, L2, L3, M3 ..... M7, the purpose (synchronizing purposes) being further referred to hereinafter. Either the complete potential U or a portion thereof corresponds to the already mentioned logic 1 while the ground potential corresponds to the logic 0.

As in FIG. 1, FIG. 4 shows the signals $x$, $y$ and $z$, but in relation to the signals $e3$, $l1$....$l3$, $m1$...$m7$. The external synchronizing signal $s_{VES}$ is also shown.

Starting from the values already given for the pulse duration in the signals $x$, $y$ and $z$ for a certain television standard, namely the CCIR standard, these values may be produced with the connections shown in FIG. 2 by means of two JK flip-flops X and Y and one NAND gate Z, while FIG. 5 shows the signal variation.

FIG. 2 shows that the T input of flip-flop X is connected to the $Q_1$ output of flip-flop $M_2$ and that the J input is connected to the $Q_1$ output of M4.

The K input of flip-flop X is connected to a differentiating circuit including a resistor $R_3$ to ground and a capacitor $C_2$ to the $Q_2$ output of flip-flop M7. The signals shown in FIG. 5 occur at the inputs of flip-flop X, in which $T = m2$, $J = m4$ and $K = \overline{m}7'$. The index notation relates to a differentiated signal.

In FIG. 5 the propagation delay times (a number of times $t_Q$) shown in FIG. 4 are included in the graphic representation. As compared with the time scale with the instant $t_{100}$ calculated on the signal $m1$, the edges of signals $m2$, $m4$ and $m7$ have a delay time of $1t_Q$, $3t_Q$ and $6t_Q$. At the instant $t_{100} + 6t_Q$ the signal $\overline{m}7'$ has the logic 1 for a short moment, which value as given with reference to the general description and Table 1 of the JK flip-flop Y is predominant relative to the logic 0. The flip-flop X therefore assumes the state at which $J(X) = 0$, $K(X) = 1$, so that it follows with the aid of Table 1 that the $Q_1$ output of X must convey the logic 0 after the instant $t_{120} + t_Q$ at which $T(X) 1 \to 0$. At the instant $t_{120} + 2t_Q$, the flip-flop X changes over and the logic 1 information on the K input is lost due to internal couplings. A subsequent trigger edge in the signal $m2$ occurs shortly after the instant $t_{160}$. Then, however, J (X) = K (X) = 0 and the flip-flop X remains in the same state. For the trigger edge shortly after the instant $t_{200}$ the J input of flip-flop X has gone from the logic 0 to 1. At the instant $t_{200} + 1t_Q$ there applies that $J(K) = 1$ and $K(X) = 0$ so that the $Q_1$ output must convey the logic 1. For the remaining period of a field period $T_V$ there continues to apply that $K(X) = 0$ while J (X) may be either 0 or 1. It follows from Table 1 that when $Q_1(X) = 1$, the flip-flop X no longer changes over. The negatively directed edge in the signal $\overline{m}7$ (not shown) occurring at the instant $t_{740}$ (see FIG. 4) has no influence on the flip-flop X; the logic 0 remains present.

According to FIG. 2 the connections for the flip-flop Y are as follows:

$T(Y) = Q_2(L_2)$, $J(Y) = Q_1(M_2)$ and $K(Y)$ to ground while the $S_2$ input is connected to the $Q_1$ output of the flipflop X through a differentiating circuit which comprises two resistors $R_4$ and $R_5$ arranged in series between ground and the potential U, and a capacitor $C_3$.

The signals shown in FIG. 5 occur at the inputs of the flip-flop Y at which $T = l2$, $J = m2$, $K = 0$ and $S2 = x'$ (signal $x$ differentiated). Likewise as in the signals associated with the flip-flop X, a few propagation delay times are mentioned.

It follows with the aid of Table 1 for the flip-flop Y that for $K = 0$ and $J = 0$ or 1, the stable state of the flip-flop corresponds to a logic 1 on the $Q_1$ output. At the instant $t_{120} + {}_2t_Q$ an edge $1 \to 0$ appears in the signal $x'$ at the $S_2$ input so that in accordance with the description with reference to Table 1 the $Q_1$ output must assume the logic 0. At the instants $t_{130}$ and $t_{140}$ negatively directed edges occur at the T input neither of which edges influence the state of the flip-flop Y. Particularly at the instant $t_{140} - 1t_Q$ there is shown that for $J = K = 0$ the flip-flop does not change over. At the instant $t_{150} - 1t_Q$, however, $J = 1$, $K = 0$ so that at the instant $t_{150}$ the $Q_1$ output conveys the logic 1. The flip-flop Y remains in this state until an edge $1 \to 0$ active as a trigger edge occurs in the signal $x'$ during a subsequent field period $T_v$.

FIG. 2 shows the NAND gate Z whose inputs are connected in a manner not shown to $Q_2$ (M1) and $Q_2(Y)$. The output of the gate Z thus conveys a signal $z = \overline{y.m1} = y + m1$ which is shown in FIG. 5. Before further describing the generation of the signal $i$ (FIG. 3) including auxiliary pulses occurring at the line frequency and at the double line frequency, the requirements which are imposed on the signals generated by a pulse generator which is suitable for the CCIR standard according to the embodiment shown in FIGS. 1 and 2 will first be dealt with so as to explain certain choices made in accordance with the invention. Already shown are a field synchronizing period of 2.5 $T_H$ (signal $z$) an equalizing and field synchronizing period of 7.5 $T_H$ (signal $y$) and a field blanking period of approximately 20 $T_H$ (signal $x$). In this case it is prescribed that 5 equalizing pulses of the double line frequency must precede and follow 5 field synchronizing pulses of the double line frequency. The duration of the field blanking period in the composite blanking signal must then be 20 $T_H \pm 2 T_H + 1$ line blanking pulse duration. Furthermore, the requirements mentioned in the following Table 3 apply, which requirements are derived from the signals shown in FIG. 3. TABLE 3. (FIG. 3).

CCIR-Standard.

| | |
|---|---|
| Signal $S_{HP}$, line synchronising pulse duration: | $4.7 \pm 0.2$ μs. |
| Signal $S_{EP}$, equalizing pulse duration: | $2.3 \pm 0.1$ μs |
| Signal $S_{VS}$, roster serration duration: | $4.7 \pm 0.2$ μs |
| Signal $S_{HW}$, line blanking pulse | $12.05 \pm 0.25$ μs |
| Front porch = time difference pulse leading edges in signals $S_{HW}$ and $S_{HP}$: | $1.55 \pm 0.25$ μs |

Such a number of requirements may be met in a simple manner by the embodiment of a pulse generator according to the invention shown in FIGS. 1 and 2. Here the recognition becomes manifest to determine the Highest Common Factor (H.C.F.) of the different pulse periods and time differences between the pulse leading edges and to relate the H.C.F. to the smallest pulse repetition period. As a result a few correctly chosen edges of the pulses in the frequency divider stages connected to the clock pulse generator A can determine in a direct manner the pulse edges accurately laid down in the standard in the signals to be generated.

A H.C.F. of the numbers 1.55; 2.3; 4.7 and 12.05 or an approximation thereof is to be found which H.C.F. must be divisible by the smallest pulse repetition period, which is half a line period $1/2 T_H = 32$ μs. The reason thereof is that the smallest pulse repetition period imposes the most stringent requirements on a smooth periodicity in the generation of signals. Starting from the number 32 the H.C.F. must be an integral multiple of the number 2. It follows that the number 0.8 reasonably satisfies as a H.C.F. while finding for the relevant numbers: 1.6; 2.4; 4.8 and 12.0. A period of 0.8 μs and a frequency of 1.25 MHz corresponds thereto for the clock pulse generator A. Other possible values could be 0.4; 0.2; 0.1 .... μs with a frequency of 2.5; 5; 10 .... MHz.

Both in Table 3 and in practice stringent requirements are imposed on the accuracy of the line synchronizing pulse duration in the signal $s_{HP}$ and particularly the equalizing pulse duration in the signal $s_{EP}$. By using the propagation delay time $t_{pd}$ (= $t_Q$ in the Figures) occurring in the JK flip-flops of FIG. 2 and being 70 ns at an average, this time may be deducted from the pulse duration in the generated signals. Table 4 shows the pulse periods prescribed by the CCIR standard and reached in practice in a pulse generator according to the invention.

TABLE 4

| | CCIR Standard | in practice |
|---|---|---|
| $s_{HP}$ | $4.7 \pm 0.2$ μs | 4.73 |
| $s_{HP}$ | $2.3 \pm 0.1$ μs | 2.33 |
| $s_{VS}$ | $4.7 \pm 0.2$ μs | 4.80 |
| $s_{HW}$ | $12.05 \pm 0.25$ μs | 12.00 |
| Front porch | $1.55 \pm 0.25$ μs | 1.00 |

To determine a few pulse edges the signal $i$ is generated which includes auxiliary pulses of line frequency and double line frequency. FIG. 2 shows the JK flip-flop 1 for which the associated signals are shown in FIG. 6.

In FIG. 2 the T input of the flip-flop I is connected to $Q_2(D_2)$ and the K input is connected to $Q_1$ (E2). A $J_1$ input of the J input formed in a twofold manner through an AND gate is connected to the output of a NAND gate $N_1$ whose inputs are connected to $Q_1$ (F) and $Q_1$ (Y) A $J_2$input of flip-flop I is coupled through a differentiating circuit including a resistor $R_6$ to ground and a capacitor $C_4$ to $Q_2(E3)$.

In FIG. 6 the signals $T = \overline{d2}$, $J_1 = \overline{f} + y$ are shown for the flip-flop I, for $J_1 = \overline{f.y} = \overline{f} + \overline{y}$, $J_2 = \overline{e3}'$ and $K = e2$. In the first instance it is assumed that $y = 1$, that is to say, the operation of flip-flop I will be considered outside the equalizing and field synchronizing period of 7.5 $T_H$. The $J_1$ input then conveys the signal $\overline{f}$ (solid lines). The time scale $t_0.....t_{80}$ is derived from the signal $\overline{d2}$. The edges in the signals $\overline{f}$, $\overline{e3}'$ and $e2$ have delay times $4t_Q$, $3t_Q$ and $2t_Q$. Further reference is made to Table 1 for the explanation of the operation of the JK flip-flop I.

At the instant $t_0$ of FIG. 6 the J input has a logic 0 because $J_2=0$. For $K=1$ there applies for the stable state that $Q1 = i = 0$. At the instant $t_3$ a negatively directed edge occurs on the T input. Meanwhile the $J_2$ input as received a logic 1 so that for $J_1 = J_2 = 1 = J$ and $K = o$ there applies that $Q_1$ must assume a logic 1. At the instant $t_3 + {}_1 t_Q$, $Q_1$ has become = 1. The negatively directed edges in the signal $T = \overline{d2}$ at the instants $t_5$, $t_8$ and $t_{10}$ do not result in variations of the flip-flop I because for $K = e2 = 0$ there applies that $Q_1 = i = 1$ is a stable state even when $J_1$ and $J_2$ vary between 0 and 1. At the instant $t_{13}$, however, a trigger edge occurs when K has already previously become $e_2 = 1$. It follows that the flip-flop I must change over which happens at the instant $t_{13} + 1 t_Q$ and at which $Q_1$ has become $i = 0$.

Due to the choice of $K = e2$ with a guaranteed delay time of $2t_Q$ relative to the edges in signal $T = \overline{d2}$, it has been achieved that at the instant $t_{10}$ the flip-flop I certainly cannot change over, while it changes over as soon as possible after the instant $t_{13}$.

Certain requirements are to be imposed on the signal $\overline{e3}'$ for the $J_2$ input. Due to the choice of $\overline{e3}$ it has been achieved by the delay time 3 $t_Q$ after the instant $t_0$ that the flip-flop I at the instant $t_0$ is certainly not changed over. The differentiated pulse in signal $\overline{e3}'$, which pulse is shown in a flattened manner and which may extend without any consequence to well above the value indicated by the logic 1, must not stop before the instant $t_2$, for the predominant logic 1 is to occur between the instants $t_2$ and $t_3$ when $T = \overline{d2} = 1$. Before the instant $t_{15}$ the pulse in signal $\overline{e3}'$ must have disappeared so as to avoid the predominant influence after the instant $t_{15}$. The pulse in the signal $\overline{e3}'$ may thus vary between the broken lines in FIG. 6.

At the instant $t_{20}$ a negatively directed pulse in the signal $J_2 = \overline{e3}$ occurs, which signal continues to represent the logic 0 and which does not exert influence on the action of a flip-flop I.

Shortly after the instant $t_{40}$ a following pulse occurs in the signal $J_2 = \overline{e3}'$. However, the signal $\overline{f}$ at the $J_1$ input has the logic 0 so that for $J = 0$ and $K = O$ or 1 there applies that $Q_1 = i = 0$ is the stable state.

The action of the flip-flop I in FIG. 2 during the equalizing and field synchronizing period of 7.5 $T_H$ may be explained by way of a combined consideration of FIGS. 6 and 7.

In FIG. 7a the signal y is shown in relation to the field time scale $t_{100}$ ..... $t_{1350}$ given in FIG. 4. FIGS. 7b and 7c apply for two successive fields, while FIG. 7b applies for a field ending at a half line and FIG. 7c for a field ending at a full line. The signal f and for the flip-flop I the signals $J_1 = \bar{f} + \bar{y}$, $J_2 = \bar{e}3'$ and $Q_1 = i$ are shown. The negatively directed pulses without any influence in the signal $J_2 = \bar{e}3'$ of FIG. 6 have been omitted in FIGS. 7b and 7c for the sale of simplicity.

For FIG. 7b there applies that the instant $t_{120}$ corresponds to the instant $t_{40} + 5t_Q$ in FIG. 6. In FIG. 6 it has already been explained what happens before the instant $t_{120}$ in FIG. 6b. At the instant $t_{120} + 3t_Q$ in FIG. 7b, which is the instant $t_{40} + 8\ t_Q$ in FIG. 6, the edge occurs which is shown in a broken line in FIG. 6. In the same manner as described in FIG. 6 for the pulse in signal $Q_1 = i$ occurring between the instants $t_3 + 1t_Q$ and $t_{13} + 1t_Q$, a pulse shown in a broken line is generated in the signal $Q_1 = i$ between the instants $t_{43} + 1t_Q$ and $t_{53} + 1t_Q$. It is found that during the 7.5 $T_H$ period the pulses in the signal i are generated atvthe double line frequency. All this has also been shown for the signal i in FIG. 3.

After the description of FIG. 7b, FIG. 7c is self-evident.

The influence of the auxiliary pulses in the signal i is found in a simple manner with reference to the description of the action of the JK flip-flop W in FIG. 2. the signals for the flip-flop W which as a signal generator must provide the signal with a series of line and field blanking pulses are shown in FIG. 8. FIG. 8a shows the signals which are the same for each field and FIGS. 8b and 8c show in accordance with FIGS. 7b and 7c the signals which are different for successive fields.

In FIG. 2 the connections of the inputs of the flip-flop W are as follows:

T (W) = $Q_1$(D3), $J_1$(W) $Q_1$ (E3) $J_2$ (W) = $Q_1$ (X) and K(W) = $Q_1$ (I).

In FIG. 8a the signal T = d3 is partially indicated on two scales which are both derived from the time scale $t_0$ ...... $t_{80}$ and which relative thereto have a delay time of $1t_Q$ which is left out of consideration in FIG. 8. For the two-fold J input having an AND gate function the signal J follows from the signals $J_1 = e3$ with delay time $3t_Q$ and $J_2 = x$ with delay time $7t_Q$.

In FIG. 8b the signal K = i is shown for one field in relation to FIG. 8a. The period denoted by 7.5 $T_H$ ($y = 0$) is considered to end during the period of the time axis being shown interrupted. At the instant $t_2$ a negatively directed edge occurs in the signal T = d3. In that case J = K = 0 so that in accordance with Table 1 the flip-flop W does not change over. If prior to the instant $t_2$ it were allowed that J varies between 0 and 1, while as a result thereof the flip-flop W should not change over even once, then it follows from Table 1 that at this stable state the $Q_1$ output must have the logic 1. This is the starting point.

At the instant $t_7$ a subsequent negatively directed edge occurs in the signal T = $d_3$. Meanwhile the signal K = i has received the logic 1 at the instant $t_3$ so that for J = 0, K = 1, the flip-flop W changes over the $Q_1 = w$ changes from the logic 1 to the logic 0. A negatively directed edge in the signal T = d3 at the instant $t_{12}$ does not exert influence on the flip-flop W. At the instant $t_{13}$ the signal K = i changes back from the logic 1 to the logic 0. A negatively directed edge occurring at the instant $t_{17}$ in the signal T = $d_3$ has for J = 0 and K = 0 no influence on the flip-flop W. At the instant $t_{20}$ the signal $J_1 = e3$ receives the logic 1 and hence the signal J. At the negatively directed edge occurring at the instant $t_{22}$ in the signal T = $d_3$ there applies that J = 1, K = 0 whereafter the $Q_1$ output must start to convey the logic 1. In that case J may change between 0 and 1 for K = 0 without the negatively directed edges in the signal T = $d_3$ causing the flip-flop W to change over. This state was taken as a starting point.

In FIG. 8b the reference $s_{HW}$ indicates a second pulse following the described pulse in the signal $Q_1 = w$ which second pulse is also generated in the manner described.

The generation of the pulse in the signal $Q_1 = w$ and denoted by the reference $s_{HW}$ follows in the same manner for the signal K = i shown in FIG. 8c. To emphasize the fact that FIG. 8c is shifted relative to 8b over half a line period $T_{H/2}$, a few instants $t_{40}$,..... $t_{80} = t_0$,....... $t_7$,.....$t_{22}$ have been indicated.

The auxiliary pulses in the signal i occurring at the line frequency determine in one field or in the other field approximately the position of the line blanking pulses $s_{HW}$ to be generated in the signal w according to FIGS. 8b and 8c. The exact position of the edges of the line blanking pulses $s_{HW}$ in the signal w are determined by the trigger edges in the signal $d_3$. In FIG. 3 the instants $t_7 + 2t_Q$ and $t_{22} + 2t_Q$ are shown for the signal $s_{HW}$ for the edges. The line blanking pulses in the signal $s_{HW}$ are found to have a pulse duration of $15 \times 0.8\ \mu s = \mu s$ and fall within the limits imposed by the CCIR standard. (Tables 3 and 4)

In FIG. 8a an instant $t_{40}$ is indicated in the signal $J_1 =$ e3 with the signal having the logic 0 at the instant $t_{40} + 3t_Q$ which value becomes manifest in the signal J. At the instant $t_{40} + 7t_Q$ the logic 0 occurs in the signal $J_2 = x$ from which instant the period $20T_H$ begins. What has been described with reference to the instants $t_2$ and $t_7$ now applies for the instants $t_{42}$ and $t_{47}$ because in the signal K = i of FIG. 8b the first auxiliary pulses occurring at the double line frequency begins at the instant $t_{43}$. The previous auxiliary pulse in the signal K = i is then considered to be the last pulse normally occurring at the line frequency.

With respect to FIG. 8c there applies that the first auxiliary pulse in the signal K = i after the instant when $J_2 = x$ receives the logic 0 appears as the last pulse occurring normally at the line frequency.

After the logic 0 has been obtained in the signal $Q_1 =$ w the signal J of FIG. 8a is found to maintain the logic 0 during a period of approximately 20 $T_H$ while K changes between 0 and 1. It is found from Table 1 that the signal $Q_1 = w$ of FIGS. 8b and 8c maintains the logic 0 because this represents the stable state.

The flip-flop W changes over at the first negatively directed edge in the signal T = d3 after the signal J receives the logic 1 under the influence of the signal $J_1$ = e3. The subsequent occurrence of an auxiliary pulse in signal K = i of FIGS. 8b or 8c provides the opportunity for some negatively directed edges in the signal T = d3 of FIG. 8c to cause the line blanking pulses $s_{HW}$ to be generated by the flip-flop W. The flip-flop W generates a field blanking pulse at a duration of 20 $T_H$ plus one line blanking pulse duration ($t_{22} - t_7$ and $t_{62} - t_{47}$).

The JK flip-flop P of FIG. 2 generates a signal $Q_1 = p$ shown in FIG. 9, which includes a series of line synchronizing pulses $s_{HP}$, equalizing pulses $s_{EP}$ and field synchronizing pulses $s_{VP}$. The number of field synchronizing pulses $s_{VP}$ is constituted by a single long field pulse which is cut into pieces by means of the said raster serrations $s_{VS}$.

The flip-flop P deviates from the type (FCJ 121) described so far and is a JK flip-flop of the type FCJ 201 which is formed with three J and K inputs having and AND gate function on which a trigger action may be performed.

The connections of the flip-flop P (in FIG. 2) are as follows: T (P) = $Q_2$ (D1), J1(P) = $Q_1$ (E1), $J_2$(P) = $Q_2$ (D3), $J_3$(P) = $Q_1$ (I) and $K_1$(P) = $Q_1$(E2). The input $K_2$ (P) is connected to the output of a NAND gate N2 with $Q_1$ (I) and $Q_1$ (Y) being connected to inputs thereof. The input $K_3$ (P) is connected to the output of the NAND gate Z. The input $S_2$ (P) is coupled to $Q_2$(I) through a differentiating circuit including a capacitor $C_5$ and two resistors $R_7$ and $R_8$ arranged in series between the potential U and ground.

In addition to the Table 1 for the trigger action on the input T(P) and the description given with reference thereto a Table 5 also applies for the JK flip-flop P of the type FCJ 201 in which Table for T(P) = 1 a trigger action on the J and/or K-input may be performed in case of a transition from the logic 1 to the logic 0.

Table 5.

| J | K | $Q_1$ | $Q_2$ |
|---|---|---|---|
| | | | For T = 1. |
| 1 → 0 | 0 or 1 | 1 | 0 |
| 0 or 1 | 1 → 0 | 0 | 1 |
| 1 → 0 | 1 → 0 | $Q_1$ changes over | $Q_2$ changes over |

The influence of the input signals according to FIG. 9 may be explained with the aid of Tables 1 and 5.

FIG. 9 relates to 19 half line periods $T_H/2$ occurring in and near the equalizing and field synchronizing period. The periods of time 1, 2, 3, 4; 7, 8, 9; 12, 13 and 17, 18, 19 are shown for the numbered half line periods. Only the first 16 × 0.8 $\mu$s = 12.8 $\mu$s are shown for each half line period $T_H/2$ of 32 $\mu$s. The time axis in the signal $J_1 = e1$ is interrupted after the instant $t_{16}$ so as to show that the signal has the same periodical character after this instant. The time axis in the signal $J_3 = i$ is shown in a broken line after the instant $t_{16}$ so as to show that the signal can occur once at a maximum during one of the periods of time 1......19, considering the fact that the signal $i$ has pulses of line frequency and double line frequency. The signal $J_2 = \bar{d}3$ is shown near the signal J so as to emphasize that the signals $J_1 = e1$ and $J_3 = i$ exert an inaccurate place-determining influence while an edge in the signal $J_2 = \bar{d}3$ has an accuracy-determining influence. Due to the periodicity of the two television fields the time scale $t_0,......t_{40},,,,t_{80} = t_0$ given with signal J may alternatively be considered as $t_{40}.....t_{80} = t_0.....t_{40}$.

The signal $K_3 = z$ is shown in an uninterrupted manner so as to clarify that it includes a pulse of field frequency which has the logic 0 during the periods of time 8.....12 (2.5 $T_H$). In the signal $K_2 = \bar{i} \cdot \bar{y} = \bar{i} + \bar{y}$ the same applies for the periods of time 3.....17 (7.5 $T_H$) in which the signal $\bar{y}$ has the logic 1. The total signal K is constituted through an AND function together with the signal $K_1 = e2$.

Analogously to the signal $J_3 = i$, signal $S_2 = \bar{i}'$ (signal $i$ differentiated is shown. The signal T = $\bar{d}1$ and the signal $S_2 = \bar{i}'$ may be found to have an accuracy-determining influence while the signal K only has a choice influence.

During the periods of time 1, 2 and 18, 19 the signals $J_3 = i$ and J, $K_2 = \bar{i} + \bar{y}$ and K, and the signal $S_2 = \bar{i}'$ are shown with portions consisting of broken lines and chain-link lines as well as the portions in the signal $Q_1 = p$ resulting therefrom due to the action of the flip-flop P. The reason thereof resides in the periodicity of the two television fields. The chain-link line portion in the periods of time 1, 2 and 18, 19 is associated with the field which ends with a full line prior to the equalizing and field synchronizing period, as has been described with reference to FIGS. 7c and 8c. The broken line portion corresponds to the state described with reference to FIGS. 7b and 8b.

The consideration of the period of time 1 with the chain-link line portion in the signals of FIG. 9 leads to the following: around the instant $t_0$, J = 0 and K may have the logic 1 or 0. It follows from Table 1 that for the stable state of flip-flop P the requirement is that $Q_1$ has the logic 0. It follows from Table 5 that with a variation of K from 1 to 0 for T = 1, the stable state also occurs for $Q_1 = 0$. It is found that without a variation in J the flip-flop P cannot change over.

At the instant $t_3$ the logic 1 occurs in the signal $J_3 = i$, whereafter the signal $J_1 = e1$ follows at the instant $t_5$. The result is that a logic 1 in the signal $J_2 = \bar{d}3$ becomes manifest between the instants $t_7$ and $t_9$ in the signal J. At the instant $t_9$ an edge going from the logic 1 to 0 occurs in the signal J while at the same time the signal T = $\bar{d}1$ has the value 1. It follows from Table 5 that the flip-flop P will change over because the signal $Q_1 = p$ must assume the logic 1.

The reset pulse at the instant $t_3$ occurring in signals $S_2 = \bar{i}'$ does not exert any influence because the signal $Q_1 = p$ has the logic 0 at $t_3$.

After the instant $t_9$ the signal K may exert influence on the flip-flop P. At the instant $t_{13}$ the signal K assumes the logic 1 under the influence of the then occurring logic 1 in the signal $K_2 = \bar{i} + \bar{y}$.

After the instant $t_9$ two negatively directed edges occur in the signal T = d1, the instant $t_{12}$ being denoted at the second edge. At the instant $t_{12}$ there applies that J = K = 0 so that it follows from Table 1 that the flip-flop P does not change over. The subsequent negatively directed edge in the signal T = $\bar{d}1$ occurs at the instant $t_{15}$. Now, however, J = 0 and K = 1 so that according to Table 1 the output $Q_1$ (P) must convey the logic 0 so that the flip-flop P changes over at the instant $t_{15}$.

During the rest of the period of time 1 and the entire period of time 2, J remains 0 which follows from the chain-link line portion in the signal $J_3 = i$. As a result the flip-flop P remains in the same state as has been shown at the instant $t_0$.

Comparison of FIGS. 3 and 9 shows that the periods of time 1 and 2 in FIG. 9 correspond to the 2 half line periods $T_H/2$ of FIG. 3. The signal $s_{HP}$ in FIG. 3 corresponds to the pulse $s_{HP}$ in FIG. 9. It is found from FIG. 9 that a trigger edge in the signal $J_2 = \bar{d}3$ (having a delay time of $1t_Q$ relative to the time scale $t_0......t_{80}$) determines the leading edge of the pulse $s_{HP}$ while the trailing edge is determined by the trigger edge in the signal T = $\bar{d}1$ (without delay time relative to the time scale $t_0.....t_{80}$). The result is shown in FIG. 3 in which the leading edge in the signal $s_{HP}$ is located at the instant $t_9 + 2\ t_Q$ while the trailing edge is located at the instant $t_{15} + 1t_Q$. The line synchronizing pulse $s_{HP}$ therefore has an accurately determined pulse duration of 6 × 0.8 $\mu$s minus approximately 70 ns, that is to say, 4.73 $\mu$s.

What has been described for the period of time 1 in FIG. 9 likewise applies to the period of time 2 for the signals which are shown by means of broken lines so that a detailed description is omitted.

It is to be noted that the signal $J_3 = i$ has a keying function for generating or not generating line synchronzing pulse $s_{HP}$ during half a line period. The presence of the signal $i$ in the signal $K_2 = \bar{i} + \bar{y}$ becomes manifest in the signal K by giving an edge at the instant $t_{13}$ instead of an edge at $t_{10}$ under the influence of $K_2 = e2$. The edge in the signal K occurring at the instant $t_{10}$ does not exert any influence on the generation of the pulses $s_{HP}$ occurring at the line frequency.

During the periods of time 3....17 of FIG. 9 constituting the equalizing and field synchronizing period (7.5 $T_H$) the auxiliary pulses occur each period of time in the signal $J_3 = i$ and then provide in signal J the pulse keyed from the signal $J_2 = \bar{d}3$. The signal K is determined in the periods of time 3.....7 and 13.....17 by the signal $K_1 = e2$ because only the component $y = 1$ becomes manifest in the signal $K_2 = i + \bar{y}$. During the periods of time 8........12 (the field synchronizing period of 2.5 $T_H$) the signal $K_3 = z = 0$ is predominant in the signal K.

Analogously as described with reference to the period of time 1, the flip-flop P changes over during the period of time 3 at the instant $t_9$. Subsequently, at the instant $t_{10}$, a negatively directed edge occurs in the signal $T = \bar{d}1$. At the instant $t_{10}$ the signal K still has the logic 0 whereafter it obtains the logic 1 at the instant $t_{10} + 2t_Q$ due to the signal $K_1 = e2$. The subsequent negatively directed edge in the signal $T = \bar{d}1$ at the instant $t_{12}$ causes the flip-flop P to change over. The same is effected during the periods of time 4.....7 and 13.....17. The result is that the equalizing pulses $s_{EP}$ is generated in the signal $Q_1 = p$. The edges of the equalizing pulse $s_{EP}$ are determined in the same manner as those in the line synchronizing pulse $s_{HP}$. In FIG. 3 two equalizing pulses occurring at double the line frequency are shown in signal $s_{EP}$. The pulse duration of the first pulse ranges from $t_9 + 2t_Q$ to $t_{12} + 1t_Q$, that is to say, $3 \times 0.8$ μs minus approximately 70 ns makes 2.33 μs which value also applies to the other pulse.

During the period of time 8 of FIG. 9 the flip-flop P changes over at the instant $t_9$ analogously as described with reference to the period of time 1. The signal $K_3 = z$ results in the signal K having the logic 0 during the periods of time 8......12. It follows from the foregoing that consequently the signal K during these periods of time does not exert influence on the state of the flip-flop P. From the instant $t_9$ the signal $Q_1 = p$ continues to convey the logic 1 throughout the period of time 8 and even up to the period of time 9.

During the period of time 9 a reset pulse going from the logic 1 to 0 occurs at the instant $t_3$ in the signal $S_2 = \bar{i}'$. It follows from Table 1 that this reset pulse gives the output $Q_1(P)$ the logic 0. Subsequently the signal J results in a change-over of the flip-flop P at the instant $t_9$. The same is repeated in the periods of time 10, 11 and 12. A pulse generated in this manner in the signal $Q_1 = p$ is denoted by $s_{VS}$. The pulse $s_{VS}$ occurring at the double line frequency and being denoted at a raster serration has its leading edge at the instant $t_3$ determined by the signal $i$ and its trailing edge at the instant $t_9$ is determined by the signal $\bar{d}3$. In FIG. 3 the instants $t_3 + 2t_Q$ and $t_9 + 2 t_Q$ are denoted in the signal $s_{VS}$ and the pulse duration is $6 \times 0.8$ μs $= 4.8$ μs.

During the period of time 13 of FIG. 9 the flip-flop P is reset to the input $S_2$ (P) of FIG. 2 at the instant $t_3$ whereafter the equalizing pulses are generated during the periods of time 13.....17 as described with reference to the periods of time 3....7.

It is to be noted that during the period of time 13 an edge $1 \rightarrow 0$ occurs at the instant $t_0 + 2t_Q$ in the signal $K_1 = e2$. Subsequently, an edge $0 \rightarrow 1$ occurs at the instant $t_0 + 5t_Q$ in the signal $K_3 = z$. The result is that the signal K certainly maintains the logic 0 until the instant $t_{10} + 2t_Q$. This result has been achieved by the choice that the $K_1$ and $K_3$ inputs of the flip-flop P are connected to the flip-flop E2 and through the NAND gate Z to the flip-flop M1 each hacing a different added propagation delay time ($2t_Q$ relative to $5t_Q$). This added propagation delay time depends on the sequential number of the JK flip-flop calculated relative to the clock pulse generator A or, considering the introduced time scale of line frequency, relative to the flip-flops D1 and D2. Such a choice ensuring satisfactory operation has also been made for other connections in the pulse generator according to FIG. 2 such as has been described with reference to FIG. 6 at the instant $t_{10}$ for the flip-flop J with K (J) $= Q_1$ (E2) (delay time $2t_Q$) and T(J) $= Q_2$ (D2) (no delay time).

The description of the periods of time 18 and 19 corresponds to that of the periods of time 2 and 1, respectively, so that this description is omitted.

In the pulse series generated by the flip-flops P and W of FIG. 2 the line synchronizing pulse in one series occurs inter alia in the signal $s_{HP}$ of FIG. 3 and the line blanking pulse in the other series occurs in the signal $s_{HW}$ of FIG. 3.

The front porch is the time difference between the instants when the leading edges of the pulses occur in the signals $s_{HW}$ and $s_{HP}$, that is to say, between $t_9 + 2 t_Q$ and $t_7 + 2t_Q$ which is a time difference of $2 \times 0.8$ μs $= 1.6$ μs.

It is found that pulse series can be generated with the pulse generator according to FIGS. 1 and 2 which series include pulses of different duration and having a determined time difference between the series which satisfy the limits given in Table 4 for the CCIR standard.

In FIG. 1 the phase discriminator B is shown for synchronizing the clock pulse generator A at the line frequency. The 5-to-1 dividers and the 125-to-1 dividers L and M may be synchronized at the field frequency by the external field synchronizing signal $s_{VES}$ if this is present. In FIG. 2, a synchronizing circuit is shown in detail for the signal $s_{VES}$ which will be described in combination with the signals given in FIG. 4.

The external field synchronizing signal $s_{VES}$ is applied through an isolating capacitor $C_6$ and a resistor $R_9$ in series to the base electrode of an npn-transistor $T_2$, which base electrode is connected through a resistor $R_{10}$ to the potential U. The base electrode of a second npn-transistor $T_3$ is connected to the collector electrode of the transistor $T_2$ while the two emitter electrodes are connected to ground. The collector electrode of transistor $T_3$ is directly connected to the $S_2$ inputs of the flip-flops L1....L3, M3.....M7 and is indirectly connected through the diode $T_1$ to the inputs of the flip-flops M1 and M2. The collector electrode of transistor $T_2$ is connected to ground through a capacitor $C_7$ and to the output of a NAND gate $N_3$ through a resistor $R_{11}$. The inputs of the gate $N_3$ receive the signals $\overline{m}1$ and $\bar{y}$ so that the output conveys a potential corresponding to the signal z of FIG. 4.

Starting from the assumption that the supply for the synchronizing circuit ($T_2$, $T_3$) is provided through the gate $N_3$ and that the signal $s_{VES}$ is absent or that no synchronizing pulse occurs in the signal $s_{VES}$, the transistor $T_2$ is conducting. Approximately the ground potential is impressed on the base electrode of the transistor $T_3$ so that transistor $T_3$ is cut off. The $S_2$ inputs of the flip-flops L1......L3, M1.....M7 convey the logic 1 due to internal couplings and due to the resistor $R_2$ being connected to potential U.

If in the presence of the supply through the gate $N_3$ a negatively directed edge of a synchronizing pulse occurs in the signal $s_{VES}$, the transistor $T_2$ is cut off while transistor $T_3$ becomes conducting so that the ground potential occurs at its collector electrode. As a result a pulse going from the logic 1 to the logic 0 occurs at the $S_2$ inputs of the flip-flops L1....L3, M1......M7. The result is that all $Q_1$ outputs of the flip-flops L1......L3, M1.......M7 should convey the logic 0. A consideration of the signal $s_{VES}$ in relation to the signals l1.....l3, m1.......m7 of FIG. 4 leads to the conclusion that the negatively directed resetting edge in the signal $s_{VES}$ can only occur between the instants $t_{136}$ and $t_{138}$ without exerting influence, which corresponds to the synchronized state. If the resetting edge occurs in the signal $s_{VES}$ beyond the instants $t_{136}$ and $t_{138}$, the circuit of frequency dividers including the flip-flops L1......L3, M1......M7 is brought in the said synchronized state. The time difference between the instants $t_{136}$ and $t_{138}$ corresponds to a half line period within which the synchronisation is ensured by the phase discriminator B of FIG. 1.

The supply of the transistor $T_2$ through the gate $N_3$ whereby the signal z of FIG. 4 is impressed on the collector electrode results in the supply dropping out during the period between the instants $t_{130}$ and $t_{140}$ in the synchronized state of the circuit of frequency dividers including flip-flops L1.....L3, M1....M7. The transistor $T_3$ of FIG. 2 then remains cut off, even when the resetting edge occurs in the signal $s_{VES}$. It has been achieved that in the synchronized state the then superfluous signal $s_{VES}$ does not result in needless switching on the $S_2$ inputs of the flip-flops $L_1$....$L_3$, M1....M7 and through the resistor $R_2$ on potential U.

In a practical embodiment the pulse generator of FIG. 2 is formed as follows:

In a twofold JK flip-flop of the type FCJ 121 the combinations: D1-D2, D3-E1, E2-E3, F-I, L1-L2, L3-W, M1-M2, M3-M4, M5-M6, X-Y; M7 ½ FCJ 121. A JK flip-flop of the type FCJ 201 for P. A fourfold NAND gate of the type FCH 191 for the gates Z, $N_1$, $N_2$ and $N_3$. A diode BAX 13 for $T_1$. Two transistors BSY 39 for $T_2$ and $T_3$. A potential U of + 6V.

$R_1, R_4, R_7 = 2.2\ k\ \Omega$
$R_2, R_5, R_8 = 3.9\ k\ \Omega$
$R_3, R_6 = 1\ k\ \Omega$
$R_9 = 330\ \Omega$
$R_{10} = 10\ k\ \Omega$
$R_{11} = 4.7\ k\ \Omega$
$C_1, C_5, C_6 = 1$ nF.
$C_2, C_3 = 2.2$ nF
$C_4 = 4.7$ nF
$C_7 = 10$ nF.

In the combination of the flip-flops X and Y it is noted that the $S_2$ input which is common for both flip-flops influences with the signal $x'$ the action of Y but not the action of the flip-flop X, which may be derived from FIG. 5.

It will be evident that the invention is not restricted to the embodiment of a pulse generator suitable for the CCIR standard and shown in FIGS. 1 and 2. The H.C.F. of the pulse periods in and the time differences between the synchronizing and blanking signals in relation to a half line period may be determined for any other television standard. The connections for the generator I of the auxiliary pulses of line frequency and double line frequency may be chosen in a simple manner dependent on the desired pulse period with its keying influence.

FIG. 10 shows a PAL chrominance subcarrier gating signal generator formed with five JK flip-flops denoted by the references $FF_1$ to $FF_5$. Arrow heads are shown for a few T, J, K and $S_2$ inputs of the flip-flops $FF_1$.....$FF_5$ on which a trigger action is performed. For some inputs of the flip-flops $FF_1$.....$FF_5$ signals are shown which occur in the pulse generator which is shown in detail in a block-schematic diagram in FIGS. 1 and 2. These signals are derived from the circuits of frequency dividers (D, E, F or L, M) dividing to the line or field frequency, the pulse generators I and Y and the clock pulse generator A. The time relation between the different signals follows from the time diagrams given in FIGS. 3 to 7. The flip-flops $FF_1$ and $FF_2$ of FIG. 10 will be described in combination with the signals shown in FIG. 11 after the commencing instant $t_0$ of a line period $T_H$. As indicated in FIG. 11, the starting point in this case is the state at which the $S_2$ input of the flip-flop $FF_1$ has the logic 1 ($S_2 = 1$).

The signal $\bar{i}$ is applied through a capacitor $C_8$ to the J-input of the flip-flop $FF_1$ coupled to ground through a resistor $R_{12}$. The capacitor $C_8$ and the resistor $R_{12}$ constitute a differentiating circuit whose action follows from the signal $J = \bar{i}'$ shown in FIG. 11. The connected K input which is further not shown has the logic 1 (K = 1) due to internal couplings. The T input of the flip-flop $FF_1$ receives the signal $d1$.

With the aid of Table 1 regarding the action of a JK flip-flop, the signal $Q_2$ of FIG. 11 follows at the output $Q_2$ ($FF_1$). For J = 0 and K = 1 it follows that $Q_2 = 1$ provides the stable state of the flip-flop $FF_1$. A negatively directed edge in the signal $J = \bar{i}'$ at the instant $t_3$ does not have any influence, the logic 0 remains present. After the instant $t_{13}$ a positively directed edge occurs at a propagation delay time of $1t_Q$ in the signal $J = \bar{i}'$. The logic 1 occurs in the signal $J = \bar{i}'$ until after the instant $t_{15}$ when the signal $T = d1$ has an edge $0 \rightarrow 1$. At the instant $t_{16}$, with an edge $1 \rightarrow 0$ in the signal $T = d1$, there consequently applies that $J = K = 1$ so that the flip-flop $FF_1$ must change over. (Table 1). At the instant $t_{16} + 1\ t_Q$ the signal $Q_2$ has the logic 0. In the signal $T = d1$ a subsequent negatively directed edge occurs at the instant $t_{18}$ for which applies that K = 1 and J = 0 or 1. It follows from Table 1 in both cases that the flip-flop $FF_1$ changes over again. The signal $J = \bar{i}'$ is accompanied by the tolerance within which the trailing edge of the possibility directed pulse should be located, namely from and including the instant $t_{15}$ up to before the instant $t_{20}$. Negatively directed edges in the signal $T = d1$ occurring after the instant $t_{20}$ therefore do not exert influence on the flip-flop $FF_1$. A pulse having the logic 1 appears at the $Q_2$ output of the flip-flop $FF_1$ between instants $t_{16} + 1\ t_Q$ and $t_{18} + 1t_Q$.

The $Q_2$ output of flip-flop $FF_1$ is connected to the $S_2$ input of the flip-flop $FF_2$. The input $T(FF_2)$ receives the signal $a$. The K input is connected to ground and the J input is floating so that K = 0, J = 1. For J = 1, K = 0 it follows from Table 1 that $Q_1 = 1$ and $Q_2 = 0$ is the stable state of the flip-flop $FF_2$ before the signal $Q_2$ of flip-flop $FF_1$ exerts a trigger action at the instant $t_{16} + 1t_Q$ on the input $S_2(FF_2)$. As a result the output $Q_1(FF_2)$ obtains the logic 0 at the instant $t_{16} + 2t_Q$. During the pulse in the signal $Q_2$ of the flip-flop $FF_1$ the signal $T = a$ does not exert influence on the flip-flop $FF_2$, but the first occurring negatively directed edge at the instant $t_{19} - 1t_Q$ causes the flip-flop $FF_2$ to change over to the stable state. The output $Q_1$ ($FF_2$) therefore conveys a signal having a pulse ranging from the instant $t_{16} + 2t_Q$ to $t_{19}$ which is indicated by means of signal $Q_1 = s_{CC}$ in FIG. 11.

The signal $s_{CC}$ generated by means of the flip-flops $FF_1$ and $FF_2$ has a duration of $(t_{19} - t_{16}) - 2t_Q = 3 \times 0.8$ $\mu s - 2 \times 70$ ns $= 2.26$ $\mu s$. The leading edge at the instant $t_{16} + 2 t_Q$ is located $7 \times 0.8$ $\mu s = 5.6$ $\mu s$ later relative to the leading edge of the line synchronizing pulse $s_{HP}$ shown in FIG. 3 (occurring at the instant $t_9 + 2t_Q$). The signal $s_{CC}$ is therefore the chrominance subcarrier gating signal described in the PAL standard which must start 5.6 $\mu s$ after the leading edge of the line synchronizing pulse and has a duration of 10 periods of the chrominance subcarrier signal at a frequency of 4 433 618.75 Hz being 2.26 $\mu s$. The PAL gating signal $s_{CC}$ generated by the flip-flops $FF_1$ and $FF_2$ may be applied to a gating circuit (not shown) another input of which may be connected to a chrominance subcarrier oscillator.

Without further steps a gating signal generator including only the flip-flops $FF_1$ and $FF_2$ would generate a gating pulse for each line period $T_H$ in the signal $s_{CC}$. However, the PAL standard stipulates that the gating pulse must not occur over a duration of nine line periods around the equalizing and field synchronizing period. The instant of beginning and ending of this blocking duration is different for successive fields and has a cycle of four field periods. This cycle will become clearly apparent from the following description. The action of the flip-flops $FF_1$ and $FF_2$ may be blocked by applying the required blocking pulse with the logic 0 to the $S_2$ input of the flip-flop $FF_1$. During the pulse duration (logic 0) of the blocking signal indicated by a signal $s_C$ at the input $S_2$ ($FF_1$) the output $Q_2(FF_1)$ maintains the logic 1 as well as $Q_1(FF_2)$.

The PAL blocking signal signal $s_C$ is generated at the $Q_1$ output of the flip-flop $FF_3$. The flip-flop $FF_3$ is of the type using multiple formed command J and K inputs. The inputs $J_1$ and $K_3$ receive the signals $y$ and $\overline{12}$, respectively, of FIG. 4. The $J_2$ and $J_3$ inputs of the flip-flop $FF_3$ are connected to the $Q_2$ outputs of the flip-flops $FF_4$ and $FF_5$, respectively. The $K_1$ and $K_2$ inputs of the flip-flop $FF_3$ are connected to the $Q_1$ outputs of the flip-flops $FF_4$ and $FF_5$, respectively. The flip-flops $FF_4$ and $FF_5$ serve for generating auxiliary pulses for the flip-flop $FF_3$ and all three flip-flops combined constitute a blocking signal generator ($FF_3$, $FF_4$, $FF_5$). The interconnected J and K inputs of the flip-flop $FF_4$ receive the signal $\bar{f}$ and the T input receiver the signal $i$. The input T ($FF_5$) receives the signal $m1$. The input J ($FF_5$) is connected to ground through a resistor $R_{13}$ and receives the signal $\overline{m7}$ ($\overline{m7}'$) through a capacitor $C_9$, which signal is differentiated.

In FIG. 12 the signals are shown for the flip-flop $FF_4$ around the commencement of an equalizing and field synchronizing period. This is apparent from a comparison of the signal $T = i$ with the signals of FIG. 7, particularly of FIG. 7c. For the signal $J = K = \bar{f}$ with the logic 1 it follows from Table 1 that the negatively directed edge in the signal $T = i$ which is active as a trigger edge at the periodically occurring instants $t_{13}$ causes the flip-flop $FF_4$ to change over. An edge $1 \rightarrow 0$ in the signal $T = i$ when $J = K = \bar{f}$ has the logic 0 has no influence as is shown in FIG. 12 at the instant $t_{53}$. The signal $J = K = \bar{f}$ has a keying function while the signal $T = i$ gives exactly the instants of the edges. The flip-flop $FF_4$ which is active as an auxiliary pulse generator generates an auxiliary signal $Q_1 = ff_4$ shown in FIG. 12, which signal is a blocking signal of half the line frequency.

In FIG. 12 the signals for the flip-flop $FF_5$ are shown after the instant of commencement $t_{100}$ of a field period $T_V$. The signals $T = m1$ and $J = \overline{m7}'$ follow from FIG. 4. At the instant $t_{100}$ a positively directed edge $0 \rightarrow 1$ occurs in the signal $T = m1$. Subsequently, an edge $0 \rightarrow 1$ occurs at a time difference of $6t_Q$ in the signal $J = \overline{m7}'$. As has been described with reference to the flip-flop X in FIG. 5 for K (X) = $\overline{m7}'$, the result is that due to the negatively directed edge $1 \rightarrow 0$ in the signal $T = m1$ at the instant $t_{110}$ the flip-flop $FF_5$ changes over because $J = K = 1$. After the instant $t_{110}$ there applies that $J = 0$ and $K = 1$ so that the next edge $1 \rightarrow 0$ causes the flip-flop $FF_5$ to change over to its stable state at the instant $t_{130}$ in the signal $t = m1$. The flip-flop $FF_5$ generates a signal $Q_1 = ff_5$ which shows a pulse at the field frequency between the instants $t_{110}$ and $t_{130}$ ($+1t$ propagation delay time).

The operation of the flip-flop $FF_3$ follows from the time diagrams of FIG. 13. In FIG. 13 the beginning of a field period $T_V$ is shown from the instant $t_{100}$ during fourteen line periods $T_H$. For the signal $K_3 = \overline{12}$ a few periodically occurring instants $t_0....t_{80} = t_0 .... t_{40}.......$etc of the line frequency time scale are shown. A delay time of $4t_Q$ relative to this time scale is not shown, but the delay of $2t_Q$ of the edges in the signal $K_2 = ff_5$ is shown relative to that in the signal $K_3 = \overline{12}$. In the signals $J_1 = y$ and $J_3 = \overline{ff_5}$ the edges of the pulses occurring at the field frequency are also shown.

For the 625-line standard employing interlacing there applies that a field period $T_V$ corresponds to 312.5 line periods $T_H$. The signal $K_3 = \overline{12}$ has a period of 2.5 $T_H$ so that in each field period $T_V$ 312.5/2.5 = 125 periods of the signal $K_3 = \overline{12}$ occur. In FIG. 12 the auxiliary signal $Q_1 = ff_4$ is shown for the flip-flop $FF_4$ as a blocking signal having a period which is equal to two line periods $T_H$. In a field period $T_V$ 312.5/2 = 156.25 periods of the signal $ff_4$ consequently occur so that the signal $ff_4$ exhibits a phase shift in a cycle of four field periods $T_V$. In FIG. 13 the signals $K_1 = ff_4$ and $J_2 = \overline{ff_4}$ are shown in a cycle of four field periods $T_V$ by means of $V_1$, $V_2$, $V_3$ and $V_4$. Calculated on the time scale determined at the signal $K_3 = \overline{12}$ the edges in the signals $K_1 = ff_4$ and $J_2 = \overline{ff_4}$ are found to occur at the instants $t_{53}$ and $t_{13}$ in successive fields $V_1$, $V_2$ etc. The signal $Q_1 = ff_4$ of FIG. 12 corresponds to the signal $K_1 = ff_4$ of the flip-flop $FF_3$ in FIG. 13 for the field V2.

The signals at the multifold J and K inputs of the flip-flop $FF_3$ are combined through an AND gate function to form a signal J and a signal K, the fields V1, V2, V3, V4 being indicated. It is found from the signal K that the signal $K_2 = ff_5$ has a keying function while the edges in the signal K are determined by the signals $K_1 = ff_4$ and $K_3 = \overline{12}$. The same applies to the signal J with the signal $J1 = y$ and the signals $J_2 = \overline{ff_4}$ and $J_3 = \overline{ff_5}$.

The T input (not shown) of the flip-flop $FF_3$ is not connected and conveys a logic 1. For the operation of the flip-flop $FF_3$ Table 5 applies with reference to the action of a JK flip-flop having a command J and K inputs for T = 1.

It is found that prior to the instant $t_{110}$ there applies for all fields V1..V4 that K = 0 and that J varies between 1 and 0. A stable state $Q_1 = 1$ (Table 5) is associated therewith such as is shown for the signal $Q_1 = s_C$ with fields V1, V2, V3 and V4. After the instant $t_{110}$ pulses appear in the signal K up till the instant $t_{130}$ while the signal J has the logic 0. For J = 0 and K 1 → 0 there follows that $Q_1$ must start to convey the logic 0. The first occurring edge 1 → 0 in the signal K is supplied for the fields V1, V2 and V3 by the signal $K_1 = ff_4 (t_{53}, t_{13})$ and is supplied for the field V4 by the signal $K_3 = 12 (t_0)$.

Up till the instant $t_{150}$ (signal $J_1 = y$) the signal J maintains the logic 0. After the instant $t_{150}$ J pulse appear in the signal. For K = 0 and J 1 → 0 there follows that $Q_1$ must convey the logic 1 so that the firsy occurring edges 1 → 0 cause the flip-flop $FF_3$ to change over. All these trigger edges are supplied by the signal $J_2 = ff_4$ with fields V1, V2, V3 and V4 and instants $t_{13}$ and $t_{53}$.

It is found that the signal $Q_1 = s_C$ conveys a pulse having a duration of 9 $T_H$ in the fields V1, V2 and V3 and of 9.16 $T_H$ in the field V4. This difference of 0.16 $T_H$ caused by $(t_{13} - t_0)$ has no detrimental influence on the signal path in a PAL colour television system and may therefore be allowed. The instant of commencement varies in a cycle of 4 fields in a manner as stipulated in the PAL standard for blocking over 9 line periods the series of chrominance subcarrier periods to be transmitted for burst purposes. The flip-flop $FF_3$ in FIG. 10 applies the PAL blocking signal $s_C$ to the $S_2$ input of the flip-flop $FF_1$ so that it must convey the logic 1 at the $Q_2$ output during the period 9 $T_H$ from an instant $t_{13}$ for, for example, the field V2. As a result no gating pulse ($t_{16}......t_{19}$) will occur in the signal $Q_1 = s_{CC}$ of FIG. 11 after this instant $t_{13}$ in connection with the predominance of the signal at the $S_2$ input of the flip-flop $FF_1$.

The gating signal $s_{CC}$ generated by the PAL chrominance subcarrier gating signal generator ($FF_1......FF_5$) must have edges which are determined as accurately as possible. To this end it is favourable to take trigger signals for the flip-flops $FF_1$ and $FF_2$ at the highest possible frequency. Starting from the signal $a$ provided by the clock pulse generator A as a trigger signal $T = a$ for the flip-flop $FF_2$, the signal $d1$ directly derived from the signal $a$ is taken for the flip-flop $FF_1$ so that for the gating pulse in the signal $Q1 = s_{CC}$ a most accurately determined duration of 3 clock pulse periods minus 2 propagation delay times of the JK flip-flops $FF_1$ and $FF_2$ follows.

A practical embodiment of the PAL chrominance subcarrier gating signal generator according to the invention shown in FIG. 10 is as follows.

$FF_1$, $FF_2$, $FF_4$, $FF_5$ = ½ FCJ 131
$FF_3$ = FCJ 201
$C_8$, $C_9$ = 2.2 nF.
$R_{12}$, $R_{13}$ = 1 kΩ.

In the pulse generator according to FIGS. 14 and 15 the greater part of the components shown is denoted in a similar manner as in FIGS. 1 and 2. The block schematic diagram according to FIG. 14 will be described in combination with the detailed circuit diagram according to FIG. 15. In FIG. 14 the direction of the signal transmission in a general sense is denoted by a single arrow head; signal paths having a considerable trigger action on generators still to be described are provided with double arrow heads.

An output of a clock pulse generator A in FIG. 14 provides a signal $a$ at a frequency of 80 $\nu_H$ to a circuit of frequency dividers D, E and F11. The frequency divider F11 provides a signal $f11$ of the frequency $\nu_H$ to a phase discriminator B to which also an external synchronizing signal of the frequency $\nu_H$ is applied, while an output signal thereof synchronizes the clock pulse generator A. For the CCIR standard $\nu_H$ is the line frequency of 15,625 Hz and for the RTMA standard for colour and monochrome television $\nu_H$ is equal to 15,734.265....Hz. Dependent on the external synchronizing signal applied to the discriminator B for the CCIR or RTMA standard, the generator A is synchronized. When, as is shown in FIG. 15 for the sake of simplicity, there is no external synchronisation, the generator A provided with two outputs may supply the signal $a$ at the frequency of 80 $\nu_H$ for the RMA or CCIR standard at an output indicated by R or C. The standard may be chosen by means of a selector switch not further shown. In FIGS. 14 and 15 more selector switches having an R and a C position are shown and on and off-switches R and C are shown. Since FIGS. 14 and 15 will be described in the first instance for the RTMA standard, the switches which are mutually coupled mechanically or in a different manner are shown in the position R applying to this standard. Further Figures, which provide signals occurring particularly in the RTMA or CCIR position of the pulse generator or are of importance are likewise denoted by R or C.

The frequency dividers D and E of FIG. 14 are together active as a 40-to-1 divider which is built up from a 3-to-1 divider D and a 14-to-1 divider E from which the 40-to-1 divider is obtained by means of a feedback. For the positions R and C a different switchable feedback is realized. As is shown in greater detail in FIG. 15, the 3-to-1 divider D consists of two divider stages D11 and D12 and the 14-to-1 divider E consists of four divider stages E11, E12, E13 and E14. Each divider stage is formed as a JK flip-flop. For the RTMA standard the stage of flip-flop E13 is fed back to D11 and for the CCIR standard E14 is fed back to D12.

An output of the divider E conveying a signal $e14$ at double the line frequency is connected to a circuit of frequency dividers L and M employing a dividend of 21 for the divider L for the RTMA standard, or 25 for the CCIR standard and a fixed dividend of 25 for the divider M. For the RTMA standard employing 21 × 25 = 525 interlaced lines the frequency divider M provides a signal of the field frequency $\nu_V$. For synchronisation purposes an external synchronizing signal $s_{VES}$ is applied to the dividers L and M.

The divider L is built up from a 3-to-1 divider, a 2-to-1 divider and a 5-to-1 divider together including six divider stages which are denoted by means of JK flip-flops L11...L16 in FIG. 15, the 21-to-1 divider is obtained by feeding back the flip-flop L16 to the flip-flops L13 and L14, so that the 3-to-1 divider is combined with a 7-to-1 divider. The 25-to-1 divider is obtained by feeding back the flip-flop L13 to L11 so that two 5-to-1 dividers are combined. The divider M consists of an 8-to-1 divider and a 3-to-1 divider consisting of five flip-flops M71....M15, the flip-flop M11 being switches in a particular manner and receiving at a blocking input an auxiliary pulse $y$ of field frequency for realizing the 25-to-1 divider.

Outputs of the circuit of frequency dividers L and M are connected to pulse generators X, Y, Z and ZZ which provide signals $x$, $y$, $z$ and $zz$ or inverse values thereof (for example $\overline{zz}$). The signals x, y, and z are already given for the CCIR standard and in that case they include pulses occurring at the field frequency at a pulse duration of $20T_H$, 7.5 $T_H$ and 2.5 $T_H$, respectively, in which $T_H$ is the line period in the CCIR standard. It will be apparent that the additional signal zz in the CCIR standard also has a 2.5 $T_H$ pulse of field frequency which, however, occurs at an earlier instant in a field period $T_V$ than the pulse in the signal z. The pulse generator ZZ is of importance for generating the PAL gating signal and is also used for generating the signals x and y.

For the RTMA standard the pulse generators X, Y, Z and ZZ provide signals x, y, z and zz having pulses occurring at the field frequency at a pulse duration of 20 $T_H$, $9T_H$, $3T_H$ and 1.5 $T_H$, in which $T_H$ is the line period in the RTMA standard. These signals are shown inter alia in FIG. 18.

The pulse generators Y, Z and ZZ are controlled by the frequency dividers L and M without the interposition of change-over switches; in the generator X two coupled change-over switches having positions R and C are required.

A synchronizing signal generator P and a blanking signal generator W receive the signals y and z and the signal x respectively, while they are both connected to outputs of the circuit of frequency dividers D and E. The generator according to FIGS. 14 and 15 is provided with a pulse generator I1 controlled by the circuit D, E, F11, which generator applies a signal $i1$ and/or $\overline{i1}$ to the generators P and W which exhibits auxiliary pulses occurring at the line frequency beyond the equalizing and field synchronizing period of 9 $T_H$ (RTMA) or 7.5 $T_H$ (CCIR) determined by the signal y, while the auxiliary pulses occur at the double line frequency within this period.

Prior to describing the signal path in the pulse generator switched on according to FIGS. 14 and 15 for the RTMA standard with the aid of FIGS. 17 to 23, the requirements which are imposed on the blanking and synchronizing signals according to the RTMA standard will be described first with the aid of FIG. 16.

Unlike the CCIR standard the steepness of the pulses are taken into account for the RIMA standard. The steepness of the edges must be smaller than or may be equal to 0.004 $T_H$ at most. In practice a steepness of the edge of 0.002 $T_H$ occurs generally. The pulse periods are then given between points on the edges which are located at 10% and 90% of the signal amplitude. For the sake of simplicity of FIG. 16 the 0 and 100% values are taken in this case. Starting from infinitely steep edges shown in solid lines during and around the line blanking period. FIG. 16 shows the possible steep edges by means of broken lines. The times laid down in the RTMA standard are shown by solid distance lines, while the chain-link distance lines indicate the times obtained in practice with the aid of the generator. The instants which are laid down in the generator and are also shown in FIGS 17 are denoted by means of cresses.

For the RTMA standard there applies a field synchronizing period $3T_H$ (signal z), an equalizing and field synchronizing period of $9T_H$ (signal y) and a field blanking period of approximately 20 $T_H$ (signal x). In this case it has been prescribed that 6 equalizing pulses of the double line frequency must precede and follow 6 field synchronizing pulses of the double line frequency. The duration of the field blanking period in the composite blanking signal must then be 20 $T_H \pm 1 T_H + 1$ line blanking pulse duration. Furthermore the requirements imposed in the following Table 6, which requirements are derived from the signals shown in FIGS. 16 and 17, apply. TABLE 6 (FIG. 16, 17)

RTMA-standard (colour)

1. Line blanking pulse duration, signal $s_{HW}$: 0.18 $T_H$.
2. Front porch: $\geq 0.02 T_H$.
3. Line synchronizing pulse duration, signal $s_{HP}$: $0.075 \pm 0.005 T_H$.
4. Back porch to chrominance subcarrier gating signal: $\geq 0.006 T_H$.
5. Chrominance subcarrier gating signal (burst gate), signal $s_{CR}$: $\geq$ 8 periods of chrominance subcarrier = 0.0352 $T_H$.
6. Synchronizing pulse up to and including gating signal: $\leq 0.125 T_H$.
7. Synchronizing pulse up to and including blanking pulse: $\geq 0.145 T_H$.
8. Raster serration duration, signal $s_{VS}$: $0.07 \pm 0.01 T_H$.
9. Equalizing pulse duration/line synchronizing pulse duration: 0.45 to 0.50 $T_H$ in which there applies: chrominance subcarrier frequency 3579545 $\pm$ 10 Hz. Line frequency $v_H$ : 2/455 . 3579545 = 15734. 265...... Hz. Line period $T_H$: 63.55....μs.

Starting from the method of finding the Highest Common Factor H.C.F. for the determined pulse periods and the smallest pulse repetition period of ½$T_H$, a lowest clock pulse frequency of 80 $v_H$ is found to be satisfactory also for the RTMA standard. The clock pulse generator A then has a frequency of 12588441.2 Hz and a period of 0.79446 μs ≈ 795 ns.

With reference to FIGS. 16 and 17 in which a time scale of line frequency $t_0, t_1...t_{80}=t_0, t_1...$ derived from the clock pulse periods in the signal a is shown, in which $t_Q$ indicates in accordance with the Handbooks the propagation delay time $t_{pd}$ occurring in the JK flip-flops of FIG. 15, a Table 7 is given. In this case a clock pulse period is equal to $T_H/80=0.0125 T_H$ and a number thereof is given while $t_Q$ is rounded off to 0.001 $T_H$ (63.5 ns) and the maximum steepness of the edges of 0.004 $T_H$ is taken.

TABLE 7

| | | RTMA-standard | In practice | Edge steepness |
|---|---|---|---|---|
| 1 | $s_{HW}$ | $\leq 0.18T_H$ | 14×0.0125=0.175$T_H$ | +0.004$T_H$ |
| 2 | Front porch | $\geq 0.02T_H$ | 2×0.0125=0.025$T_H$ | −0.004$T_H$ |
| 3 | $s_{HP}$ | $0.075\pm0.005T_H$ | 6×0.0125−0.001= 0.074$T_H$ | −0.004$T_H$ |
| 4 | Back porch to gating signal | $\geq 0.006T_H$ | 1×0.0125−0.001= 0.0115$T_H$ | $-\frac{0.004}{2}T_H$ |
| 5 | $s_{CR}$ | $\geq$ 8 periods | 3×0.0125=0.0375× $\frac{455}{}$ = 8.5 per. | |

TABLE 7-continued

| | | RTMA-standard | In practice | Edge steepness |
|---|---|---|---|---|
| 6 | Sync. to gating signal incl. | $\leq 0.125T_H$ | $10 \times 0.125 - 0.002 = 0.123\ T_H$ | $+ \dfrac{0.004}{2} T_H$ |
| 7 | Sync. to blanking signal incl. | $> 0.145T_H$ | $12 \times 0.0125 = 0.15T_H$ | |
| 8 | $s_{VS}$ | $0.07 \pm 0.01 T_H$ | $6 \times 0.0125 = 0.075 T_H$ | $-0.004 T_H$ |
| 9 | equal./sync. | $0.45 - 0.50$ | $\dfrac{3 \times 0.0125 - 0.001}{6 \times 0.0125 - 0.001} = 0.494$ | |

It is found that even with the maximum steepness of the edges all requirements are still satisfied, with the values of the synchronizing pulse and the synchronizing pulse up to and including the gating signal reaching the allowed limit values as mentioned under points 3 and 6 of Table 7. For the edge steepness of $0.002\ T_H$ occurring in practice the requirements imposed are amply satisfied.

In a manner analogous to that of FIG. 3, FIG. 17 shows as a function of time a few signals having a logic 0 and 1 during one line period $T_H$ which signals are associated with the generator according to FIG. 15 in the RTMA position. The signals $a$, $d11$, $d12$, $e11$, $e12$, $e13$, $e14$ and $f11$ follow with the aid of the description of Table 1 for the operation of a JK flip-flop in a simple manner from the circuit diagram according to FIG. 15 with:

$T(D11) = T(D12) = A$
$K(D11) = Q_1(D12)\ K(D12) = Q_2(D11)$
$T(E11) = T(E12) = T(E13) = Q_2(D12)$
$J(E11) = Q_1(E12)$
$K(E11) = J(E12) = Q_2\ (E13)\ K(E12) = T(E14) = Q_1(E11)$
$K(E13) = Q_2(E12)\ J(E13) = Q_2(E11).Q_2(E12)$
$J(E14) = K(E14) = Q_1(E13)$
$T(F11) = Q_2(E14)$.

In the RTMA position $S_2(D11)$ receives the signal $e13'$ because $Q_2$ (E13) is connected through a capacitor $C_{10}$ and a resistor $R_{14}$ to ground to an input of a NAND gate $N_4$ a further input of which is free and conveys a logic 1 due to internal couplings, while the output is connected to the reset input $S_2$ of the flip-flop D11. If the free arranged input of the gate $N_4$ had been connected through a switch to ground with the logic 0, the output would convey a logic 1 independent of the signal $\overline{e13}'$ applied to the other input; the gate $N_4$ would then be blocked.

The line frequency time scale $t_0$. . . . $t_{40}$. . . . $t_{80} = t_0$. . . . shown in FIG. 17 is calculated on the edges in the signals $d11$ and $d12$. The edges in the signal $a$ therefore occur $1t_Q$ earlier, while successive JK flip-flops each introduce an additional propagation delay time $1t_Q$.

When considering the 40-to-1 divider D, E over half a line period $T_H/2$ it is found that negatively directed edges occur in the signal $e13$ at two instants $t_{19} + 1\ t_Q$ and $t_{39} + 1\ t_Q$ (or $t_{59} + 1t_Q$ and $t_{79} + 1t_Q$) which are active in the signal $e13'$ at the reset input $S_2(D11)$. The result is that at these instants the divider D and the subsequent divider E go one pulse further, that it to say, they count one more pulse so that the circuit of dividers D, E adapts a cycle of 40 pulses instead of having its own cycle of 42 pulses without feedback.

Due to a pulse edge displacement obtained the certain choice of the feedback is of importance for generating the trailing edge of the line blanking pulse in the signal $s_{HW}$ at the instant $t_{21} + 2t_Q$. As is shown in FIGS. 14 and 15, edges may occur in the signal $e11$ as trigger edges for the blanking signal generator of flip-flop W. As will be apparent from the description of FIG. 22 these are the edges at the instants $t_7 + 2t_Q$ and $t_{21} + 2t_Q$, the latter being obtained by the special feedback. Without the previously occurring feedback and the pulse edge displacement, the edge would have occured at the instant $t_{22} + 2t_Q$ (as is necessary for the CCIR standard and as is apparent from FIG. 3).

FIG. 17 shows a few signals described with reference to FIGS. 16 and Table 7 in a time relationship with the circuit of dividers D, E, F11 dividing to the line frequency. In addition to the signal $s_{HW}$ the line synchronizing pulse occurring at the line frequency from $t_9 + 2t_Q$ to $t_{15} + 1t_Q$ in the signal $s_{HP}$ and the chrominance subcarrier gating pulse occurring from $t_{16}$ to $t_{19}$ are shown in the signal $s_{CR}$. For generating the signal $s_{CR}$ the pulse generator shown in FIGS. 14 and 15 is to be provided with an additional pulse generator which is shown in FIG. 24 and which will be further described hereinafter.

Furthermore FIG. 17 shows pulses occurring at the double line frequency, namely the equalizing pulse from $t_9 + 2t_Q$ to $t_{12} + 1t_Q$ in the signal $s_{EP}$ and the raster serration from $t_3 + 2t_Q$ to $t_9 + 2t_Q$ in the signal $s_{VS}$. Outside the equalizing and field synchronizing period of $9T_H$ the signal $i1$ has a pulse occurring at the line frequency from $t_3 + 1t_Q$ to $t_9 + 1t_Q$ and a pulse occurring at double the line frequency within this period from $t_{43} + 1t_Q$ to $t_{49} + 1t_Q$. As compared with the auxiliary pulse in the signal $i$ described with reference to FIG. 3, the pulse in the signal $i1$ has been chosen to be shorter so that, as will be apparent from the description of FIG. 23, this pulse directly provides the raster serrations in the signal $s_{VS}$.

The signal $e14$ of the circuit of dividers D, E is applied to the circuit L, M. In the signal $e14$ negatively directed edges which are active as trigger edges for the divider L occur at the instants $t_1 + 2t_Q$ and $t_{41}\ 30\ 2t_Q$ of each line period $T_H$.

Apart from connections of the reset input $S_2$, the circuit diagram for the JK flip-flops L11. . . . . L16 in the divider L is as follows:

$T(L11) = T(L12) = Q_1(E14)$
$K(L11) = Q_2(L12)\ J(L12) = Q_2(L11)$
$T(L13) = Q_1(L12)$
$T(L14) = T(L15) = Q_2(L13)$
$K(L14) = Q_2(L15)\ J(L14) = Q_2(L16)$
$T(L16) = Q_1(L15)\ J(L15) = Q_2(L14)$.

In the RTMA standard $S_2(L13)$ and $S_2(L14)$ receive the signal $l16'$ in a feedback because $Q_1$ (L16) is connected through a capacitor $C_{11}$ and a resistor $R_{15}$ to ground to an input of a NAND gate N₅ another input of which is free and conveys a logic 1 due to internal couplings, while the output is connected to the reset inputs S₂ of the flip-flops L13 and L14.

The inputs S₂ (L13) and S₂(L14) are connected to the anode of a diode T₄, while S₂ (L11) and S₂(L12) are connected to the anode of a diode T₅ whose interconnected cathodes are connected to S₂(L15) and S₂(L16). The diode T₄(and T₅ for the CCIR position to be described) blocks the negatively directed pulse obtained by the feedback so that it acts only on the inputs S₂(L13) and S₂(L14).

The divider M following the divider L has the following connection diagram:

$T(M11) = Q_1(L14)$
$J_1(M11) = Q_2(L16)$ and $J_2(M11) = Q_1(Y)$
$T(M12) = Q_1(M11)$ $T(M13) = Q_1(M12)$
$T(M14) = T(M15) = Q_1$ (M13)
$J(M14) = Q_2(M15)$ $J(M15) = Q_1(M14)$.

All reset inputs S₂ are interconnected and are connected to S₂(L15) and S₂(L16) and to the collector electrode of an npn-transistor T₃ whose emitter electrode is connected to ground.

Transistor T₃ forms part of an external synchronizing circuit which is formed in the same manner as the circuit described with reference to FIG. 2, so that a further description thereof is not necessary. Normally the transistor T3 is cut off during synchronization and the logic 1 is impressed on all the said S₂ inputs due to internal couplings.

In FIG. 18 the signal path is shown by means of two time scales in the circuit of frequency dividers L, M dividing to the field frequency and the signals $zz, x, y, z$ and $s_{VES}$ are shown for giving the time relation.

The signal $e14$ has a trigger edge at each line period $T_H$ at the instants $t_1 + 2t_Q$ and $t_{41} + 2t_Q$ from which the h signals $l11......l16$ follow.

In FIG. 4 a time scale $t_{100}$ etc. of field frequency is introduced which has been derived from pulse edges having a propagation delay time of $5\ t_Q$ and, as seen in one line period, commencing at the instant $t_0 = t_{100}$ at which $t_{20} = t_{101}, t_{40} = t_{102}, t_{60} = t_{103}, t_{80} = t_0 = t_{104}$ etc. up to $t_{1350} = t_{100}$. In FIG. 18 a time scale of field frequency is introduced in a similar manner, but a time index notation has been used only to emphasize that, as seen in one line period, the scale begins at $t_1$ under the influence of the signal $e14$. The instant $t_{100}'$ of a field period $T_V$ is the instant $t_1$ of a line period $T_H$ in which $t_{104}'$ is one line period later, etc. up to $t_{1150}' = t_{100}'$ for the end of a field period $T_V$ in the RTMA standard employing 262.5 lines per field.

In the signal $l16$ a few edges are denoted by way of arrow heads which influence the signals $l13$ and $l14$ directly through the signal $\overline{l16}'$ (now shown) on the inputs $S_2(L13)$ and $S_2(L14)$.

The divider M controlled by signal $l14$, which divider is formed with the 8-to-1 divider M11, M12, M13 and 3-to-1 divider M14, M15 is active as a 25-to-1 divider due to the signal J (M11) = $y.\overline{l}16$. It has been achieved with this signal combination that the input J(M11) between the instants $t_{116}'$ and $t_{152}'$ ($y = 0$) has and maintains the logic O. The flip-flop M11 will therefore not change over when $t_{152}'$ a negatively directed edge occurs in the signal $l14$. The input J (M11) serves as a blocking input for the divider M so that an increase in the dividend is achieved. One pulse is skipped, as it were, in the signal $l14$ during counting, that is to say, the divider M is stopped during one pulse so that the counter or the divider M has a cycle of 8 times 3 + 1 = 25 pulses.

As has been explained in the description of the external synchronizing signal $S_{VES}$ with reference to FIG. 2, the negatively directed trigger edge in the signal $s_{VES}$ in the synchronized state of the pulse generator can only occur around the instant $t_{137}'$ (from $t_{136}'$ to $t_{138}'$) because then only all signals $l11....l16, m11....m15$ have the logic 0. If there were no synchronisation, the dividers L and M would be forced to take up this state.

FIG. 19 serves for illustrating the manner in which flip-flop ZZ, Y, Z and X of FIG. 15 are active.

The connection diagram of the flip-flop ZZ follows from FIG. 15

$T(ZZ) = Q_2(L15)$ $J(ZZ) = 1, K(ZZ) = 0$ and $S_2(ZZ)$ is connected to $Q_1(M15)$ through a differentiating circuit which includes two resistors $R_{16}$ and $R_{17}$ arranged in series between ground and potential U, and a capacitor $C_{12}$.

It follows from Table 1 regarding the action of a JK flip-flop in general that for J = 1 and K = 0 the flip-flop ZZ in the stable state conveys the logic 1 at the $Q_1$ output and conveys the logic 0 at the inverse $Q_2$ output. The stable state means that a negatively directed edge at the T input which edge may be active as a trigger edge does not change over the flip-flop. As in the generator according to FIGS. 14 and 15 only the signal $Q_2 = \overline{zz}$ is used, this signal is shown in FIG. 19.

At the instant $t_{100}'$ the flip-flop ZZ is in its stable state with the logic 0 in the signal $Q_2 = \overline{zz}$. It follows from FIG. 18 that at the instant $t_{110}' + 4t_Q$ a negatively directed edge occurs in the signal $m15$ which, while occurring in the signal $S_2 = m15'$ causes the flip-flop ZZ, to change over. The signal $Q_2 = \overline{zz}$ has obtained the logic 1 at the instant $t_{110}' + 5t_Q$. Since the condition J = 1, K = 0 has not changed, the result is that the next negatively directed edge ($t_{116}'$) in the signal $T = \overline{l}15$ causes the flip-flop ZZ to change back again. At the instant $t_{116}' + 1t_Q$ the logic 0 is present again in the signal $Q_2 = \overline{zz}$, which 0 is maintained until the next field period with a new cycle. A signal $\overline{zz}$ has been generated with a pulse lasting 1.5 line periods $T_H$ and occurring after 2.5 line periods $T_H$ from the commencement of a field period $T_V$.

The connection diagram for the flip-flop Y is: $T(Y) = Q_2(L16), J(Y) = 1, K(Y) = 0$ and $S_2(Y)$ connected to $Q_2$ (ZZ) through a differentiating circuit which includes two resistors $R_{18}$ and $R_{19}$ arranged in series between ground and potential U, and a capacitor $C_{13}$.

The same stable state as described for the flip-flop ZZ applies to the flip-flop Y with J = 1 and K = 0 so that the signal $Q_1 = y$ has the logic 1 at the instant $t_{100}'$. After the instant $t_{110}'$ the signal $S_2 = \overline{zz}'$ has a positively directed edge and at the instant $t_{116}' + 1t_Q$ it has a negatively directed edge to the logic 0 so that the flip-flop Y changes over. From the instant $t_{116}' + 2t_Q$ until the instant of occurrence of the next negatively directed edge ($t_{152}' + 1t_Q$) in the signal $T = \overline{l}16$ the signal $Q_1 = y$ maintains the logic 0. In the signal $Q_1 = y$ a pulse appears from $t_{116} + 2t_Q$ to $t_{152}' + 2t_Q$ which pulse thus lasts 152−116/4=9 line periods $T_H$ and commences a 4 line periods $T_H$ after the commencement of a field period $T_v$.

The generator Z in FIG. 15 is formed as a NAND gate whose inputs are connected to $Q_2(Y)$ and $Q_2(L15)$. The output of the gate Z therefore conveys a signal $z = \overline{y}.\overline{l15} = \overline{y} + l15$. The signal z has a pulse lasting three line periods $T_H$ which is desired as is shown in FIG. 18, and which pulse lasts from $t_{128}'$ to $t_{140}'$ but has an unwanted additional pulse in FIG. 19, but as will be apparent this additional pulse is harmless for the action of the pulse generator. Since a negatively directed edge occurs in the signal $l15$ at the instant $t_{152}'$, while in the signal $y$ the positively directed edges does not occur until the instant $t_{152}' + 2t_Q$, a narrow pulse of $2t_Q$ (for example, of 140 ns) appears in the signal $z$.

The generator X in FIG. 14 is formed with switchable inputs to which end a few NAND gates are applied for the flip-flop X in FIG. 15. Two inputs of two NAND gates $N_6$ and $N_7$ are interconnected which are free for the position R, but are connected to ground through a change-over switch in the position C. In the position R the gates $N_6$ and $N_7$ pass the signal $l11$ and $\overline{m}11$ applied to another input onto the inputs T(X) and J(X), respectively.

For the position R the effective connection diagram of the flip-flop X, in which the inverting action of the gates $N_6$ and $N_7$ is taken into account, would be:

T(X) = $Q_1$(L11), J(X) = $Q_1$(M11), K(X) = 0 and $S_2$(X) connected to $Q_2$(ZZ) through the differentiating circuit ($R_{18}$, $R_{19}$ and $C_{13}$).

Since in the signal J = $m11$ of FIG. 19 the logic 1 occurs until the instant $t_{110}'$ and K = 0, the signal $Q_1 = x$ in the stable state of the flip-flop X has the logic 1 before this instant. The logic 0 appearing in the signal J = $m11$ does not give the negatively directed edges in the signal T = $l11$ any opportunity to change over the flip-flop X because for J = 0 and K = 0 the flip-flop X is never changed over through signals on the T-input. At the instant $t_{116}' + 1t_Q$ the flip-flop X changes over under the influence of the negatively directed pulse in the signal $S_2 = zz'$. As long as the signal J = $\overline{m}11$ maintains the logic 0, the flip-flop X in the signal $Q_1 = x$ also maintains the logic 0. In the signal J = $m11$ the logic 1 occurs at the instant $t_{194}' + 2t_Q$ so that the edge in the signal T = $l11$ occurring at the instant $t_{196}' - 2t_Q$ is active as a trigger edge so as to bring the flip-flop X in the stable state associated with J = 1 and K = 0. A signal $x$ is generated with a pulse of 20 line periods $T_H$ and occurring from $t_{116}' + 2t_Q$ until $t_{196}' - 1t_Q$.

For the flip-flop I in FIG. 15 there applies that:

T(I1 = $Q_2$(D11), K(I1) = $Q_2$(E12), $J_1$(I1) connected to $Q_2$(E14) through a differentiating circuit including a resistor $R_{20}$ to ground and a capacitor $C_{14}$, and $J_2$(I1) connected to the output of a NAND gate $N_8$ whose inputs are connected to $Q_1$ (F11) and $Q_1$(Y).

In FIG. 20 the signals T = $\overline{d}11$, $J_1 = \overline{e}14'$, $J_2 = f11 \cdot y = \overline{f11 + \overline{y}}$ and K = $\overline{e}12$ are shown for the flip-flop I1. These signals are comparable with those given in FIG. 6 because the action of the flip-flop I1 is in principle not different, even if a different signal choice has been made. A considerable difference is, however, that in the signal $Q_1 = i1$ the pulses are shorter than in the case of the pulse generator according to FIGS. 1 and 2 which is of importance for the signals present at the synchronizing signal generator P.

Since the pulses in the signal $i1$ have the same number of clock pulses of the signal $a$, in the RTMA and CCIR standards, which clock pulses are, however, of different duration the R-notation in FIG. 20 has been omitted.

Briefly, the following applies to the signals in FIG. 20:

During each line period $T_H$ the signal $J_1 = \overline{e}14'$ has two pulses with the logic 1 obtained by differentiation, the first pulse occurring from $t_1 + 2t_Q$ to $t_2$ at a minimum and $t_{11}$ at a maximum and the second pulse occurring from $t_{41} + 2t_Q$, etc. Beyond the equalizing and field synchronizing period with $y = 1$, the signal $\overline{f}11$ in the signal $J_2 = \overline{f}11 + \overline{y}$ only has the logic 1 during the first pulse so that only this first pulse in the signal $J_1 = \overline{e}14'$ provides the logic 1 at the input J(I1). For J = 0 or 1, caused by the signal K = $\overline{e}12$, the stable state of the flip-flop I1 is that the $Q_1$ output conveys the logic 0 as is shown at the instant $t_0$.

After the logic 1 has appeared at the input J(I1) in the signal $J_1 = \overline{e}14'$ at $t_1 + 2t_Q$ the next negatively directed edge in the signal T = $\overline{d}11$ causes the flip-flop I1 to change over at $t_3$. A subsequent negatively directed edge in the signal T = $\overline{d}11$ at the instant $t_6$ does not have any influence because for K = 0 and J = 1 or 0 the $Q_1$ output conveys the logic 1 in the stable state. Before the edge in the signal T = $\overline{d}11$ at $t_9$ the condition K = 1 is given by the signal K = $\overline{e}12$ while J = 1 or 0. For K = 1 and J = 1 a change-over is effected at each trigger edge while for K = 1 and J = 0 there applies for the stable state that the $Q_1$ output must convey the logic 0. In both cases a changeover of the flip-flop I1 is effected and a pulse is thus generated in the signal $Q_1 = \overline{i}1$ between the instants $t_3 + 1t_Q$ and $t_9 + 1t_Q$.

During the equalizing and field synchronizing period with $y = 0$ during $9T_H$ both pulses in the signal $J_1 = e14'$ become manifest at the input J(I1) and a pulse between the instants $t_{43} + 1t_Q$ and $t_{49} + 1 t_Q$ is generated during the second half of one line period $T_H$ in the signal $Q_1 = \overline{i}1$.

For the sake of simplicity of FIG. 20 the pulses produced by differentiation in the signal $J_1 = e14'$ at the instants $t_{21}$ and $t_{61}$ which continue to represent the logic 0 and do not exert any influence on the flip-flop I1 are only shown incompletely in broken lines.

FIG. 21 serves for illustrating the operation of the flip-flop I1 at and near the equalizing and field synchronizing period of $9T_H$ for the RTMA standard. FIG. 21a shows the signal $y$ in relation to the field time scale $t_{100}',...t_{1150}'$ given in FIG. 18. FIGS. 21b and 21c apply to two successive fields in which FIG. 21b applies to the field ending in a full line and FIG. 21c applies to the field ending in a half line. The signals $f11$, $J_2 = \overline{f}11 + \overline{y}$, $J_1 = \overline{e}14'$ (without the superfluous negatively directed pulses) and $Q_1 = i1$ are shown for both fields. FIGS. 21b and 21c are self-evident, certainly after what has been described with reference to FIG. 7.

Starting from the definition for a so-called first field for which there applies that the last occurring line synchronizing pulse occurs over an integral number of line periods before the commencement of the field synchronizing period. FIG. 21b is associated with the first field in accordance with the RTMA standard, while FIG. 7b is associated with the first field in accordance with the CCIR standard.

The operation of the blanking signal generator or flip-flop W of FIG. 15 is illustrated by way of FIG. 22 in which FIG. 22a shows the signals which are the same for each field and FIGS. 22b and 22c show signals which are different for successive fields.

For the connection diagram of the flip-flop W in FIG. 15 active as a blanking signal generator there applies that T(W) = $Q_1$(E11), K(W) = $Q_1$(I1),
$J_1$(W) = $Q_1$(E13) and $J_2$(W) = $Q_1$(X).

In FIG. 22a the signal T = $e11$ is shown on two scales and partly only negatively directed edges are shown occurring with a delay of $1t_Q$ after the instants $t_1$, $t_7$, $t_{21}$, $t_{27}$, $T_{41}$, $t_{47}$, $t_{61}$ and $t_{67}$. For the J input a signal J follows from the signals $J_1 = e13$ also having a delay time of $1t_Q$ and $J_2 = x$ at an instant $t_{41}+7\ t_Q$ for the leading edge and $t_{41} + 4t_Q$ for the trailing edge of the pulse lasting 20 $T_H$.

The signal $K = i1$ in FIGS. 22b and 22c follows from FIGS. 21b and c with the signal $Q_1 = i1$. Since there is a shift of half a line period $T_H$ between FIGS. 22b and 22c a few instants are shown in these Figures in which $t_0$, ..... in one Figure corresponds to $t_{40}$, ...... in the other.

For the flip-flop W there applies that for K= 0 and J = 1 or 0 the $Q_1$ output conveys the logic 1 in the stable stae as may be derived from Table 1. When considering FIG. 22c it is found that a pulse with the logic 1 occurs in the signal $K = i1$ between the instants $t_3$ and $t_9$ while a negatively directed edge occurs at the instant $t_7$ in the signal $T = e11$, which edge is active as a trigger edge. The signal $Q_1 = w$ has obtained the logic 0 at the instant $t_7 + 2t_Q$. At the instant $t_{13}$ the signal $t = e11$ obtains the logic 1 while the logic 0 then occurs in the signal $K = i1$ and the logic 1 occurs in the signal J. Associated therewith is a stable state with the logic 1 in the signal $Q_1 = w$. Although under the influence of the signal $e13$ of FIG. 17 the logic 0 appears in the signal J at the instant $t_{19}$, the logic 1 information is maintained in the flip-flop W so that the negatively directed edge in the signal $T = e11$ causes the flip-flop W to change over at the instant $t_{21}$. This mechanism is denoted by means of a dot in the signal J. The result is that a line blanking pulse denoted by $s_{HW}$ appears in the signal $Q_1 = w$ which pulse appears between $t_7 + 2t_Q$ and $t_{21} + 2t_Q$, that is to say, a duration of 14 clock pulse periods of the signal a, hence 14 ×0.0125 = 0.175 $T_H$.

For FIG. 22b there applies that the signal $K = i1$ approximately determines the position of the leading edge in the same manner and the signal $J_1 = e13$ determines the position of the trailing edge, while the edges of the line blanking pulses $s_{HW}$ are exactly determined by the signal $T = e11$.

In FIGS. 22b and 22c the first pulse in the signal $K = i1$ occurring after the signal $J_2 = x$ in the signal J has given the logic 0 causes the flip-flop W to change over at the instant $t_7$ or $T_{47}$. Subsequently, the logic 0 in the signal J is maintained during approximately 20 line periods $T_H$. During the first 9 line periods $T_H$ with $y = 0$ pulses of double line frequency occur in the signal K $= i1$ and during the rest of the time with $y = 1$ pulses of line frequency occur only so that $K = 1$ or 0. For $J = 0$ and $K = 1$ or 0 the flip-flop W is in the stable state with the signal $Q_1 = w$ conveying the logic 0.

At the end of the 20 line periods $T_H$ the next pulse with the logic 1 in the signal $J_1 = e13$ becomes manifest in the signal J. Due to the condition $J = 1$ and $K = 0$ the next negatively directed edge in the signal $T = e11$ occurring at the instant $t_{61}$ (FIG. 22a) causes the flip-flop W to change over. The flip-flop W thus generates a field blanking pulse which in FIG. 22b lasts from $t_7 + 2t_Q$ to $t_{21} + 2t_Q$ and in FIG. 22c from $t_{47} + 2t_Q$ to $t_{61} + 2t_Q$ plus 20 full line periods $T_H$. The field blanking pulse thus lasts 20 line periods $T_H$ and 14 clock pulse periods of the signal a, that is to say, one line blanking period ($s_{HW}$).

Subsequently, the auxiliary pulses in the signal $K = i1$ of FIGS. 22b and 22c provide the opportunity for the negatively directed edges in the signal $T = e11$ of FIG. 22a to generate the line blanking pulses $s_{HW}$ by means of the flip-flop W, while these edges are active as trigger edges.

For the connection diagram of the flip-flop P of FIG. 15 active as a synchronizing signal generator there applies that: $T(P) = Q_2(D11), J3(P) = Q_1(E13)$ K = 0, $S_1(P) = Q_2(I1)$, S2(P) connected to $Q_1(I1)$ through a differentiating circuit having two resistors $R_{21}$ and $R_{22}$ arranged in series between ground and the potential U, and a capacitor $C_{15}$; $J_2(P)$ connected to the output of a NAND gate $N_9$ to inputs of which $Q_2(E11)$ and $Q_1(Y)$ are connected, and $J_1(P)$ connected to the output of the NAND gate Z.

For the input $S_1$ of the JK flip-flop not yet used in the description there applies that for $S_1 = 0$, $Q_1$ must be 1. As already noted there applies for the reset input $S_2$ that for $S_2 = 0$, $Q_1$ must be 0.

FIG. 23 shows the signals for the flip-flop P and relates to 22 half line periods $T_H/2$ occurring during and near the equalizing and field synchronizing period. The periods of time 1, 2, 3; 8, 9, 10; 14, 15, 16 and 20, 21, 22 are shown for the numbered half line periods. Due to the periodicity of the signals in the half line periods, the time scale $t_0....t_{40}$ is taken for each half line period $T_H/2$.

Since there applies for the flip-flop P that K=0, the signal J is of importance so as to give the negatively directed edges in the signal $T = \overline{d}11$ the possibility to be active as trigger edges. For K = 0 and J = 0 there applies that the signal $T = \overline{d}11$ can never make the flip-flop P change over. If J = 1 when K = 0, there applies that $Q_1 = 1$ for the stable state of the flip-flop P; if this state is not present, a changeover to this state is effected.

The signal J in FIG. 23 causes the flip-flop P to generate other pulses in the (synchronizing) signal $Q_1 = p$ during the field synchronizing period, the equalizing period and the period beyond these intended for the line synchronisation. The signal $J_1 = z$ provides the logic 0 during the field synchronizing period of $3T_H$ in the signal J so that the edges in the signal $T = \overline{d}11$ do not exert any influence. The signal $J_2 = e11 + \overline{y}$ together with $\overline{y} = 1$ causes the signal $J_3 = e13$ to become manifest in the signal J during the equalizing and field synchronizing period of 9 $T_H$. Outside the period of 9 $T_H$ a combination of the signals $e11$ (of the signal $J_2 = e11 + \overline{y}$ with $\overline{y} = 0$) and $J_3 = e13$ becomes manifest in the signal J, the leading edges of the pulses in the signal J being determined by $e11$ ($t_{13}$ relative to $t_{10}$).

The signals $S_1 = \overline{i1}$ and $S_2 = i1'$ and the signal $Q_1 = p$ derived therefrom are partly shown in solid, broken and chain-link lines so as to indicate the periodicity results of the two television fields in one Figure. In FIGS. 21 and 22 the FIGS. 21b, 21c and 22b, 22c are given for this purpose. When a pulse denoted by chain-link lines occurs in the signal $S_1 = \overline{i1}$ as corresponds to FIGS. 21b and 22b during the period of time 1 of FIG. 23 as well as in the signal $S_2 = i1'$, the following is effected: starting from the stable state of the flip-flop P with $Q_1 = 1$ for the condition that K = 0 and J = 1 or 0, the pulse with the logic 0 occurring from $t_3 + 1t_Q$ to $t_9 + 1t_Q$ in the signal $S_1 = \overline{i1}$ will not cause the flip-flop P to change over because $Q_1$ is 1 already. After the instant $t_9$ a pulse with the logic 0 obtained by differentiation occurs in the signal $S_2 = i1'$ for which there applies that $Q_1 = 0$; the flip-flop P changes over and the logic 0 appears in the signal $Q_1 = p$. The next negatively directed edge in the signal $T = \overline{d}11$ occurs at the instant $t_{12}$. The signal J has the logic 0 at the instant $t_{12}$ under the influence of the signal $e11$ in $J_2 = e11 + \overline{y}$. Since the condition K = 0 and J = 0 applies, the flip-flop P cannot be changed over by the signal $T = \bar{d}11$. In the signal J a logic 1 occurs due to the signal $e11$ at the instant $t_{13} + 1t_Q$. A second negatively directed edge in the signal $T = \bar{d}11$ at the instant $t_{15}$ causes the flip-flop P to change over to the stable state with $Q_1 = 1$ in case of the condition $J = 1$ and $K = 0$.

The same description applies to the period of time 2 for the pulses shown in broken lines and associated with the signals of FIGS. 21c and 22c.

The result is that in the signal $Q_1 = P$ line synchronizing pulses $s_{HP}$ are generated which last from $t_9 + 2t_Q$ to $t_{15} + 1t_Q$, that is to say, $6 \times 0.0125\, T_H - 0.001 T_H = 0.074 T_H$ as already given with reference to FIGS. 16 and 17 and Table 7.

During the period of time 1 a time variation $\delta t$ has been given for the signals $S_1 = \bar{i}1$ and $S_2 = i1'$ between the instant $t_9$ and the exact instant of occurrence of the negatively directed edge in the signal $S_2 = i1'$ while the positively directed edge occurs in the signal $S_1 = \bar{i}1$ within the time variation $\delta t$. Up till now the propagation delay time $t_Q$ has been given to correspond with a propagation delay time $t_{pd}$ of a JK flip-flop. There are flip-flops which have a difference in propagation delay time between an input and the two outputs Q for a positively or negatively directed edge occurring. The time $t_{pd}$ is then distinguished in $t_{pdr}$ (rise propagation delay time) and $t_{pdf}$ (fall propagation delay time) in which $t_{pdr}$ is generally smaller than $t_{pdf}$. The positively directed edge then commences at an earlier instant than the negatively directed edge which has, however, a steeper slope and which reaches the final value at a quicker rate than the positively directed edge, but relative to a measuring reference potential of 1.5 V the positively directed edge having a more gentle slope reaches this final value earlier than the negatively directed edge. For a JK flip-flop I1 of the type FCJ 121 the practical measurement was that $t_{pdr} = 50$ ns and $t_{pdf} = 70$ ns $= \delta t$ in FIG. 23. The difference of 20 ns guarantees that the signals $S_1 = i1$ and $S_2 = i1'$ having an opposite action at the instant $t_9$ do not yield any uncertainty for the flip-flop P, while this effect will be used in a positive manner in the field synchronizing period of $3 T_H$.

During the periods of time 3.....8 the signal $J_3 = e13$ becomes completely manifest in the signal J because the logic 1 is present in both signals $J_1 = z$ and $J_2 = e11 + \bar{y}$. During the period of time 3 a short pulse of $1t_Q$ having the logic O occurs in the signal $J_2 = \bar{e}11 + \bar{y}$ because the negatively directed edge in the signal $e11$ occurs at $t_1 + 1t_Q$ and the positively directed edge in the signal $\bar{y}$ occurs at $t_1 + 2t_Q$; this pulse does not appear in the signal J.

When commencing with the period of time 3, the signal $S_2 = i1'$ causes the flip-flop P to change over as has been described with reference to the period of time 1. Since a positively directed edge given by the signal $J_3 = e13$ occurs in the signal J, at the instant $t_{10} + 1t_Q$, the next negatively directed edge in the signal $T = \bar{d}11$ causes the flip-flop P to change over at $t_{12}$. In this manner an equalizing pulse is generated in the signal $Q_1 = p$ in each of the periods of time 3.....8, which equalizing pulse is denoted by $s_{EP}$. The equalizing pulses $s_{EP}$ last from $t_9 + 2t_Q$ to $t_{12} + 1t_Q$ (Figure 17), that is to say, $3 \times 0.0125\, T_H - 0.001\, T_H = 0.0365\, T_H$. Thus the calculation given in Table 7 under item 9 is satisfied by the six generated equalizing pulses $s_{EP}$.

During the periods of time 9.....14 the signal $J_1 = z$ with the logic 0 passes on this logic 0 to the signal J. For the condition $K = 0$ and $J = 0$ none of the negatively directed edges in the signal $T = \bar{d}11$ can be active as a trigger edge. The flip-flop P changes over at the instant $t_9$ under the influence of the signal $S_2 = i1'$. During the remaining part of each of the periods of time 9.....14 the signal $Q_1 = p$ maintains the logic O. At the instant $t_3$ in a next period of time, for example, period of time 10 relative to period of time 9, the negatively directed edge of the pulse with the logic O occurs in the signal $S_1 = \bar{i}1$ so that the Q1 output of P must convey the logic 1. The subsequent pulse with the logic O in the signal $S_2 = i1'$ at the instant $t_9$ causes the flip-flop P to convey the logic O again at the $Q_1$ output. The result is that the signals $S_1 = \bar{i}1$ and $S_1 = i1'$ provide the raster serrations $s_{VS}$ in the signal $Q_1 = p$ from $t_3 + 2t_Q$ to $t_9 + 2t_Q$ (FIG. 17) so that six field synchronizing pulses denoted by $s_{Vp}$ appear in the field synchronizing period of $3 T_H$. The raster serrations $s_{VS}$ have a duration of six clock pulse periods, that is to say, they are $6 \times 0.0125\, T_H = 0.0075\, T_H$.

When generating the raster serrations $s_{VS}$ and the field synchronizing pulses $s_{Vp}$ use was made of the property already mentioned that at the instant $t_9$ the positively directed edge in the signal $S_1 = i1$ at an earlier instant (approximately 20 ns) than the negatively directed edge in the signal $S_2 = i1'$ so that at this instant $t_9$ there is no uncertainty about the state of the flip-flop P. To this end the flip-flop I1 is formed as an FCJ 121 having different propagation delay times from the pulse edges to the inverse outputs.

During the periods of time 15.....20 six equalizing pulses are generated in the signal $Q_1 = p$ in an analogous manner as described with reference to the periods of time 3.....8. The following applies for the transition between the periods of time 14 and 15. The signal $J_1 = z$ maintains the logic O until the instant $t_1$ in the period of time 15. However, it is required for the logic O in the signal J to be maintained until shortly after the instant $t_9$. Due to the choice of the signal $J_3 = e13$ with the logic O from $t_{39} + 1t_Q$ in the period of time 14 to $t_{10} + 1t_Q$ in the period of time 15 it is ensured that this requirement is satisfied.

The periods of time 21 and 22 correspond to the periods of time 1 and 2. For the period of time 21 in particular there applies that the short pulse of $2t_Q$ described with reference to FIG. 19, occurs in the signal $J_1 = z$ after the instant $t_1$. It is found that this impulse has no influence on the signal J.

In FIG. 18 it is indicated that relative to FIG. 4, the field time scale is one clock pulse period of the signal $a$ later (0.795 $\mu$s). It is found that this does not make any difference for the generated pulses of line frequency and double line frequency, and the difference is negligibly small relative to the pulses occurring at the field frequency.

It is found that the pulse generator according to FIGS. 14 and 15 in the RTMA position generates some of the signals shown in FIGS. 16 and 17 and in Table 7, the front porch following from the time difference between the leading edges of the pulses $s_{HW}$ ($t_7 + 2t_Q$) and $s_{HP}(t_9 + 2t_Q)$.

For generating the said NTSC chrominance subcarrier gating signal (burst gate) $s_{CR}$, FIG. 24 shows in detail a generator which can be connected to the pulse generator according to FIGS. 14 and 15, which generator includes in principle one flip-flop $FF_{16}$. The other flip-flops shown in FIG. 24 are required for generating a PAL-chrominance subcarrier gating signal $s_{CC}$. FIG. 15 shows the signals associated with the flip-flop $FF_{16}$.

In FIG. 24 the flip-flop $FF_{16}$ receives the signal $a$ at the T input, the signal $\overline{d12}$ at the K input and the signal $y$ at the $S_2$ input. The J input is connected to the collector electrode of an npn-transistor $T_6$ which is connected through a resistor $R_{23}$ to a terminal of potential U. The emitter electrode of transistor $T_6$ is connected to ground and the base electrode is connected through a resistor $R_{24}$ to the potential U and through a capacitor $C_{16}$ to a terminal to which the synchronizing signal $\overline{p}$ is applied. The transistor $T_6$ is normally conducting with J = O applying for the flip-flop $FF_{16}$. A positively directed edge in the signal $\overline{p}$ does not influence the transistor $T_6$, a negatively directed edge of a pulse renders the transistor $T_6$ instantaneously non-conducting for a duration which is determined by the time constant of the resistor $R_{24}$ and the capacitor $C_{16}$ which act as a differentiating circuit.

FIG. 25 shows a signal $p$ derived from FIG. 23 which provides the possibly occurring pulses over one line period $T_H$. Solid lines denote a line synchronizing pulse $s_{HP}$, fat broken lines denote two equalizing pulses $s_{EP}$ and thin broken lines partially show two field synchronizing pulses $s_{VP}$. Negatively directed edges in the signal $\overline{p}$ applied to transistor $T_6$, which edges correspond to positively directed edges in signal $p$ provide a pulse having the logic 1 in the signal $J = \overline{p}'$ to the J input of $FF_{16}$. Starting from the fact that the flip-flop $FF_{16}$ was in its stable state at the instant $t_o$ in case of the condition J = O and k = 1 or O, the $Q_1$ output conveys the logic O as is shown in the signal $Q_1 = s_{CR}$. Since no gating signals must be generated during the equalizing and field synchronizing period of 9 $T_H$ with $y = O$, the signal $y$ is applied to the input $S_2$ ($FF_{16}$). In FIG. 25 the signal $S_2 = y$ is denoted by a solid (1) and a broken line (0) and it follows that for $y = O$ the predominant $S_2$ input maintains the output $Q_1$ at the logic O irrespective of what occurs at the T, J and K inputs.

Outside the equalizing and field synchronizing period, a flip-flop $FF_6$ may be changed over, because a pulse caused by the trailing edge of the pulse $s_{HP}$ appears with the logic 1 at the instant $t_{15} + {}_1t_Q$ in the signal $J = p'$ while a negatively directed edge in the signal $T = a$ occurs at the instant $t_{16} - 1t_Q$. In this case K may be 0 or 1. The signal $Q_1 = s_{CR}$ has the logic 1 at the instant $t_{16}$.

In the signal $K = \overline{d}12$ the reference $K_R$ denotes the signal which occurs in case of the RTMA standard. At the instants $t_{17} - 1t_Q$ and $t_{18} - 1t_Q$ having negatively directed edges in the signal $T = a$, $K = O$ so that for J = 1 or O the $Q_1$ output maintains the logic 1. At the instant $t_{18}$ $K_R$ in the signal $K = \overline{d}12$ obtains the logic 1 so that the edge in the signal $T = a$ at the instant $t_{19} - 1t_Q$ may be active as a trigger edge for the condition K = 1, J = 1 or 0. At the instant $t_{19}$ the logic 0 has appeared in signal $Q_1 = s_{CR}$. After the instant $t_{19}$ the logic 0 is to occur in the signal $J = \overline{p}'$ in order that the flip-flop $FF_{16}$ does not change over again.

It is found that the flip-flop $FF_{16}$ generates the chrominance subcarrier gate signal (burst gate) $s_{CR}$ already shown in FIGS. 16 and 17 from the instant $t_{16}$ to $t_{19}$, that is to say, at a duration of three clock pulse periods of the signal $a$, being $3 \times 0.0125$ $T_H = 0.0375$ $T_H$. This corresponds to $455/2$ $0.0375 = 8.5$ periods of the chrominance subcarrier.

The times given in Table 7 and shown in FIG. 16 are self-evident.

So far the switchable pulse generator shown in FIGS. 14 and 15 has only been described as one acting for the RTMA standard. To achieve that the switchable generator according to FIGS. 14 and 15 can also be active for the CCIR standard, three switching operations are carried out as follows:

1. The flip-flop D11 in FIG. 15 receives a logic 1 at the $S_2$ input because an input of the NAND gate $N_4$ is connected to ground with the logic o; the gate $N_4$ is blocked. Subsequently the signal $\overline{e}14'$ is applied to the reset input $S_2$ of the flip-flop D12 because $Q_1$ (E14) is connected through a capacitor $C_{17}$ and a resistor $R_{25}$ to ground to an input of a NAND gate $N_{10}$ another input of which is free and conveys a logic 1 due to internal couplings while the output is connected to $S_2$ (D12).

2. The flip-flops L13 and L14 receive the logic 1 at the $S_2$ input through the NAND gate $N_5$ with an input connected to ground with the logic 0. The signal $\overline{l13}'$ is applied to the reset input $S_2$ of the flip-flop L11 because $Q_1$ (L13) is connected through a capacitor $C_{18}$ and a resistor $R_{26}$ to ground to an input of a NAND gate $N_{11}$ another input of which is free and the output of which is connected to $S_2$ (L11).

3. The T and j inputs of the flip-flop X are switched over. To this end an input of the gates $N_6$ and $N_7$ is connected through a change-over switch to ground with the logic O, position C, so that two other NAND gates $N_{12}$ and $N_{13}$ are released. Gate $N_{12}$ having an input connected to $Q_1$ (L16) has its output connected to T(X) and gate $N_{13}$ having an input connected to $Q_2$(Y) has its output connected to J(X).

Although the output of the gate $N_{11}$ is connected to both $S_2$ (L11) and $S_2$(L12), the flip-flop L11 only is influenced by the feedback. The reason for the interconnection of $S_2$ (L11) and S2(L12) is that the flip-flops L11 and L12 can in practice be formed as one twofold flip-flop FCJ 121 having one interconnected input $S_2$.

To explain the simple switchability of the pulse generator according to FIG. 15 and to illustrate a few important signal differences occurring between the R and C positions, a few signals are partially plotted in FIG. 26, which signals are associated with the frequency dividers D, E F11 and L, and in FIG. 27 associated with the generators ZZ, Y, Z and X. FIGS. 26 and 27 correspond for the position C to FIGS. 17, 18 and 19 for the position R.

The clock pulse period of the signal $a$ of the 80-fold line frequency $v_H$ is 800 ns in FIG. 26. Until the instant $t_{19}$ when the feedback is effected with the signal $e13'$ in FIG. 17 for the position R, the signals $d11$, $d12$, $e11$, $e12$, $e13$, $e14$ and $f11$ in FIG. 26 are identical to those in FIG. 17. In this case the difference in the clock pulse period ( 795 relative to 800 ns) has been left out of consideration as well as in the calculated time scale $t_0.....t_{40}..... t_{80} = t_0$. In the position C the feedback with the signal $\overline{e}14'$ in FIG. 26 is effected at the instant $t_{22} + 2t_Q$. In the signal $d12$ a pulse having a duration of $3t_Q$ occurs. The result is that the dividers D and E now count two successive pulses more or skip them so that the original 42-to-1 divider becomes a 40-to-1 divider. It is of importance that in the signal $e11$ which may perform a trigger action on the flip-flop W for supplying the line blanking signal (T(W) = $Q_1$(E11) according to FIG. 15) a negatively directed edge active as a trigger edge occurs at the instant $t_{22} + 1$ $t_Q$. This is in contrast with the trigger edge in the signal T + $e11$ at the instant $t_{21} + 1$ $t_Q$ in FIG. 22 for the position R. As is evident from FIG. 3, a line blanking pulse in the signal $s_{HW}$ is to be generated for the CCIR standard from $t_7 +$ $2t_Q$ to $t_{22} + 2t_Q$ at a duration of fifteen clock pulse periods, while for both standards the line synchronizing pulse in the signals $s_{HP}$, the equalizing pulse in the signal $s_{EP}$ and the raster serration in the signal $s_{VS}$ have the same number of clock pulse period at the same relative instants.

The signal $e14$ with trigger edges at the instants $t_1$ and $t_{41}$ determines the signal $l11...l16$ of which the signal $\overline{l13}'$ provides the feedback to the flip-flop L11. The field frequency time scale calculated thereon is plotted for the signal $l15$ in which, as in FIG. 18, the instant of commencement is $t_{100}'$ and in which $t_{101}'$ is one fourth line period $T_H$ later etc. until $t_{1350}' = t_{100}'$.

Analogous to FIG. 19, the result of the flip-flops ZZ, Y, X and the NAND gate Z is given in FIG. 27. Starting from the signals $l15$ and $l16$ and the signal $m15$ of the divider M (FIG. 18) shown in FIG. 26 in which at the instant $t_{110}'$ a negatively directed edge occurs, there simply follow the signals $Q_2 = \overline{zz}$, $Q_1 = y$ and $z$ having a pulse duration of 2.5 $T_H$, 7.5 $T_H$ and 2.5 $T_H$, respectively.

For the flip-flop X with $K = O$ FIG. 27 shows the signals $T = \overline{l16}$, $J = y$, $S_2 = \overline{zz}'$ and $Q_1 = x$. The negatively directed pulse in the signal $S_2 = zz'$ at the instant $t_{120}'$ causes the flip-flop X which is in the stable state with $Q_1 = 1$ at the condition $K = O$, $J = O$ or 1, to change over so that at the instant $t_{120}' + 2t_Q$ the logic O appears in the signal $Q_1 = x$.-The next negatively directed edge in the signal $T = l16$ occurs at the instant $t_{150}' = 1t_Q$ in which for $K = 0$ and the logic O in the signal $J = y$ the flip-flop X is not changed over. At the instant $t_{150}' = 2t_Q$, the logic 1 occurs in the signal $J = y$ so that the next negatively directed edge in the signal $T = \overline{l16}$ at the instant $t_{200}' + 1t_Q$ causes flip-flop X to change over to its stable state with $Q_1 = 1$ for $K = O$ and $J = 1$.

In the CCIR standard the signal $i$ as described in FIG. 20 with reference to the RTMA standard is generated in substantially the same manner. In fact, until the instant $t_{19}$ the signals $\overline{d11}, \overline{e14}', \overline{f11}$ and $\overline{e12}$ are identical in shape for both standards except for the difference incclock pulse period. Beyond the equalizing and field synchronizing period auxiliary pulses of line frequency and of double line frequency occurring therewithin during the 7.5 $T_H$ period with $y = O$ are generated in the signal $Q_1 = i1$.

The flip-flop W active as a blanking signal generator operates in the same manner for both standards, the only considerable difference being that a trigger edge occurs in the signal $T = e11$ at the instant $t_{22}$ for the CCIR standard instead of at $t_{21}$ for the RTMA standard.

Apart from the different number of various pulses in the line synchronizing signal $Q_1 = p$ generated by the flip-flop P, this operates in the same manner for both standards for generating the pulses $s_{HP}, s_{EP}, s_{VP}$ and $s_{VS}$.

It is found in the pulse generator according to FIGS. 14 and 15 that there is only little to switch for use with the RTMA or CCIR standard. The switching of the dividend of the circuit of frequency dividers L, M, dividing to the field frequency is evident. The choice of the clock pulse frequency of the generator A being the same number of times the line frequency in both positions, with the example of 80 $\nu_H$, obviates a switching of the dividend of the circuit of dividers D, E, F11 dividing to the line frequency. A pulse dipsplacement by switching in the divider D,E is found to be necessary so as to generate the line blanking pulses $s_{HW}$ of relatively different duration (14 relative to 15 clock pulses). A very simple pulse edge displacement is realized by forming the divider D, E, not as a 40-to-1 divider which is adaptable by means of switching, but in principle as a 42-to-1 divider the dividend of which is reduced to 40 by means of a switchable feedback while the desired pulse edge displacement is effected at the same time.

FIG. 17 shows the NTSC chrominance subcarrier gating signal $s_{CR}$ for the RTMA standard whose generation is described with reference to FIGS. 24 and 25. For a corresponding PAL chrominance subcarrier gating signal $s_{CC}$ for the CCIR standard, two differences are of importance. In the first place, the instant of commencement and the pulse duration are different, namely for the CCIR standard 5.6 $\mu$ after the leading edge of the line synchronizing pulse $s_{HP}$ and a duration of 10 periods of the chrominance subcarrier signal at a frequency of 4433618.75 Hz being 2.26 $\mu$s. In the line time scale this corresponds to an instant of commencement of $t_9 + 2t_Q$(leading edge·$s_{HP}$) plus $5.6/0.8 = 7$ clock pulse periods, that is to say, up to $t_{16} + 2t_Q$. At a final instant $t_{19}$ the duration is $(t_{19} - t_{16}) - 2t_Q = 3 \times 0.8$ $\mu$s $- \times 2 \times 70$ ns $= 2.26$ $\mu$s is required.

In the second place it is not sufficient, as in the RTMA standard, to discontinue the generation of the gating signal in the equalizing and field synchronizing period, but according to the PAL system a phase-shifted suppression of nine line periods is to be effected in a cycle of four fields. All this has already been described with reference to FIGS. 10......13.

For the explanation of the operation of the generator shown in FIG. 24 for generating the PAL chrominance subcarrier gating signal $s_{CC}$ reference is made to FIGS. 11, 12 and 13. As regards their operation the flip-flops $FF_{12}, FF_{13}$ and $FF_{14}$ shown in FIG. 24 correspond to the flip-flops $FF_2, FF_3$ and $FF_4$, respectively, of FIG. 10. The flip-flop $FF_{16}$ shown in FIG. 24 and described with reference to generating the NTSC gating signal $s_{CR}$ will be used when generating the PAL gating signal $s_{CC}$. To this end the input T of a flip-flop $FF_{17}$ is connected to $Q_2$ ($FF_{16}$). The input J ($FF_{17}$) is connected to $Q_1$ ($FF_{13}$). The flip-flops $FF_{13}$ and $FF_{14}$ are active as a blocking signal generator for generating a blocking pulse of nine line periods in the signal $s_C$ occuring phaseshifted in a cycle of four lines, while beyond this period there applies that $Q_1(FF_{13}) = s_C = 1$. The signal $d12$ of FIG. 26 is applied to the input $S_2$ ($FF_{17}$). The output $Q_2$ ($FF_{17}$) is connected to $S_2$ ($FF_{12}$). For the flip-flop $FF_{12}$, $J = 1$, $K = O$ and T ($FF_{12}$) receives the signal $e$ of FIG. 26. In the position C of the pulse generator according to FIGS. 14 and 15, the output $Q_1$ ($FF_{12}$) conveys the PAL chrominance subcarrier gating signal $s_{CC}$.

For the stable state of the flip-flop $FF_{17}$ with $S_2 = d12 = 0$ or 1, there applies that $Q_2 = 1$. For the stable state of the flip-flop $FF_{12}$ in which $J = 1$, $K = 0$ and $S_2 = Q_2$ ($FF_{17}$)$=1$ while $T=a$ there applies that $Q_1 = s_{CC} = 1$.

In the position C of the pulse generator according to FIGS. 14 and 15 there apply the signals shown in FIG. 25 for the flip-flop $FF_{16}$ in which for $K = d12$ the signal $K_C$ occurs. Since the signals, $K_R$ and $K_C$ are more or less identical in shape up to the instant $t_{20}$, the flip-flop $FF_{16}$ generates a signal at the $Q_2$ output which signal is the inverse of the shown signal $Q_1 = s_{CR}$. During each line period outside the equalizing and field synchronisation of 7.5 line period $T_H$ a negatively directed edge occurs once at the input T ($FF_{17}$) at the instant $t_{16}$. At the instant $t_{16}$, $S_2 = d12 = 1$ and $J = K = 1$ so that the flip-flop $FF_{17}$ is changed over so that at $t_{16} + 1t_Q$ the logic O appears at the output $Q_2$ ($FF_{17}$) with the result that the flip-flop $FF_{12}$ is also changed over through the connection $S_2(FF_{12}) = Q_2(FF_{17})$. in the signal $S_{CC}$ at the output $q_1(FF_{12})$ the logic 0 has appeared at the instant $t_{16} + 2t_Q$. A pulse having the logic 0 begins at the input $S_2(FF_{17})$ in the signal $d12$ at the instant $t_{18}$ so that flip-flop $FF_{17}$ is changed back and conveys the logic 1 again at the $Q_2$ output after the instant $t_{18} + 1\ t_Q$. The next negatively directed edge active as a trigger edge at the input T $(FF_{12})$ at the instant $t_{19} - 1t_Q$ will cause the flip-flop $FF_{12}$ to change over to the stable state associated with the condition $J = 1$, $K = 0$. At the, instant $t_{19}$ the logic 1 has appeared at the output $Q_1$ $(FF_{12})$. The signal $s_{CC}$ has a gate pulse from $t_{16} + 2t_Q$ to $t_{19}$ as is required.

If a pulse with the logic 0 is generated in the signal $s_C$ by the flip-flops $FF_{13}$ and $FF_{14}$ and if this pulse is supplied to the input J $(FF_{17})$, the negatively directed edge will not cause the flip-flop $FF_{17}$ to change over at the instant $t_{16}$ at the T input. For the condition that $J = 0$, $K = 1$ and $S_2 = 0$ or 1, the logic 1 is associated with the output $Q_2$ $(FF_{17})$ in the stable state.

In the flip-flop $FF_{14}$ the signal $i1$ is applied to the T input and the signal $\overline{f11}$ is applied to the interconnected J and K inputs. The operation of the flip-flop $FF_{14}$ is analogous to that of the flip-flop $FF_4$ of FIG. 10, the signals being given in FIG. 12. The flip-flop $FF_{14}$ generates a square-wave signal $ff_{14}$ and $\overline{ff}_{14}$ at the outputs $Q_1$ and $Q_2$ at half the line frequency, in which dependent on the field the edges are located near the instant $t_9$ or $t_{49}$ under the influence of the trailing edge of the pulses in the signal $i1$.

The application of the signals at the inputs of the flip-flop $FF_{13}$ is as follows: $J_1$ signal $y$, $J_2$ signal $ff_{14}$, $J_3$ signal $l14$, $K_1$ signal $l13$, $K_2$ signal $ff_{14}$ and $K_3$ signal $\overline{zz}$. The signals $ff_{14}$ and $\overline{ff}_{14}$ may be interchanged as has been done in FIG. 10 which is changed for the sake of a simpler drawing.

In FIG. 13 the signals are given for the flip-flop $FF_3$ which with small modifications also applies to the flip-flop $FF_{13}$ of FIG. 24. A survey of the modifications is as follows:

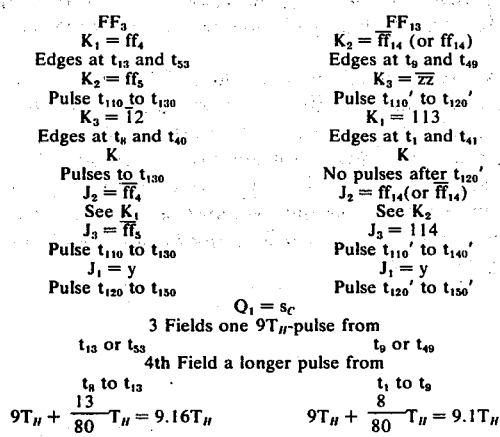

The slightly longer duration of the pulse in the blocking signal $s_C$ in the fourth field is allowed.

The pulse generator shown in FIG. 24 or FIG. 10 is easily connectable to a known PAL coder. This coder is provided with a so-called PAL switch so as to achieve that the polarity of the (R-Y) vector is changed every other line. It follows from the PAL standard that the position of the PAL switch must be such that the phase of the first formed burst of the chrominance subcarriers after the PAL gating signal $s_C$ of 9 $T_H$ is 135° relative to the $+(B-Y)$ vector. To this end the switch must be driven at half the line frequency. Since in the signal $s_C$ the gating pulse of $9T_H$ is determined by the signals $ff_{14}$ and $\overline{ff}_{14}$ of half the line frequency, a uniform relationship between these signals is guaranteed. The signals $ff_{14}$ and $\overline{ff}_{14}$ may be used with this guarantee for switching the PAL switch in a coder.

What is claimed is:

1. A circuit for generating a television pulse series having pulses of different durations and repetition periods, said circuit comprising a clock pulse source means for supplying pulses having a frequency equal to or an integer multiple of eighty times a selected line frequency, said clock pulse period being substantially to or an integral multiple of the highest common factor of said different pulse periods, the shortest repetition period of said pulses of said series being an integral multiple of said clock pulse period, a plurality of frequency dividers coupled to said clock, a plurality of pulse generators each coupled to at least one of said dividers for control of said generators, a first signal generator having a plurality of inputs coupled to said pulse generators and dividers and an output means for supplying at least part of said pulse series.

2. A circuit as claimed in claim 1 further comprising a second signal generator means for generating a different series from said first generator and synchronized therewith, said clock pulse source having a period equal to or an integer multiple of the highest common factor of the time difference between the pulse series of said first and second signal generators.

3. A circuit as claimed in claim 1 wherein some of said frequency dividers provide line frequency signals, said signal generator comprising means for generating synchronizing and blanking pulses directly coupled to said line frequency divider for control of the edges of said pulses.

4. A circuit as claimed in claim 1 wherein said dividers comprise line and field frequency dividers; and further comprising means for providing a long field frequency pulse; a gate having inputs coupled to said long pulse generator and said field frequency dividers, and an output means for supplying a short field frequency pulse.

5. A circuit as claimed in claim 1 wherein said dividers, pulse generators, and first signal generator each comprise at least one J-K flip-flop circuit.

6. A circuit as claimed in claim 5 wherein said flip-flops having a propagation delay time and are sequentially arranged, at least one of said flip-flops having two inputs coupled to said clock source and to the outputs of other flip-flops respectively, said other flip-flops having a different sequential number.

7. A circuit as claimed in claim 5 wherein at least one flip-flop in each of the dividers and pulse generators has a propagation time delay and two trigger action inputs, one of said inputs being coupled to said clock pulse source and one of the sequentially subsequent flip-flops in the divider and pulse generator respectively, the remaining input being coupled to the output of a flip-flop that succeeds the clock pulse source.

8. A circuit as claimed in claim 5 wherein the J-K flip-flop in said signal generator has J,K, command and reset inputs, all of said inputs having a trigger action.

9. A circuit as claimed in claim 5 further comprising an auxiliary pulse generator means for providing auxiliary pulses at the line frequency and double said line frequency, said auxiliary generator comprising a J-K flip-flop having a pair of inverse signal outputs with different propagation time delays coupled to the set and reset inputs of said signal generator flip-flop.

10. A circuit as claimed in claim 5 wherein said dividers comprise line and field frequency dividers; and further comprising means for providing an NTSC chrominance subcarrier gating signal comprising a J-K flip-flop having a command input coupled to said clock pulse source, a first and second preparatory inputs, said first input being coupled to said line frequency dividers, and a reset input; a differentiating circuit coupled between said second input and said signal generator; and means for generating auxiliary field frequency pulses coupled to said reset input.

11. A circuit as claimed in claim 1 wherein said frequency dividers comprise line and field frequency dividers, first switching means coupled to said field frequency dividers for switching the dividend, and a second switching means coupled to said field frequency dividers for displacing the field pulse edges, the divisor remaining a constant whereby said circuit can be used with different television standards.

12. A circuit as claimed in claim 11 wherein said line frequency dividers have a greater than necessary divisor and comprise switchable feedback means coupled thereto for reducing said divisor to the proper value and for pulse edge displacement.

13. A circuit as claimed in claim 11 further comprising means for increasing the divisor of one of said field frequency dividers comprising means for coupling the output of one of said signal generators to a blocking input of said one divider.

14. A circuit as claimed in claim 1 wherein said dividers comprise line and field frequency dividers and further comprising a PAL chrominance subcarrier gating generator coupled to said line frequency dividers and said clock pulse source, said gating generator comprising a blocking generator means coupled to said field frequency dividers and to one of said signal generators and providing a blocking pulse having a period equal to nine line periods and occurring at the field frequency, said blocking generator having an auxiliary pulse generator means for supplying pulses of one half of the line frequency for pulse edge determination of said blocking generator.

15. A circuit as claimed in claim 14 wherein said gating generator comprises first and second J-K flip-flops each having a command and reset inputs, and an output, said command inputs being coupled to said clock source and said line frequency dividers respectively, said first output being coupled to said second reset input, said first reset input being coupled to said blocking signal generator, and said second output means for providing said gating signal.

16. A circuit as claimed in claim 14 wherein said gating signal generator comprises a first J-K flip-flop having a preparatory input coupled to said blocking generator, a command input coupled to said auxiliary pulse generator, a reset input coupled to said line frequency dividers, and an output; and a second J-K flip-flop having a reset input coupled to said first flip-flop output, a command input coupled to said clock source, and an output means for providing said gating signal.

17. A circuit as claimed in claim 14 wherein said auxiliary generator comprises a J-K flip-flop having a pair of outputs, and said blocking generator comprises a J-K flip-flop having a pair of trigger action preparatory inputs coupled to said auxiliary flip-flop outputs respectively.

18. A circuit as claimed in claim 1 wherein said dividers comprise line and field frequency dividers, said field frequency dividers comprise an input means adapted to receive a field frequency signal for synchronization of said field frequency dividers, said circuit further comprising a phase discriminator having two inputs for receiving the line frequency signal from said line dividers and a line frequency synchronizing signal, and an output means coupled to said clock pulse source for synchronization of said clock pulse source.

19. A circuit as claimed in claim 18 further comprising a field synchronizing circuit coupled to said field synchronizing input and wherein one of said pulse generators comprises a field frequency generator coupled to said field synchronizing circuit.

20. A circuit as claimed in claim 1 wherein at least two of said frequency dividers supply line and field frequency signals respectively, and wherein one of said pulse generators comprise an auxiliary pulse generator means coupled to said line and field dividers for control of said auxiliary generator and for generating pulses of the line frequency and double the line frequency, said auxiliary generator also being coupled to control said signal generator, said signal generator comprising means for generating synchronizing and blanking signals.

21. A circuit as claimed in claim 20 wherein said auxiliary generator is directly connected to the line frequency divider and wherein at least one of said generators comprises means for generating a pulse lasting one equalizing and one field synchronizing period coupled between said auxiliary generator and said field frequency divider for controlling the frequency of said auxiliary generator.

* * * * *